US008536870B2

(12) United States Patent
Punchard et al.

(10) Patent No.: US 8,536,870 B2
(45) Date of Patent: Sep. 17, 2013

(54) SHIM INSERT FOR HIGH-FIELD MRI MAGNETS

(76) Inventors: William F. B. Punchard, Sudbury, MA (US); Kai-Ming Lo, Westford, MA (US); Piotr M. Starewicz, Somerville, MA (US); Hoby Hetherington, Woodbridge, CT (US)

(*) Notice: Subject to any disclaimer, the term of this patent is extended or adjusted under 35 U.S.C. 154(b) by 358 days.

(21) Appl. No.: 13/066,075

(22) Filed: Apr. 6, 2011

(65) Prior Publication Data

US 2011/0260727 A1    Oct. 27, 2011

Related U.S. Application Data

(60) Provisional application No. 61/342,933, filed on Apr. 21, 2010.

(51) Int. Cl.
*G01V 3/00*    (2006.01)
(52) U.S. Cl.
USPC .......................................... 324/319; 324/322
(58) Field of Classification Search
USPC .......................................... 600/410; 128/653
See application file for complete search history.

(56) References Cited

U.S. PATENT DOCUMENTS

| 6,100,687 A * | 8/2000 | Weitekamp et al. .......... 324/300 |
| 6,556,012 B2 * | 4/2003 | Yamashita ..................... 324/318 |
| 7,071,693 B2 * | 7/2006 | Yasuhara ....................... 324/319 |

* cited by examiner

*Primary Examiner* — Brij Shrivastav
(74) *Attorney, Agent, or Firm* — David Prashker, Esq.

(57) ABSTRACT

The present invention is a portable in-bore shim coil insert suitable for correcting high-degree and high-order magnetic field inhomogeneities over a limited examination zone in a magnetic resonance assembly operating above 3 T magnetic field strengths, wherein the magnetic resonance assembly includes at least a MRI magnet having an internal bore of known configuration and volume, at least one set of gradient coils, and an arrangement of radio frequency coils. The in-bore shim coil insert and corresponding method of use is able to produce higher degree and order shimming effects on-demand (i.e., the correction of at least some $3^{rd}$ to $6^{th}$ degree field terms or inhomogeneities) and will markedly improve the quality of in-vivo magnetic resonance spectroscopy and/or imaging of any desired anatomic site, i.e., any or all of the various organs, tissues, and systems present in the body of a living subject.

22 Claims, 35 Drawing Sheets

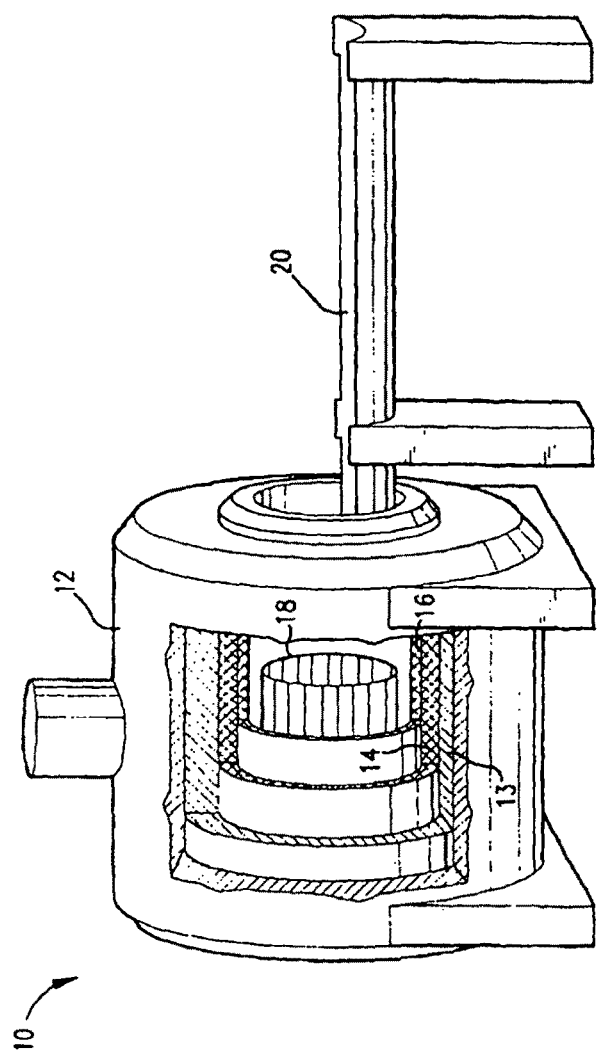
Prior Art Fig. 1A

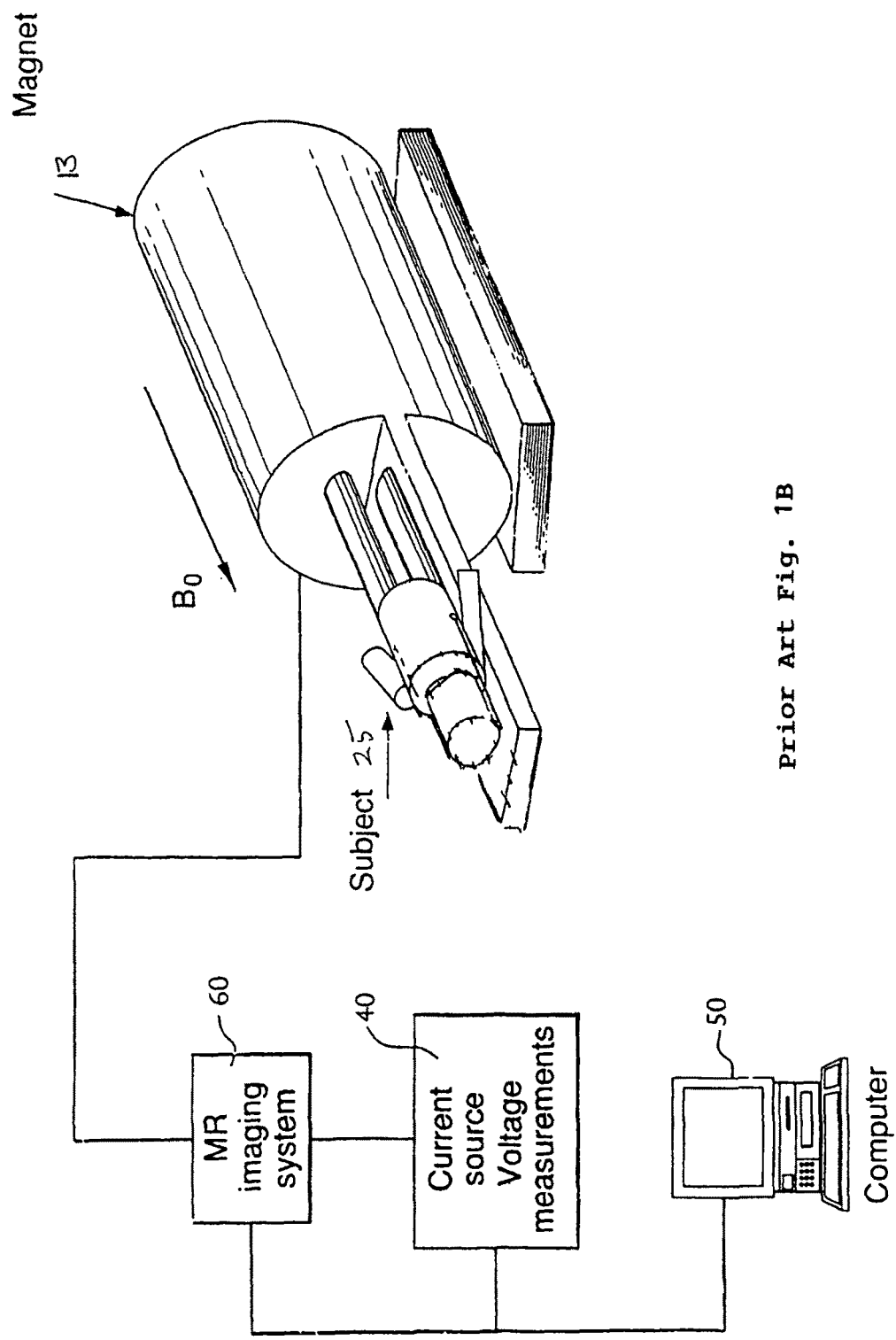
Prior Art Fig. 1B

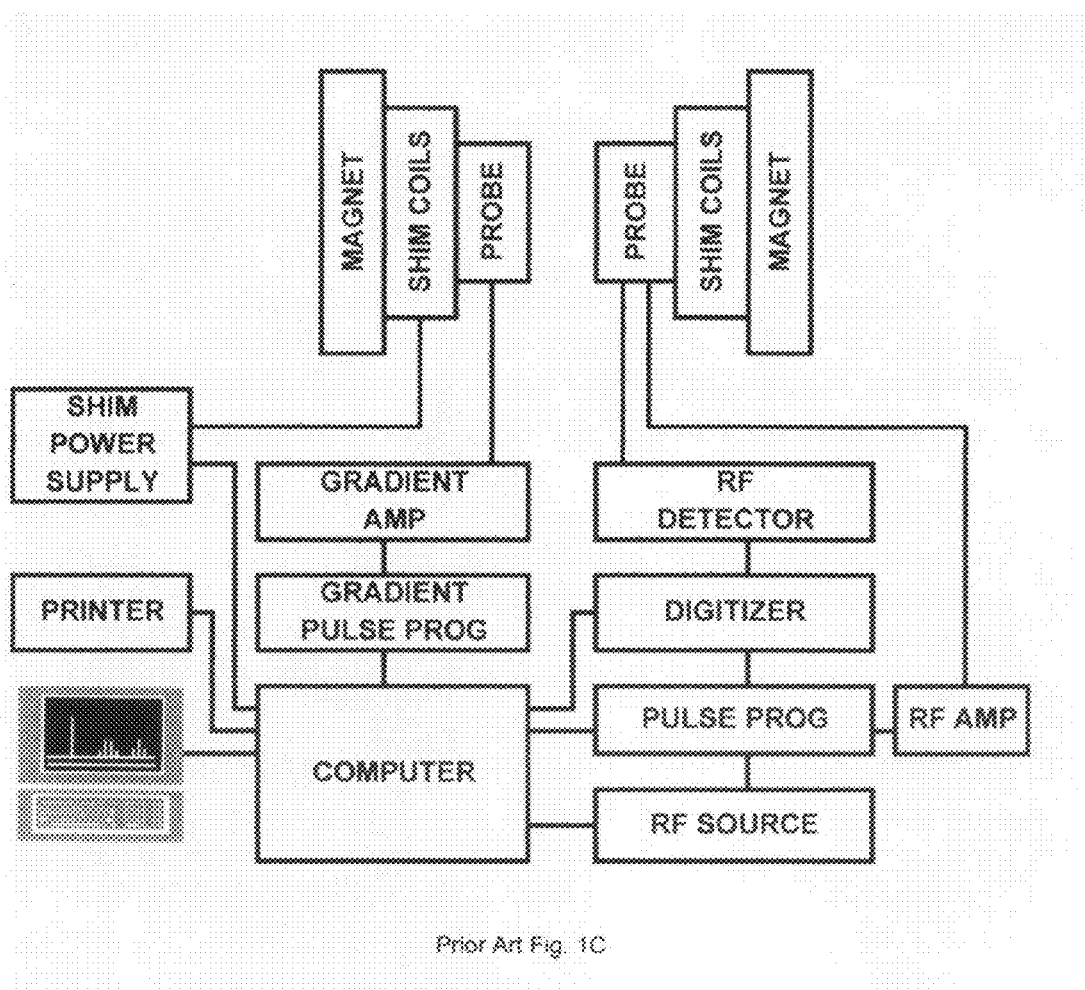
Prior Art Fig. 1C

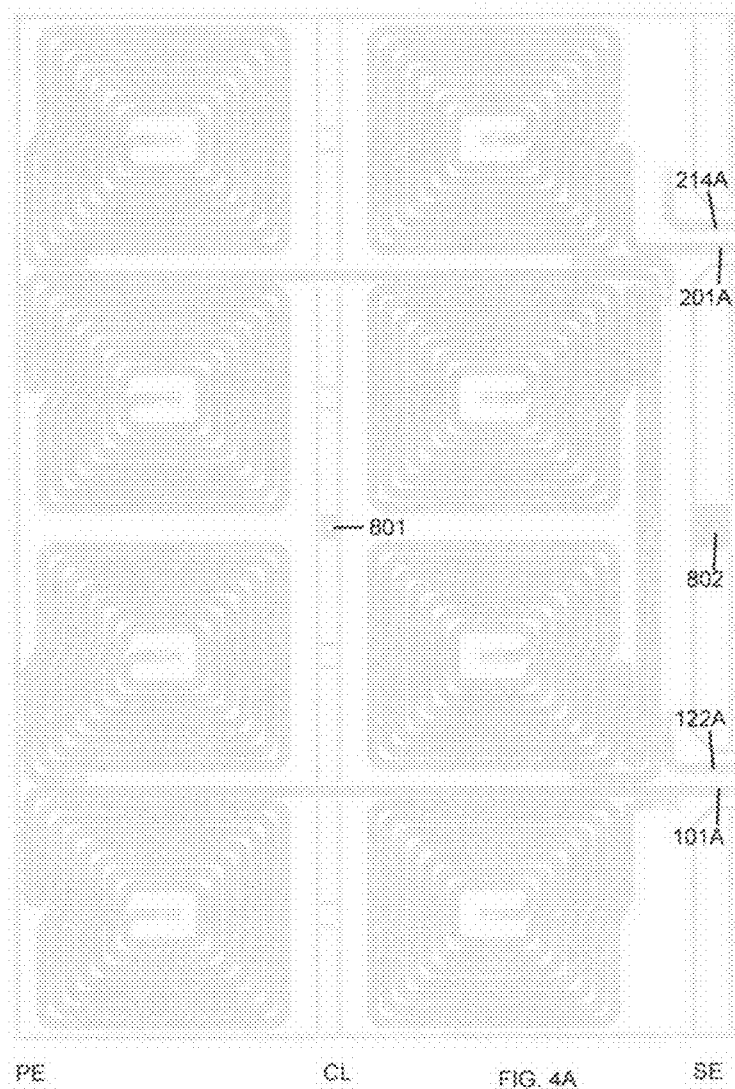

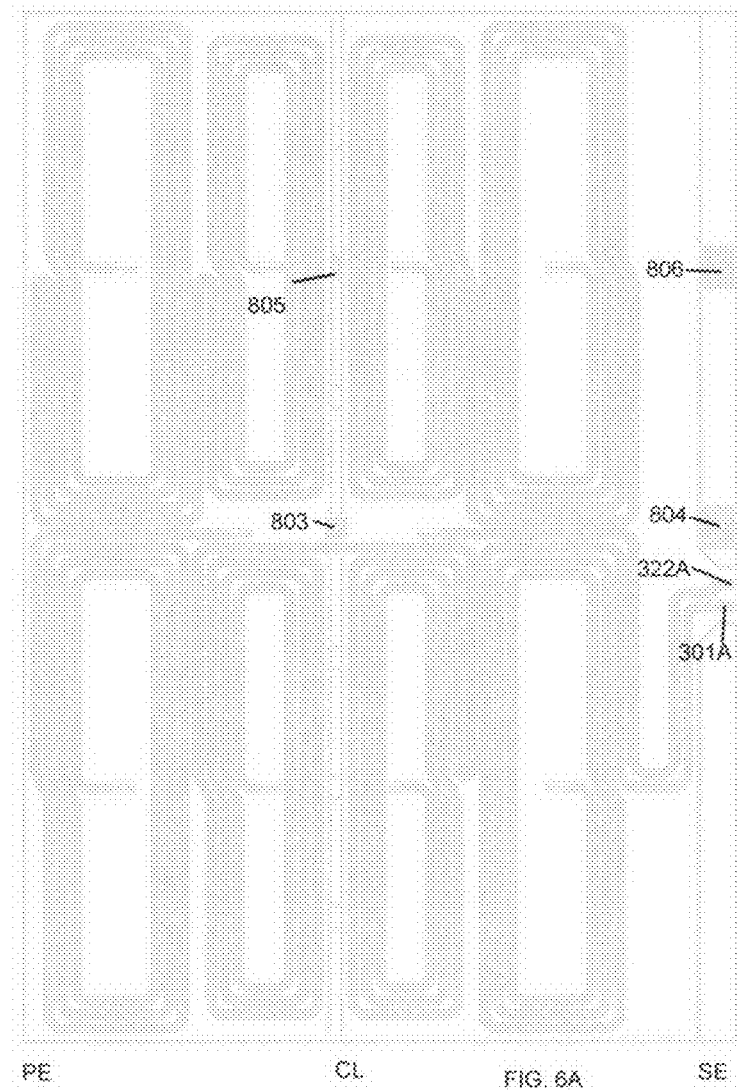

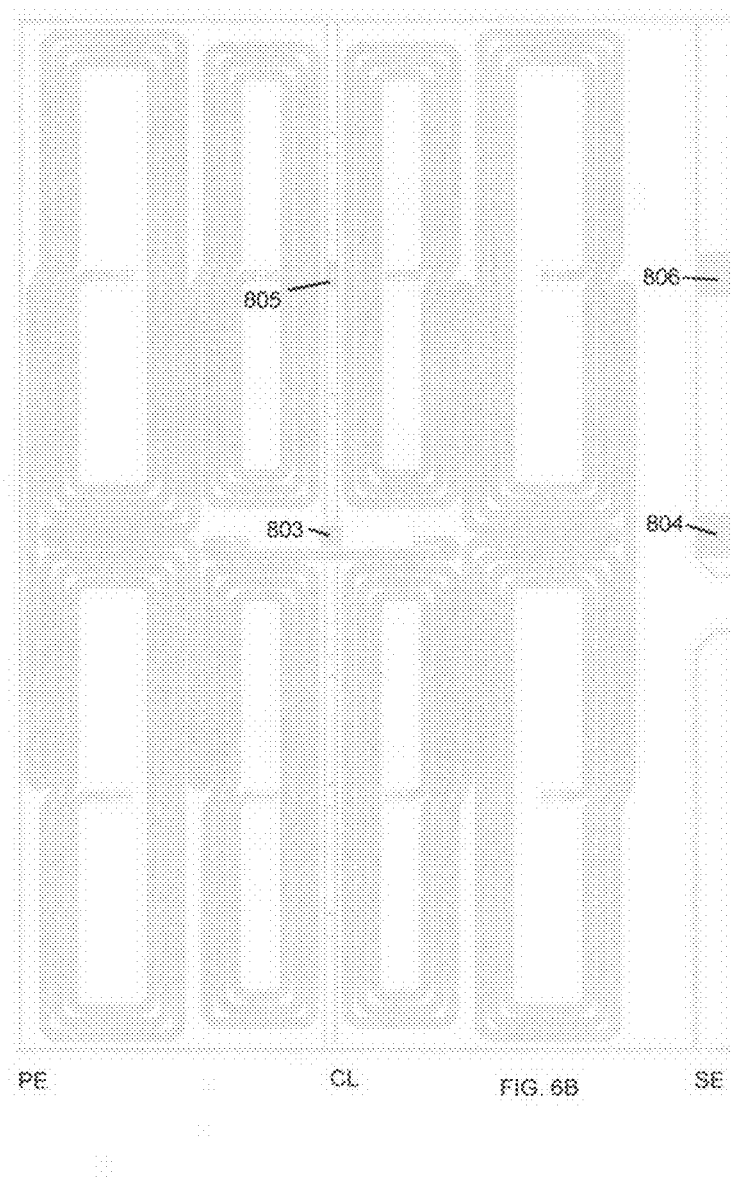

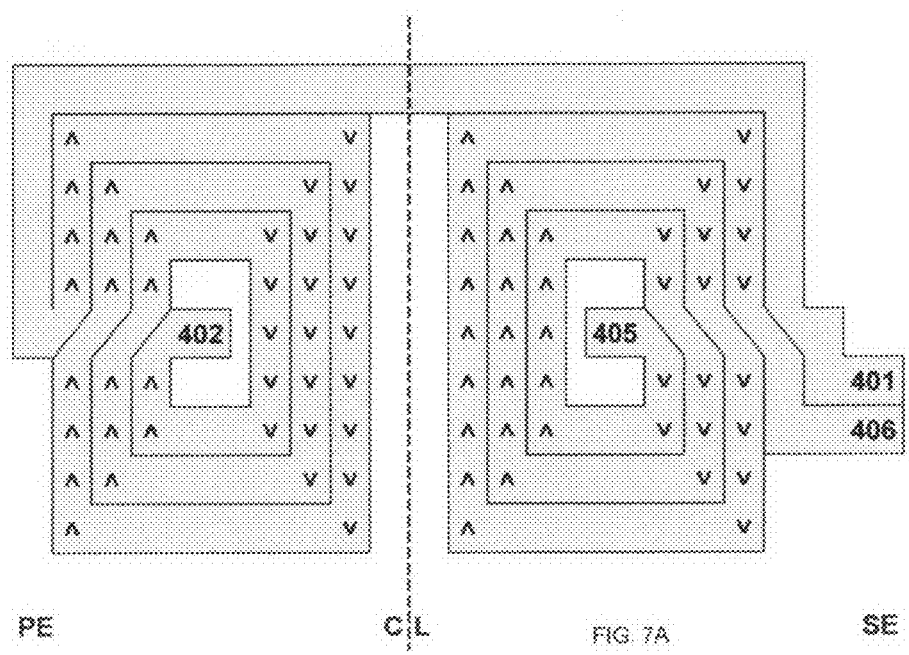

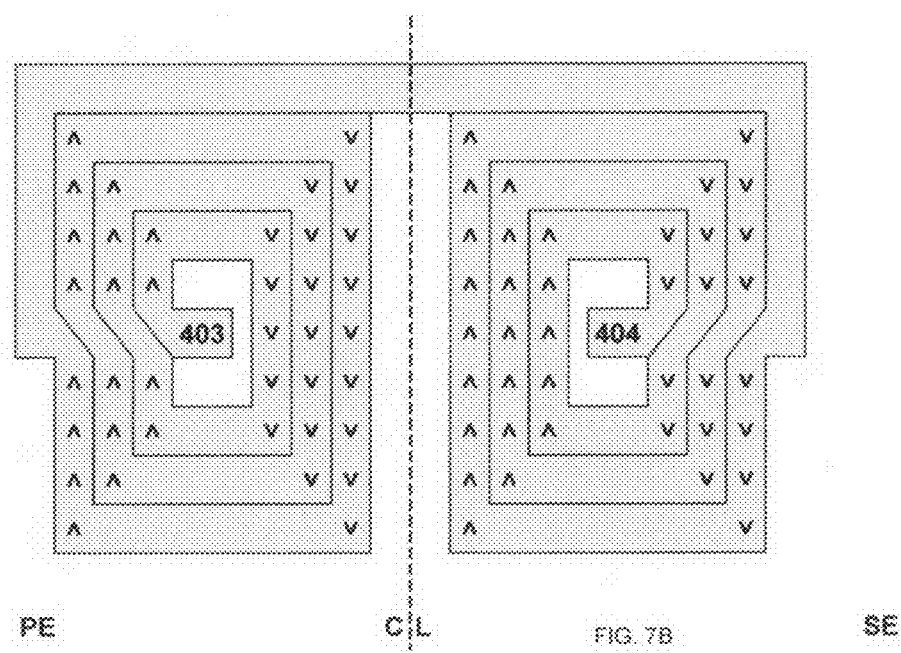

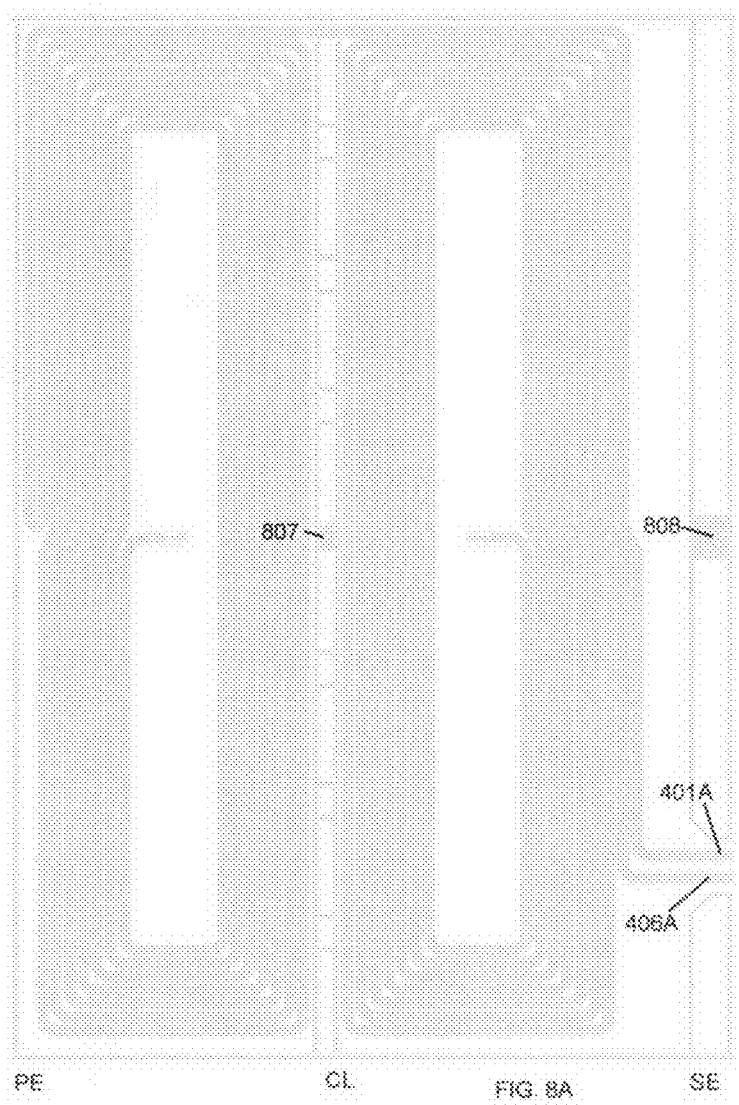

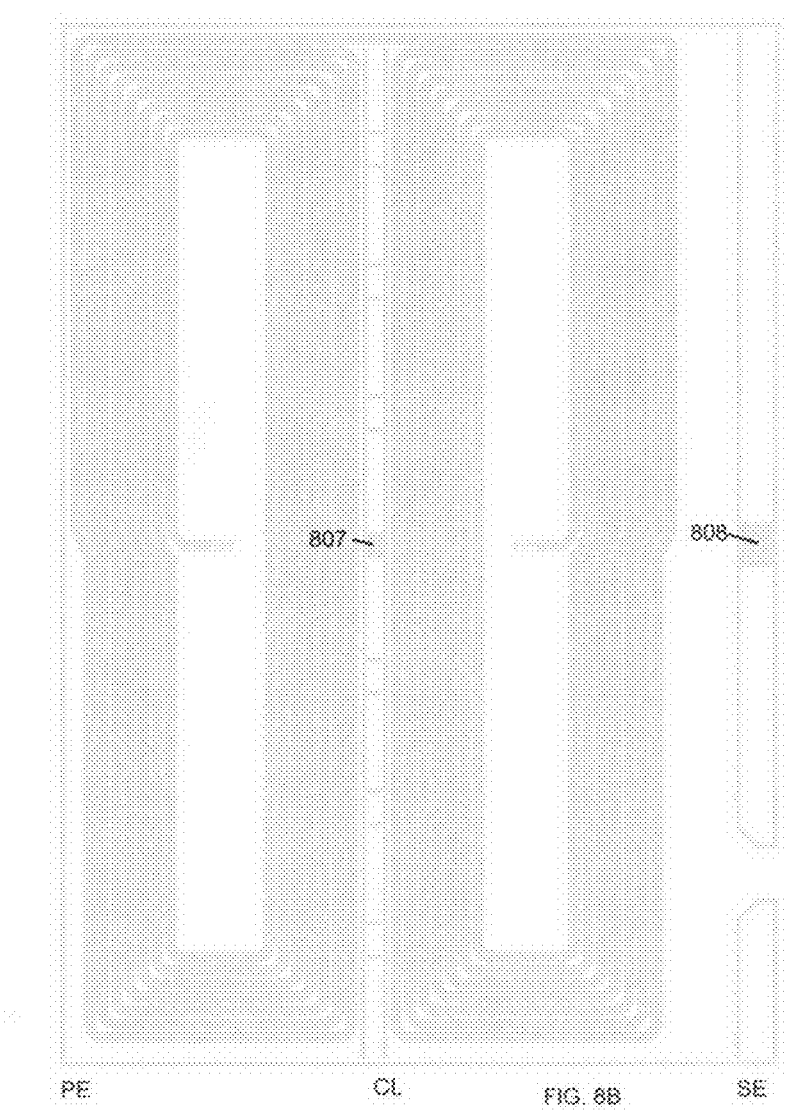

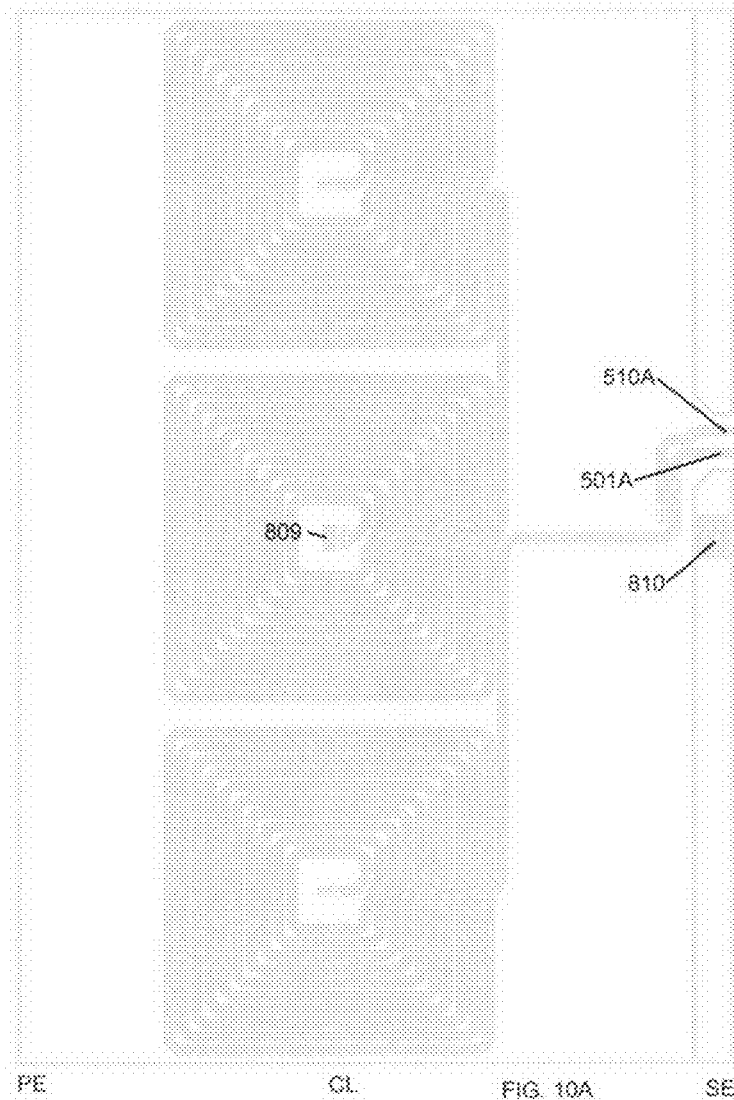

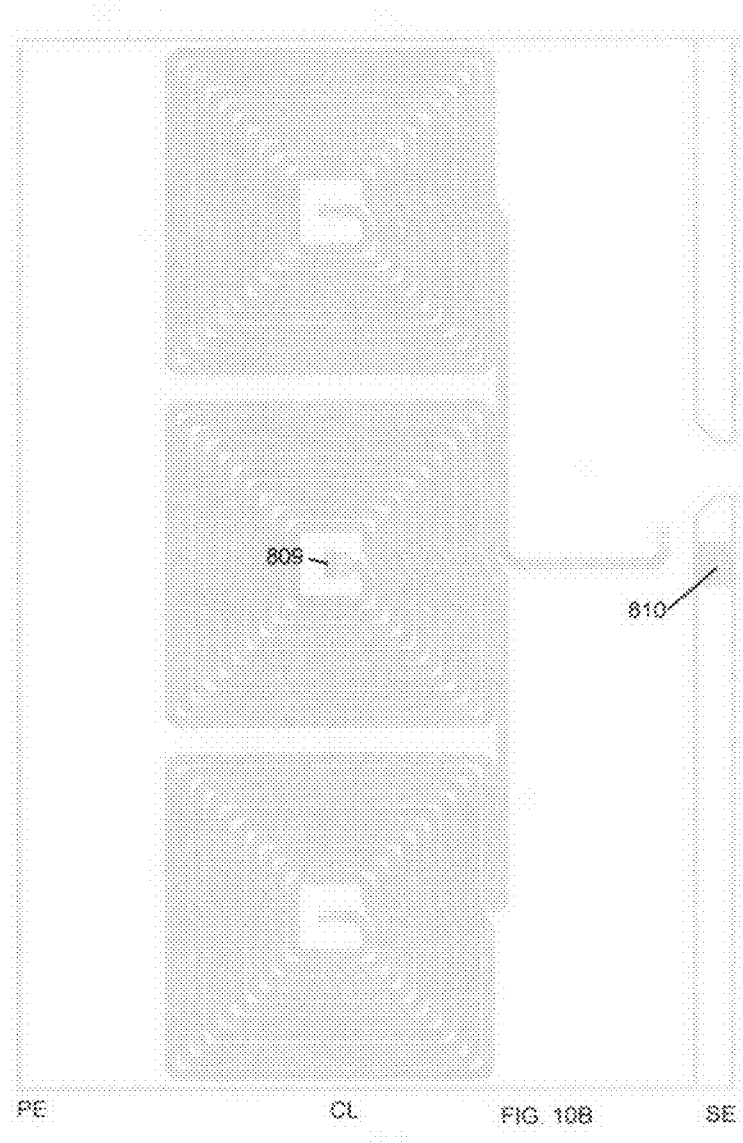

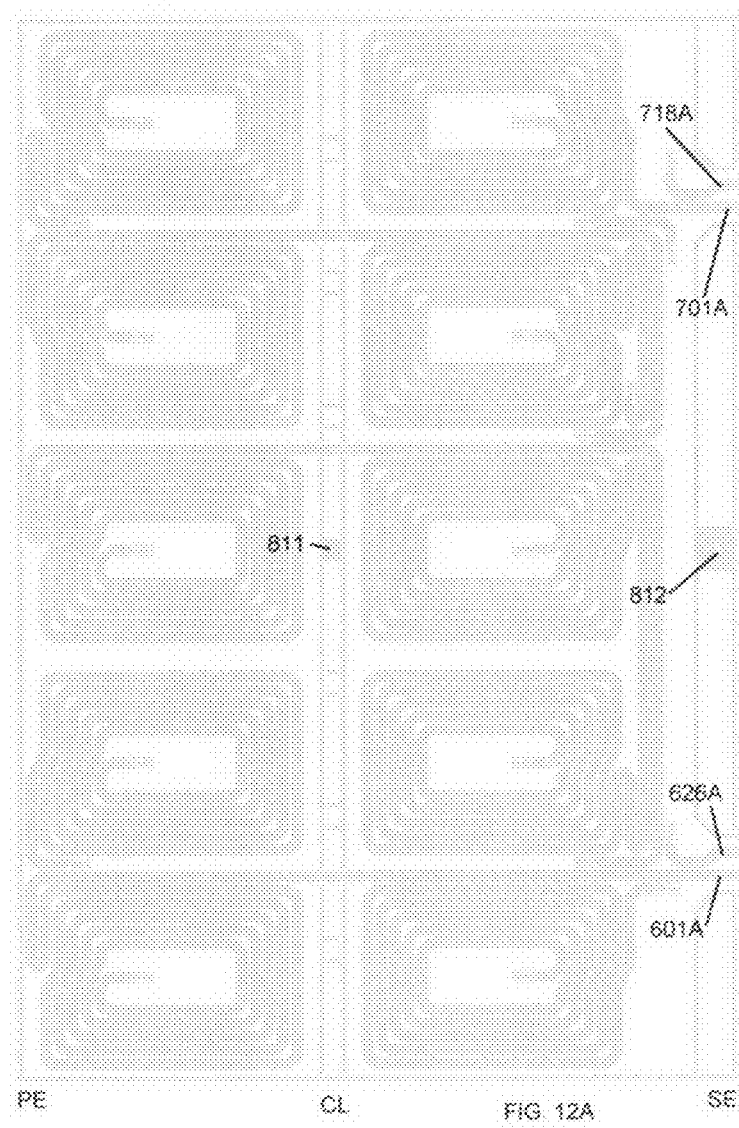

SHIM INSERT FOR HIGH-FIELD MRI MAGNETS

PRIORITY CLAIM

The present invention was first submitted as U.S. Provisional Patent Application Ser. No. 61/342,933 filed on Apr. 21, 2010. The legal priority and effect of this first filing is expressly claimed herein.

FIELD OF THE INVENTION

With the advent of ultra-high magnetic field strength systems, i.e., field strengths above 3 tesla ('T'), substantial developments and improvements in spectroscopic imaging ('SI') of the human anatomy have been eagerly awaited. However, it is unequivocally clear that any such technical gains are largely dependent upon the achievable homogeneity of the ambient magnetic field (the $B_0$ field), both globally, i.e., over the entire field of view ('FOV'), and locally—i.e., over a region of interest ('ROI') comprising specific slices of the entire FOV or even selected voxels (volume elements) within particular slices.

The present invention is directed at the manufacture and use of a shim coil insert capable of generating field term corrections of order and degree higher than those presently achievable; and is suitable for in-bore placement at will concentrically or excentrically within the cavity space of a gradient coil at ambient room temperatures in a conventional magnetic resonance assembly; and will operate on-demand to provide substantial improvements in magnetic field homogeneity within that chosen field of view.

BACKGROUND OF THE INVENTION

When placed in a magnetic field, the nuclei of certain atoms (e.g., $^1H$ $^{19}F$, $^{13}C$, and $^{31}P$) that have a net nuclear magnetic moment exhibit a phenomenon known as nuclear magnetic resonance. After being placed in a magnetic field, the nuclear magnetic moments of such susceptible atoms take up certain discrete orientations, each orientation corresponding to a different energy state. The difference in energy between these levels is proportional to the strength of the magnetic field, the proportionality constant being known as the magnetogyric ratio or gyromagnetic ratio.

Transitions between these differing energy levels can be induced by applying an oscillating magnetic field, (the $B_1$ field), created by a RF coil whose axis lies at right angles to the direction of the ambient magnetic field. The frequency at which energy is absorbed by the nuclei is termed the resonant frequency; and this frequency will vary with the type of nucleus, each of which has its unique magnetogyric ratio and is proportional to $B_0$, the strength of the magnetic field or flux density. For example, the protons (nuclear species $^1H$) in water experience a resonance effect when placed in a magnetic field strength of 7 T and exposed to a RF frequency of 298 MHz (megahertz).

It is important to understand that the resonant frequency of a particular nucleus is proportional to the local magnetic field at the site of that nucleus; and that the local field may be different from the globally applied field. The applied field induces electronic currents in atoms and molecules surrounding the nucleus; and these, in turn, create small shielding or screening magnetic fields which are superimposed on the applied magnetic field. The net or effective magnetic field is therefore slightly different from the applied magnetic field.

The extent of the difference is a function of the nature and position of the atoms and molecules surrounding a particular nucleus. Thus, nuclei of the same species which exist in different atomic and molecular environments will experience different effective magnetic fields, and therefore will resonate at different frequencies. The separation of resonant frequencies from a chosen reference frequency is known as the chemical shift; and for $^1H$ nuclei is in the range of about 1 ppm to 10 ppm (parts per million). This effect is exploited to provide valuable information on the structure of molecules.

The effects of magnetic resonance have been developed to provide a system for non-invasive evaluation of the human anatomy via magnetic resonance imaging ('MRI'), which is commonly utilized as a powerful diagnostic tool and clinical aid. Thus, magnetic resonance spectroscopy ('MRS') and magnetic resonance spectroscopic imaging ('MRSI') are useful in obtaining chemical analyses localized in the anatomy of a patient.

By means of a RF pulse sequence, a broad range of resonant frequencies can be used to excite nuclei in different chemical environments simultaneously. Then, as the nuclei relax their return signal, a free induction decay ('FID') is generated in the pick-up coil. The FID comprises a summation of individual sinusoidal signals, wherein each sinusoidal signal is characterized by an amplitude (measured in volts) and a frequency (measured in Hz).

The amplitude of a signal is proportional to the concentration of those affected nuclei in the sample, whereas the frequency is characteristic of the unique chemical environment of those nuclei. Then, a Fourier transformation of the FID is used to generate a spectrum, which has multiple peaks (or resonances) and resolves the signals arising from nuclei in different chemical environments along a frequency axis. This spectrum of signals provides much information about the concentration and structure of the targeted subject matter. For this reason, both spectroscopic data and visual images are commonly utilized as alternative or simultaneous modes of evaluation.

A Typical Magnetic Resonance System

Magnetic resonance ('MR') systems employ a spatially uniform and temporally constant main $B_0$ magnetic field. For the purpose of excitation of nuclear spin magnetization within the examination volume of the magnetic resonance device, a radio frequency pulse sequence, the $B_1$ field, is superimposed perpendicular to the $B_0$ field at the appropriate proton resonant frequency.

Magnetic resonance imaging devices also conventionally include a set three of gradient coils for the generation of the linear gradient magnetic fields, by which spatial encoding of the nuclear spin magnetization is achieved. During the magnetic resonance procedure, pulse sequences (consisting of radio frequency and switched gradient magnetic fields) are applied to a targeted subject (such as a live patient) to generate magnetic resonance signals, which are detected and stored to obtain information subsequently used to reconstruct spectra and images of the object. These procedures determine the characteristics of the reconstructed spectra and images such as location and orientation in the targeted subject, dimensions, resolution, signal-to-noise ratio, and contrast. The operator of the magnetic resonance device typically selects the appropriate sequence, and adjusts and optimizes its parameters for the particular application.

The existence of a strong and homogeneous magnetic field is very important for magnetic resonance. A major requirement for the static magnetic field in magnetic resonance systems is that it must be substantially homogeneous over the desired ROI. Typically therefore, for whole body magnetic resonance systems, the magnetic field should not deviate from the central value by more than about 5 ppm over a spherical imaging volume having a diameter of 45 cm to 50 cm.

The superconducting magnets used in conventional medical magnetic resonance systems are typically about 1.6 m to 2.0 m in length and have clear bores of diameter in the range of 0.8 m to 1.0 m. The magnet is traditionally symmetric in construction, the midpoint of the bore volume being located at the geometric center of the magnet's structure.

The magnet generating the $B_0$ field is designed such that the magnetic field that it produces meets the stringent field homogeneity specifications. However, because of manufacturing tolerance issues, the conductor is never placed in exactly in the positions called for by the design. Because of such defects, the homogeneity of the as-built magnet does not meet the field homogeneity design specifications; and the $B_0$ field contains inhomogeneity components that adversely affect the quality of the images and spectra that are acquired. Typical magnetic resonance imaging devices therefore include some form of shimming means for improving and controlling the homogeneity of the $B_0$ field.

An illustration of the basic components for a typical superconducting magnet system appears in Prior Art FIG. 1A. As seen therein, the superconducting magnet system 10 includes a magnet housing 12, a superconducting magnet 13 with solenoidal windings whose axis of symmetry by convention is the Z-axis of a Cartesian coordinate system, shim coils 14, gradient coils 16, RF coils 18, and a patient table 20.

As is well known in the art, the superconducting magnet 13 produces a substantially uniform magnetic $B_0$ field within its design FOV. This $B_0$ field is directed along the positive Z-axis. Such systems are useful for performing magnetic resonance investigations and are suitable for producing diagnostic images for human studies; similar systems can be used for spectral analysis applications.

The majority of superconductive magnets in the system shown by FIG. 1A are based on niobium-titanium (NbTi) alloys which are very reliable, but require a liquid helium cryogenic system to keep the conductors at approximately 4.2 Kelvin (−268.8 Celsius). To maintain this temperature the magnet is enclosed in a cryostat and cooled by liquid helium.

In such systems there are traditionally three pulsed gradient coils: the X-gradient coil, the Y-gradient coil, and the Z-gradient coil, each of which generates a magnetic field in a direction the same as that of the $B_0$ field, the Z axis direction. However, in contrast to the $B_0$ field which is uniform, the field generated by each gradient coil varies linearly in one of three orthogonal directions. The X-, Y- and Z-gradient coils generate respectively a Bz component of field that varies linearly in the X, Y and Z axis directions. The magnetic fields generated by these coils provide the means for correlating received signal with location of origin within the subject being imaged.

Typically, the Z-gradient coil is solenoidal and comprises a wire conductor wound circumferentially on the surface of a cylinder, a winding geometry similar to that of the magnet generating the $B_0$ field. In contrast, the X-gradient coil conventionally has the topology of a saddle mounted on a cylinder. The Y-gradient coil is identical to the X-gradient coil, but is rotated azimuthally by 90°. The conductor for the X- and Y-gradient coils may be made of wire or of copper plate, in which case the turns are formed either by machining or by chemically etching away the copper between turns.

Note also that the X-, Y- and Z-gradient coils are mounted concentrically. To minimize the generation of eddy currents induced in conductive components of the cryostat, there are three so-called gradient shields, one for each of the gradient coils. These have a topology which is the same as that of their associated coils and are located at larger radii. The currents in these shields are in a direction opposite to that of the coils and are distributed in such a way as to minimize the magnetic flux which extends outside of the shields. Both the coils and shields are resistive and operated close to room temperature. Also, they must be water cooled because of the energy deposited in them by the high current pulses from current regulated, high voltage amplifiers.

Other features of the traditional magnetic resonance system are illustrated by Prior Art FIGS. 1B and 1C respectively. As shown in Prior Art FIG. 1B, the targeted subject 25 is to be placed in the middle of the main magnetic field $B_0$ generated by the superconducting magnet 13. The voltage measurements are registered by measurement circuitry 40. Voltage measurements are used to reconstruct images and the images are displayed on a display 50. Preferably, the application of current is synchronized with the magnetic resonance imaging sequence from a magnetic resonance imaging system 60. A greater detailing of functions is set for by Prior Art FIG. 1C.

Thus, the basic hardware components of all high field strength MRI systems conventionally are: the superconducting magnet which produces a stable and very intense magnetic field; the gradient coils which create a variable field to enable spatial encoding; and the radio frequency (RF) coils which are used to stimulate transitions between the energy states of the nuclei. A computer controls the scanning procedure and processes the information.

The range of magnetic field strengths typically used for clinical in-vivo imaging in superconductive magnets is from about 0.5 T to 3.0 T. Open structure magnets usually have a magnetic field strength in the range from about 0.2 T to 1.2 T.

Many other descriptive details of magnetic resonance systems as well as a showing of the differences existing among various magnetic resonance systems can be found in the texts of U.S. Pat. Nos. 4,689,591; 4,701,736; 5,416,415; 5,428,292; 4,689,591; 4,701,736; 5,084,677; 5,382,904; 5,396,207; 5,416,415; 5,428,292; 5,596,303; 5,717,333; 5,801,609; 5,814,993; 5,818,319; 6,064,290; 6,067,001; 6,255,929; and 6,853,281. All of these are expressly incorporated by reference herein.

Technical Limitations of the Magnetic Resonance Magnet

In any nuclear magnetic resonance tomography apparatus, lack of homogeneity in the $B_0$ magnetic field has been and remains a critical limiting factor for the system. Magnetic field inhomogeneities in the ROI cause geometrical distortions in images and lack of resolution in spectra.

In addition to the inhomogeneity due to defects in the windings of the magnet as well as that due to environmental effects associated with the presence of ferromagnetic material in the vicinity, there is inhomogeneity caused by the presence of the biological target being imaged. This is due to differences between the susceptibility of various tissues then present within the subject being imaged. Biological material can differ in susceptibility by several ppm; and because this change occurs across tissue boundaries, the change in local field is very rapid and the spatial frequency is high. This makes inhomogeneity correction a very challenging task. Nevertheless, substantial correction of magnetic field inhomogeneity is necessary and required for in-vivo applications, particularly when the targeted subject is the living human body; see for example, Robin A. de Graaf, *In Vivo MRI Spectroscopy: Principles and Techniques,* 2nd Edition, January 2008.

For routine imaging applications where the requirement is merely to separate resonant lines of fat and water in living tissues, only low order and degree shimming is necessary. Provided that the magnitude of inhomogeneity over the FOV is less than 3.5 ppm, the nuclear magnetic resonance signals which arise from fat tissue in these instances can be suppressed by appropriate pulse sequencing. This is easily achievable by the conventionally available equipment.

However, at the other end of the problem, e.g., if high resolution images of the brain are required, then the means for field correction to a high order and degree must exist and be available. This high resolution image goal is far more challenging and extremely difficult to achieve.

Inhomogeneities in the Magnetic Field

A conventional magnetic resonance, of which the system illustrated in Prior Art FIG. 1A and FIG. 1B is a typical example, generates a substantially homogeneous and temporally constant (or static) main magnetic field, commonly referred to as the $B_0$ field (also termed the 'basic magnetic field') in a limited spatial volume (also called an 'examination volume' or an 'imaging volume' or the 'field of view') within which the targeted subject is disposed.

By definition, this $B_0$ field exists in the same direction as, and is parallel to, the positive Z-axis of a Cartesian coordinate system within this examination volume. Consequently, the plane which is perpendicular to the $B_0$ field lines is the XY plane, the X-axis extending horizontally and the Y-axis extending vertically. For clarity, see FIG. 1B where the direction of the $B_0$ magnetic field is indicated and corresponds to the direction of the positive Z-axis.

The main magnetic $B_0$ field is the vector sum of three components $$B_0 = iB_x + jB_y + kB_z.$$  [Expression 1]

These three components are linked according to Gauss's theorem whereby $$\nabla \cdot B = \frac{\partial B_x}{\partial x} + \frac{\partial B_y}{\partial y} + \frac{\partial B_z}{\partial z} = 0$$  [Expression 2]

so that a change in any one component is accompanied by a change in the others. However, in the imaging volume, the magnetic field is very strong; and because the magnetic field is homogeneous to within tens of parts per million, it is predominantly in the Z axis direction. This means that the transverse components $B_x$ and $B_y$ are very small in comparison. The magnitude of the magnetic field is given by $$B_0^2 = B_x^2 + B_y^2 + B_z^2$$  [Expression 3]

and this can be rewritten as $$B_0 = B_z(1 + (B_x^2 + B_y^2)/B_z^2)^{1/2}$$  [Expression 4]

Expanding this by the binomial theorem and retaining only the leading terms we get $$B_0 = B_z + (B_x^2 + B_y^2)/2B_z$$  [Expression 5]

Note that in the second term of the preceding Expression 5, the transverse field components are small and the large axial component appears in the denominator. This means that the second term is negligible in comparison with the first term and that the total field, $B_0$, to all intents and purposes, can be represented as the axial field component, B. This greatly simplifies the analysis necessary for designing field correction coils since only the single $B_z$ field component is involved. The field produced by a correction coil will contain all three field components, but only the $B_z$ component will be effective at field correction. This can be seen from what follows.

Suppose that a shim coil generates an axial correction $dB_z$ that is added to the field of the magnet requiring correction. This can be represented as $$B_0 = B_z + dB_z + (B_x^2 + B_y^2)/2(B_z + dB_z)$$  [Expression 6]

and it can be seen that there is a direct addition. Now suppose that accompanying the $dB_z$ addition there is a $dB_x$ addition. This can be represented as $$B_0 = B_z + ((B_x + dB_x)^2 + B_y^2)/2B_z$$  [Expression 7]

and it can be seen that since the $dB_x$ correction appears in the second term of Expression 7, there is a negligible change in the $B_0$ field. See also C-N Chen and D I Hoult, Biomedical magnetic resonance Technology, Adam Hilger, 1989 for additional details.

The Particular Needs of In-Vivo Magnetic Resonance Applications

Techniques for designing magnets which have very high homogeneity are well established. See for example: D. Bruce Montgomery, Solenoid Magnet Design, Robert E. Krieger Publishing Co, 1980. MRI systems constructed specifically for in-vivo applications today will provide a $B_0$ homogeneity which is less than 5 ppm over a 50 cm diameter spherical volume for any commercially available 3 T system; or is better than 2 ppm over a 30 cm diameter spherical volume for 7 T or higher strength systems. However, no matter how well designed magnets are, inhomogeneities inevitably are present in the field generated by the as-built magnet.

1. Inhomogeneities arise from misplacement of windings during manufacture, by environmental effects, and from the presence of the target to be imaged. Of these, the last is the most difficult to deal with and to resolve.

For technical and economic reasons, the high-field high-homogeneity magnets suitable for MRI and MRS applications of necessity use windings made of material that is a superconductor. This requires that the magnet be maintained at a safe margin below the critical temperature of the particular superconductor material used; and typically such magnets operate at about 4K. As the magnet is cooled from room temperature to 4K, the windings and the magnet structure physically contract such that the cold temperature dimensions are meaningfully different from those existing at room temperature.

Furthermore, when the magnet is energized, the interaction of the current in the coil (with the magnetic field that it generates) creates what are known as 'Lorentz forces' on the conductor. These are transmitted to the coil forms and support structure for the magnet. Such Lorentz forces put the magnet components under mechanical stress, which in turn results in strain that creates additional misplacement of the windings.

To a large extent, the dimensional changes due to cool down and magnet energization can be predicted; and the magnet is designed in such a way that, after cool down and energization, the windings are in a position which creates the desired field homogeneity. Thus for a well designed magnet, this not a major source of field inhomogeneity.

Of far more serious concern are deviations in the placement of conductor from the ideal positions required by the design. For example, the theoretical design of the magnet assumes that the windings consist of conductors that are ideal hoops. In practice however, the conductor is continuous; and during magnet fabrication, the wire not only must make a transition from one turn to another every 360 degrees, but also must make a transition from one layer to the next at the end of each layer. This results in the presence of axial and radial components of current, which in turn, generate fields which deviate from the field configuration as designed.

Furthermore, high homogeneity magnet systems of necessity comprise more than one set of windings, i.e., they are multi-coil systems and conductor must be routed from one coil to the next. Even though, to ensure cancellation, every attempt is made to run wires carrying opposite currents in pairs, inevitably there are regions where the pairing is not exact. This too generates spurious field configurations. Mechanisms such as these, which result in deviations from the ideal placement of conductor, are responsible for creating many magnetic field inhomogeneities.

Another source of inhomogeneity arises from the surroundings of the magnet. If there is ferromagnetic material in the vicinity, for example steel reinforcement in the concrete foundation or steel beams in the walls or ceiling of the room in which the magnet is located, then it will become magnetized. This magnetized material produces its own magnetic field which is then superimposed on that of the magnet, thereby degrading it.

Inhomogeneities such as these are due entirely to the magnet hardware or the environment in which the magnet is situated; and once the magnet is installed and energized, they are constant. When a MRI magnet is commissioned, it typically undergoes an initial shimming procedure for minimizing such effects by means of passive shims, (ferromagnetic elements placed in the bore of the magnet). In some rare cases, low order, low degree integrated superconducting (SC) shims are used, but only a small fraction of commercially produced magnets contain SC for performing this task.

2. A more challenging class of inhomogeneities arises from the interaction of the $B_0$ field with biological tissue that is to be imaged. Any substance that is placed in an external magnetic field has an additional field induced in.

In a linear isotropic material, the induced field is proportional to the applied field and the constant of proportionality is known as the magnetic susceptibility, x. Thus, an object placed in an applied field $B_0$ will experience an induced field $\delta B_0 = \chi B_0$.

If the susceptibility of the specimen being examined were constant throughout its volume then there would be a uniform field shift throughout the specimen; only the magnitude of $B_0$ would change. However, biological specimens contain cavities and organs with cells consisting of substances with a multitude of different susceptibilities which change across cell and organ boundaries.

Biological tissue has a susceptibility of the order of −10 ppm, whereas air has a susceptibility of about +0.3 ppm. The difference in susceptibility between brain white matter and grey matter is about 0.02 ppm. This means the field strength can change by parts per million on small spatial scales. This is equivalent to saying that the nature of the inhomogeneity is of high order and degree and that it can be corrected only by high order and degree shimming.

An additional complication arises from the fact that significant differences in anatomical detail are observed in the same organ, e.g., the human brain, in different individuals. The differences are large enough that inhomogeneity corrections have to be applied on a subject by subject basis; in a clinical environment the magnet must be reshimmed between patients.

Inhomogeneities arising from this mechanism are known as susceptibility artifacts. Inhomogeneities associated with this mechanism give rise to what are known as susceptibility artifacts; and it should be noted that because of the proportionality of the induced field to the applied field, the magnitude of the induced field which has to be corrected increases with increasing applied field. Thus, the magnitude of the field to be corrected at 3.0 T and 7.0 T is respectively 2.0 times and 4.7 times that at 1.5 T. This illustrates the importance of high order and degree shimming for correcting susceptibility artifacts arising in biological tissue when using high field MRI/MRS systems; and the fact that as the ambient magnetic field is increased, the strengths of the shims necessary for field correction must be proportionately increased.

Methods for Magnetic Field Correction

Two practices are conventionally used for correcting errors (inhomogeneities) in the primary magnetic field. One relies on the properties of ferromagnetic material, and the other relies on electric currents; however, both work by generating fields which when superimposed on the primary magnetic field act in opposition to the primary field errors and substantially cancel them.

1. A field correction involving the use of ferromagnetic material, typically iron or steel, is referred to as 'ferromagnetic' shimming or 'passive' shimming. When a piece of steel is placed in a magnetic field it becomes magnetized. When placed in the high magnetic fields of MRI systems the steel operates at its saturation magnetization with the magnetization in the direction of the energizing $B_0$ field. Ferromagnetic shimming is effective at correcting the low order and low degree field errors introduced by wire misplacement during manufacture and those due to environmental factors.

A large number of ferromagnetic elements are disposed in a regular pattern on the surface of a cylinder concentric with the cylinder which forms the room temperature bore tube of the magnet generating the primary field. Typically, between 12 and 24 trays each of which runs parallel to the Z-axis are arranged symmetrically around the circumference of the cylinder.

Each tray contains a number of pockets into which can be placed a desired number of ferromagnetic elements. The number and size of the ferromagnetic elements which are placed in each slot is determined according to what is required to achieve the desired degree of shimming.

2. To create a more uniform main magnetic field using an MRI electromagnet or a series of permanent MRI magnets, it is a conventional practice to use a series of extra wire windings as in-situ correction coils as an integrated feature of the construction. Such in-situ correction coils are discrete wire windings prepared in series or multiple sets; are mounted upon the same support structure together with gradient coils; are capable of creating a range of varying magnetic gradients that are superimposed on the main magnetic field generated by the primary MRI magnet itself; and collectively will alter the entirety of the main magnetic field in a manner which increases the uniformity (homogeneity) of the field.

Today, 3 T magnetic resonance systems typically contain five (5) correction coils integrated into the gradient coil structure. However, most 1.5 T magnetic resonance systems still have no correction coils at all. This is most unfortunate, but nevertheless continues to be the factual reality because multiple sets of wire wound correction coils must be integrated in-situ within these systems in order to achieve a meaningful increase in magnetic field homogeneity.

Shim Coils and Shimming Procedures

Even if a MRI magnet were manufactured which is technically capable of producing a perfectly homogeneous main magnetic field, the inherent magnetic attributes of the targeted subject to be examined, when introduced into the bore volume of the magnet, would effectively alter the perfect homogeneity of the $B_0$ field. Thus, even if this perfect homogeneous state could be generated, there still must be some effective means for correcting the newly created magnetic field distortions along the $B_z$ vector caused by the targeted subject.

1. Shimming is a conventional technique used today to improve the overall homogeneity of the main magnetic field generated by a primary MRI magnet. The essence of shimming is the application to the existing magnetic field of a supplemental magnetic field or gradient which conforms in configuration, size, and magnetic field strength to a specified spherical harmonic component (which is itself delineated in location and spatial form by a mathematically calculated field term). Thus, for one particular spherical harmonic component in the uncorrected magnetic field, a carefully controlled supplemental magnetic field (or "gradient") is applied to that function—this supplemental magnetic field having the same spatial distribution, but having a magnetic field strength equal and opposite to that spherical harmonic field component. By super-positioning and merging these two opposite magnetic fields together, a neutralization and cancellation of the magnetic field error (inhomogeneity) is effected.

Today, shim coils typically made of wire windings are typically used to supply a range of different supplemental magnetic fields, which are collectively effective to correct $1^{st}$ and $2^{nd}$ degree inhomogeneities in the magnetic field generated by a primary MRI magnet in a magnetic resonance assembly over the entire volume of the ROI. In these instances of shimming, for each spherical harmonic field component that is to be neutralized and cancelled, there is at least one corresponding shim coil which can generate a carefully controlled supplemental magnetic field that will be superimposed and overlaid upon one particular inhomogeneity of the main magnetic field.

2. Two types of shim coils and shimming techniques are known in this art: Passive formats and active formats.

Passive techniques employ an arrangement of shim steel elements for minimizing static magnetic field inhomogeneities. However, these passive techniques are not suited to handle field inhomogeneities on a scan-by-scan basis; and are primarily used to compensate for built-in tolerances of the MRI magnet of the magnetic resonance assembly and for static and environmental side effects. In short, passive shimming is not suitable for use with the high magnetic field strengths of superconducting magnets to control patient susceptibility effects.

In contrast, active shimming uses specifically designed wire and similarly fashioned coils, their design being very similar to that of the conventional wire gradient coils in the MR system. The electrical current running through these active shim coils can be adjusted and optimized to fine tune the overall homogeneity of the magnetic field produced by the MRI magnet throughout the ROI. Active shim coils are commonly used to provide subject-by-subject corrections to the main magnetic field via room temperature electrical wire windings and similarly fashioned coils that are either disposed on a specific cylindrical former that constitutes the outer structure within the room temperature bore of the MRI magnet, or are incorporated into the gradient coil structure of the magnetic resonance system.

In active shimming, multiple shim coils are provided in a prepared shim coil arrangement. To operate the shim coil arrangement, a separate power amplifier pack delivers highly constant and reproducibly adjustable direct currents; and the shim coil arrangement is then used for fine correction whenever high homogeneity is needed for the $B_0$ field.

An illustrative example of active shimming is provided by U.S. Pat. No. 5,614,827, where the main magnetic field in the examination volume can be described by coefficients of spherical harmonic functions. As disclosed therein, the first term in such a representation would be the zero term representing a homogeneous, uniform component. Then, there are three linear gradient spherical harmonics; five quadratic components; seven cubic components; and so on. Linear and higher degree spherical harmonics may be suppressed in major part by means of the electric currents applied to the shim coil arrangement, so as to leave substantially only the desired $zero^{th}$ term of the main magnetic field distribution. The above cited patent also teaches that linear magnetic field deviations (i.e., first-degree field disturbances) can be compensated by charging gradient coils with an offset current so as to avoid duplication. The offset current is a constant current that is superimposed on a current that executes a gradient sequence.

3. To compensate higher-degree field inhomogeneities, respective shim coils must be provided in correspondence to the order and degree that is to be compensated, each such coil essentially compensating the corresponding field disturbance for which it must be charged with a suitable current. In magnetic resonance tomography, five shim coils generally suffice for acceptance purity requirements so that, together with the three gradient coils, eight spherical harmonics that disturb the field homogeneity most severely can be cancelled.

In this manner, using known shim coil arrangements, there are commonly first degree and second degree corrections, and sometimes even third degree corrections, implemented to compensate for the corresponding distortions of the main magnetic field. Advantageously, the active shimming can be adjusted from scan to scan, in order to compensate for inhomogeneities caused by the specific susceptibility and shape of the targeted subject being examined.

4. A wide range of scientific publications are available which describe the variety of constructions and applications pertaining to active shim coils. Merely representing and illustrating these publications are the following: Andersson et al., "How to correct susceptibility distortions in spin-echo echoplanar images: applications to diffusion tensor imaging", *NeuroImage* 2003, 20(2):870-88; Blamire et al., "Dynamic shim updating: a new approach towards optimized whole brain shimming", *Magn Reson Med* 1996, 36(1):159-65; Constable et al., "Composite image formation in z-shimmed functional magnetic resonance imaging", *Magn Reson Med* 1999, 42(1): 110-7; Deichmann et al., "Compensation of susceptibility-induced BOLD sensitivity losses in echo-planar imaging", *NeuroImage* 2002, 15:120-135; Deichmann et al., "Optimized EPI for magnetic resonance studies of the orbitofrontal Cortex", *NeuroImage* 2003, 19(2):430-41; Frahm et al., "Direct FLASH magnetic resonance imaging of magnetic field inhomogeneities by gradient compensation", *Magn Reson Med* 1988, 6(4):474-80; Glover G H, "3D z-shim method for reduction of susceptibility effects in MRI", *Magn Reson Med* 1999, 42(2):290-9; Gruetter R, "Automatic, localised in vivo adjustment of all first- and second-order shim coils", *Magn Reson Med* 1993, 29:804-811; Hsu, J J & G H Glover, "Mitigation of susceptibility-induced signal loss in neuroimaging using localized shim coils", Magn Reson Med 2005, 53(2):243-8 [Erratum in: Magn Reson Med 2005 53(4): 992]; Jezzard, P & R S Balaban, "Correction for geometric distortion in echo planar images from B0 field Variations", Magn Reson Med 1995, 34(1):65-73; Morgan et al., "Correction of spatial distortion in EPI due to inhomogeneous static magnetic fields using the reversed gradient method", J Magn Reson Imaging 2004, 19(4):499-507; Morrell G & D Spielman, "Dynamic shimming for multi-slice magnetic resonance imaging", Magn Reson Med 1997, 38(3):477-83; Stenger et al., "Multishot 3D slice-select tailored RF pulses for magnetic resonance", Magn Reson Med 2002, 48(1):157-165; Stenger et al., "Three-dimensional tailored RF pulses for the reduction of susceptibility artifacts in T(*)(2)-weighted functional magnetic resonance", Magn Reson Med 2000, 44(4):525-31; Webb, P & A Macovski, "Rapid, fully automatic, arbitrary-volume in vivo shimming", Magn Reson Med 1991, 20:113-122; Wen, H & F A Jaffer, "An in vivo automated shimming method taking into account shim current Constraints", Magn Reson Med 1995, 34:898-904; Wilson et al., "Fast, fully automated global and local magnetic field optimization for magnetic resonance imaging of the human brain", NeuroImage 2002a, 17(2):967-76; and Yang et al., "Removal of local field gradient artifacts in T2*-weighted images at high fields by gradient-echo slice excitation profile imaging", Magn Reson Med 1998, 39(3):402-9.

Structures and Capabilities of Active Shim Coils

Structurally, active shim coils are a series of individual wire windings, or two dimensional conductive patterns formed on a cylindrical surface, e.g., by etching a copper sheet; and the conductor forming each active shim coil is typically arranged in such a manner as to manifest, by means of electric current, a specific correcting function selected from a "basis set" of field terms that represent the spherical harmonic solution to Laplace's equation. A detailed description of such field terms and the principles of field correction is presented hereinafter.

As is well established, the central equation governing the magnetic field distribution within a spatial volume through which no electric current passes is the Laplace equation $\nabla^2 \Psi = 0$, in which $\Psi$ is the scalar magnetic potential.

The Laplace equation is most conveniently solved using the spherical polar coordinate system. This framework also provides a calculated "basis set" of field terms by which to express those inhomogeneities existing along the Z axis of the imaging volume of the magnet; and therefore these field terms are a mathematical expression of the nature of the distortions over the $B_z$ vector, the only relevant component of the $B_0$ field as regards homogeneity.

The "basis set" of field terms will also yield and recite the potential corrections by which to neutralize and cancel the inhomogeneities existing in the main magnetic field; and recites a set of correcting field functions (expressed in spatial positional coordinates) which can be manifested and exerted using an active shimming approach.

The basis set of terms recites the correcting field terms as a series of Cartesian coordinate positions which must be electrically corrected in order to solve the spherical harmonic distortions that are commonly encountered in magnetic resonance spectroscopy. It is noted that the basis set of correcting field functions is effective for and provides mathematical solutions for all orders, (m), and all degrees, n (where $n \geq m$) of harmonic distortions that might exist within the $B_0$ magnetic field.

However, in actual practice, only some active shim coils having wire windings for those few correcting field terms allocated to cancelling a spherical harmonic distortion of the $1^{st}$ and $2^{nd}$ degree are convention ally made or used. It is particularly noted that little or no attention at all is given to using shimming to cancel a spherical harmonic distortion of the higher orders and degrees—i.e., harmonic distortions of the $4^{th}$, $5^{th}$, and $6^{th}$ degrees.

Thus even today, very few magnetic resonance assemblies provide shim coils which are able to overcome and correct magnetic field inhomogeneities beyond $2^{nd}$ degree harmonic distortions. Even among the notable exceptions to this practice, there are only a handful of research-designed magnetic resonance assemblies (mostly ultra high field magnetic resonance scanners) which are capable of correcting some, but not all, $3^{rd}$ degree harmonic distortions.

It is noted also that spherical harmonic shims can be created by: Specifically designed circuits arranged so as to create substantially pure spherical harmonic terms; or by use of coils that generate a set of shim terms of the same order but different degrees. A linear combination of fields generated by a combination of coils with independent current sources can result in an arbitrarily pure combination of field terms within the same order. This combination of coils and use technique is frequently called a 'MATRIX shim'. However, there are also a range of non-harmonic shim designs and use techniques that are not subject to this application.

SUMMARY OF THE INVENTION

The present invention is a portable in-bore shim coil insert suitable for correcting high-order, high-degree magnetic field inhomogeneities over a limited examination zone in a magnetic resonance assembly operating at about 3 T-12 T magnetic field strengths and thereby producing a more homogenous main magnetic ($B_0$) field within the limited examination zone for examination of a targeted Region Of Interest (ROI) in a chosen subject, wherein the magnetic resonance assembly includes at least a MRI magnet having an internal bore of known configuration and volume, at least one set of gradient coils, and an arrangement of radio frequency coils, said portable in-bore shim coil insert comprising:
  a movable at will cylinder-like chamber which
    (i) can be tangibly sited at any location within the bore volume of the MRI magnet in the magnetic resonance assembly,
    (ii) is a hollow housing having at least one open end and formed solely of non-magnetic materials, and
    (iii) has fixed length and girth dimensions, and an encompassing perimeter wall with discrete perimeter wall surfaces, and
    (iv) has a limited examination zone present as a demarcated internal shimming space sized to accept and hold a targeted Region Of Interest of a chosen subject for magnetic resonance examination;
  at least one shim coil array disposed upon an encompassing wall surface of said cylinder-like chamber, wherein said shim coil array comprises a plurality of surface coils which
    ($\alpha$) are disposed in azimuthal symmetry and axial distribution upon a perimeter wall surface and
    ($\beta$) are able to provide multiple supplementary magnetic field gradients on-demand sufficient to cancel substantially at least some high order, high degree inhomogeneities of the $B_z$ vector component of the main magnetic ($B_0$) field then present within said demarcated internal shimming space of said cylinder-like chamber;

an electrical power supply in communication with said shim coil array; and means for securing said cylinder-like chamber at a selected location within the bore volume of a MRI magnet in the magnetic resonance assembly.

BRIEF DESCRIPTION OF THE FIGURES

The present invention may be more easily understood and better appreciated when taken in conjunction with the accompanying Drawing, in which:

Prior Art FIG. 1A illustrates the basic components of a typical superconducting magnet system;

Prior Art FIG. 1B illustrates some details in a traditional magnetic resonance system;

Prior Art FIG. 1C illustrates other structural features of a traditional magnetic resonance system;

FIGS. 4A and 4B illustrate the final shim coil pattern for the matrix shims C4, ZC4, S4, and ZS4;

FIGS. 5A and 5B schematically illustrate the interconnection scheme for the matrix shims Z2C2 and Z2S2;

FIGS. 6A and 6B illustrate the final shim coil pattern for the matrix shims Z2C2 and Z2S2;

FIGS. 7A and 7B schematically illustrate the interconnection scheme for the matrix shims Z3X and Z3Y;

FIGS. 8A and 8B illustrate the final shim coil pattern for the matrix shims Z3X and Z3Y;

FIGS. 10A and 10B illustrate the final shim coil pattern for the matrix shims ZC3 and ZS3;

FIGS. 12A and 12B illustrate the final shim coil pattern for the matrix shims matrix shims C5, ZC5, S5, and ZS5;

DETAILED DESCRIPTION OF THE INVENTION

Figure 2A:
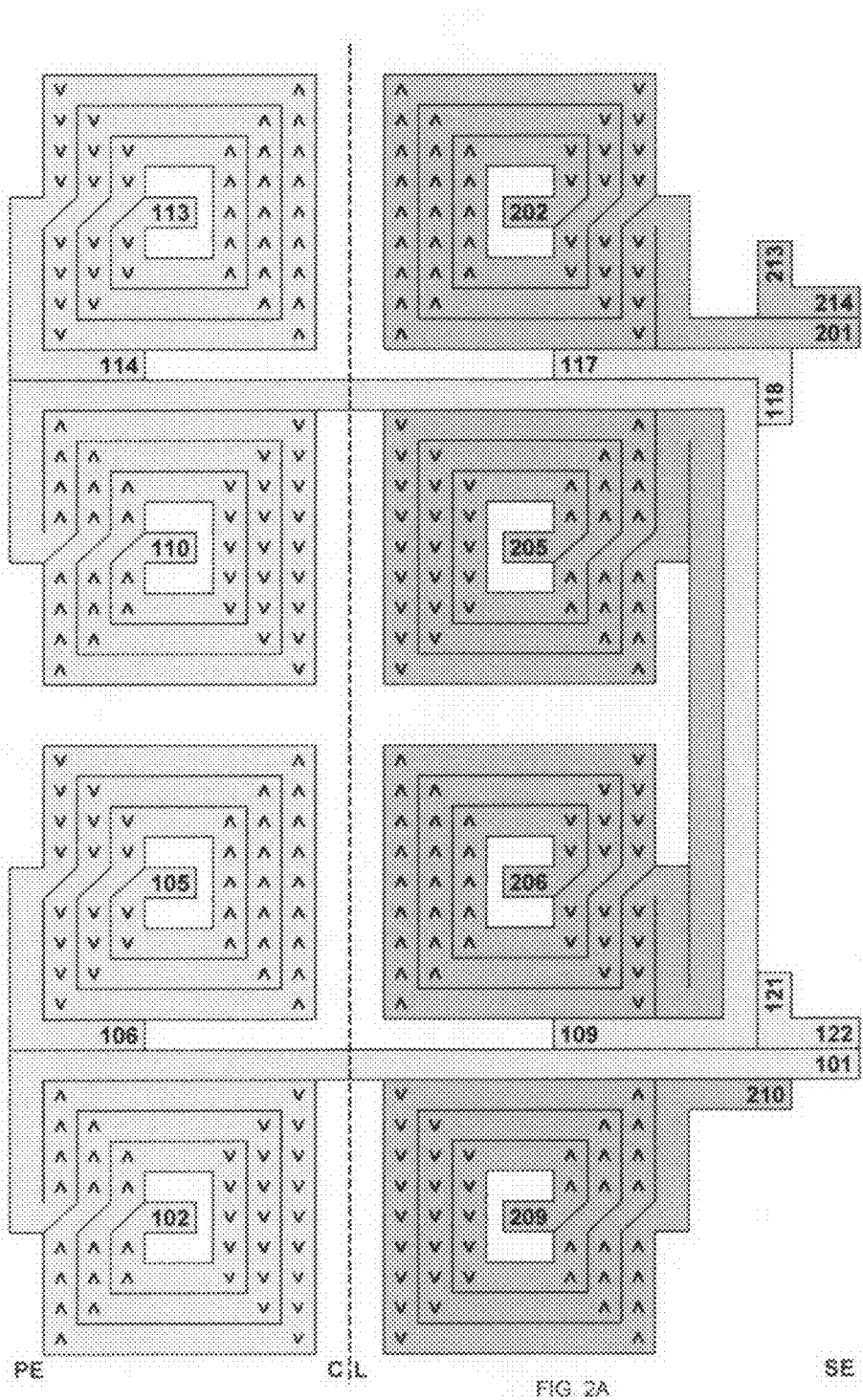
FIGS. 2A and 2B schematically illustrate the top and bottom layers in the interconnection scheme for the matrix shims C4, ZC4, S4, and ZS4.

The present invention is a portable in-bore shim coil insert and shimming method able to produce higher degree shimming effects on-demand (i.e., the correction of at least one high degree inhomogeneity) over the $B_z$ vector component of the main magnetic ($B_0$) field; and is suitable for use with those magnetic resonance assemblies and systems operating at 3 T to 12 T magnetic field strengths.

The insert comprises a movable at will cylinder-like chamber which can be tangibly sited at any desired location within the bore volume of an MRI magnet in a magnetic resonance assembly; is a hollow housing formed solely of non-magnetic materials; has an encompassing perimeter wall with corresponding discrete exterior and interior wall surfaces; and has at least one open end for entry and egress. The chamber also has fixed length and girth dimensions; and a demarcated internal shimming space serving as a limited examination zone which is not only bounded by the perimeter walls, but also is sized and preferably contoured to accept and hold a targeted ROI in a chosen subject.

The portable shim coil insert also provides at least one array of surface coils able to carry electric current and which are collectively disposed in azimuthal symmetry and axial distribution upon the supporting wall surface of the encompassing perimeter wall; and are operative on-demand to produce multiple supplemental magnetic gradients sufficient to cancel a range of inhomogeneities in the main magnetic ($B_0$) magnetic field then present within the limited examination zone of the demarcated internal shimming space. The array of surface coils markedly improves the quality of in-vivo spectroscopy and/or imaging of any desired ROI in a subject or object then positioned within the limited examination zone of the demarcated internal shimming space in the insert.

Accordingly, the full breadth and scope of the present invention provides a prepared in advance in-bore shim coil insert which is portable and movable at will to any desired location within the bore volume of a conventionally manufactured MRI magnet. Note however, that the in-bore shim coil insert is typically designed to be located in the center of the gradient field (i.e., the center of the DSV) in order to achieve optimal results; and this feature should be taken into account by the operator when selecting the particular mounting location within the bore volume of the MRI magnet.

After a particular location has been selected and the shim coil insert has been mounted and secured at that site, the array of surface coils will be aligned and orientated to generate multiple supplemental magnetic gradients of specified size and shape (in accordance with specific field terms) of the $B_z$ component of the magnetic field everywhere within the targeted ROI; and these generated supplemental magnetic gradients will be superimposed at specified spherical polar coordinate positions over the $B_z$ vector of the main magnetic $B_0$ field then present within the physical confines of the demarcated internal shimming space of the insert; and, in this manner, will neutralize and cancel at least some high order, high degree inhomogeneities for any desired ROI in a subject or object then placed within the limited examination zone of the construction.

The capability of the shim coil insert to create such higher order, higher degree corrections of magnetic field inhomogeneities within the physical confines of its demarcated internal shimming space, will in turn, substantially improve both the quality and certainty of obtained empirical results for at least three different clinical/diagnostic procedures, magnetic resonance imaging ('MRI'), nuclear magnetic resonance spectroscopy ('MRS'), and nuclear magnetic resonance spectroscopic imaging ('MRSI'). Consequently, the structure and function of the portable and re-locatable shim coil insert as a prepared article of manufacture, as well as the benefits of its accompanying shimming method, constitute an unforeseen achievement and represent an unpredicted advance in this technical area.

Notable Advantages and Benefits of the In-Bore Shim Coil Insert

A diverse range of unexpected advantages and major benefits are provided by the present invention. Notable among these are the following:

1. The shim coil insert can be initially positioned and subsequently re-positioned at will anywhere within the bore volume of the primary NMR magnet, at any time and for any reason. However, here again, one presumes that the shim coil insert will be typically located in the center of the field (gradient null), and that the anatomy of interest will be placed in the center of that volume. Great caution is recommended in this respect because moving the shim coil insert in the FOV of the gradient may cause coupling effects that are very undesirable for safety reasons.

Once secured in a chosen position, the insert remains stationary; and the targeted ROI is moved into, and then out of the immobilized demarcated internal volume of the insert. Then, if and when desired, the one construct, without making any substantive changes to its component parts or manner of assembly, can be moved as a single entity to another chosen site as needed or desired, so long as the subsequently chosen site lies within the bore cavity of the MRI magnet (given the safety precautions stated above).

The present invention is thus both portable and re-locatable on-demand; may be moved at any time and for any reason after being secured and used at an initial site; and can be re-positioned serially on multiple occasions at many different use locations within the totality of the bore volume of the MRI magnet.

2. There is no need to correct all the magnetic field inhomogeneities which may exist within the relatively large spatial volume of the magnetic field generated by the primary MRI magnet in a magnetic resonance assembly. Instead, the corrections of higher order and degree magnetic field errors are spatially restricted and directed solely to those inhomogeneities existing over the $B_z$ vector component of the main magnetic ($B_0$) field then present within the physical confines of the demarcated internal shimming space of the insert. Thus, it is only those higher order and degree inhomogeneities that exist in that portion of the main magnetic ($B_0$) field that lies within the limited examination zone of the insert that need be and are in fact corrected and cancelled.

3. Since all the higher order and degree field corrections are to be made only within the physical confines of the demarcated internal shimming space existing within the shim coil insert, the electric power consumption requirements of the insert needed to obtain improved homogeneity over the $B_z$ vector component of the main magnetic ($B_0$) field are far less both in extent and cost than those possible with use of conventional magnetic resonance shim assemblies today.

4. The in-bore placement feature of the portable shim coil insert greatly reduces both the number and the scale of higher order and degree inhomogeneities needing correction. Only those field distortions which are present over the $B_z$ vector component of the main magnetic ($B_0$) field within the demarcated internal shimming space of the constructed insert are sources of relevant magnetic field error. All other field inhomogeneities that appear elsewhere within the bore volume of the MRI magnet are deemed to be effectively irrelevant and may be functionally ignored.

5. Not only can $3^{rd}$ degree inhomogeneities be corrected and cancelled by the in-bore shim coil insert; but also $4^{th}$, $5^{th}$ and $6^{th}$ degree inhomogeneities can be corrected and cancelled, if and when desired. Consequently if one wished or were required by use circumstances to do so, a range of multiple $3^{rd}$ to $6^{th}$ degree inhomogeneities can be concurrently corrected in-situ by the present invention. In fact, the correction practice may be extended in principle to include corrections of arbitrarily high order and degree, and is limited only by certain practical issues such as power consumption and spatial resolution of conductor placement.

The reasons for this unique capability and attribute again rest upon the fact that only those magnetic field distortions which are present over the $B_z$ vector component of the main magnetic ($B_0$) field within the boundaries of the limited examination zone of the insert are sources of relevant magnetic field error. Thus, the insert's construction can provide multiple arrays of surface coils directed to cancelling inhomogeneities of the $3^{rd}$ to $6^{th}$ degrees because such corrections are restricted solely and exclusively to the small confined volume of the demarcated internal shimming space.

6. Another major benefit of the in-bore shim coil insert is that it may be constructed as an article of manufacture to be used in two different settings, which are: (i) As a retro-fitted addition and later added appendage to be located within the bore volume of an MRI magnet in a presently existing magnetic resonance system; and (ii) as an original equipment manufacture ("OEM") article which is present as a requisite component in a newly built or erected magnetic resonance assembly.

7. In this regard also, it is envisioned and intended that two or more differently formatted embodiments of the portable shim coil insert will frequently be made available as an operative part of the magnetic resonance assembly. The substantive differences between (or among) these formatted embodiments will typically be: alternative structural designs for the cylinder-like chamber structure such as spools, bands, reels, tubes, or sleeves; the existence of two discrete open ends rather than only one open end; the alternative presence or absence of distinct bends, twists, and curves over the length and girth of the chamber structure; and demarcated internal shimming spaces that are not round or circular as such, but instead are ovoid, elliptical, cylindrical or pancake-shaped limited examination zones.

The availability of such multiple shim coil inserts in different sizes and shaped formats offers great advantages to the user of the magnetic resonance system by an unique ability to accommodate and properly fit those targeted ROIs of a chosen subject which are convoluted, or hinged, or irregular; and consequently have heretofore been extremely difficult, if not impossible, to examine accurately and precisely by magnetic resonance techniques.

8. A measure of the uniformity of the magnetic field over the ROI is the magnitude of its root mean square deviation from the average value. This is characterized by the standard deviation, $\sigma B_0$. The present invention also offers significant reductions in the global $\sigma B_0$ which are achieved globally when higher order and degree corrections are made to the $B_z$ vector component of the main magnetic ($B_0$) field then present within the limited examination zone of the insert; and substantial improvements in local $\sigma B_0$ will result when higher order and degree shimming is employed over the $B_z$ vector component of the main magnetic ($B_0$) field then present within the demarcated internal shimming space of the invention. These are long sought major features and advantages which will markedly improve the clinical and diagnostic value of magnetic resonance imaging, and nuclear magnetic resonance spectroscopy, and nuclear magnetic resonance spectroscopic imaging.

I. Principles of Field Correction

A. In a region that is free of magnetic sources, the magnetic scalar potential, $\Psi$, satisfies Laplace's equation, $\nabla^2 \Psi = 0$. Differentiation of a solution of this equation with respect to the axial coordinate, z, results in a solution for the axial component of magnetic field, Bz, which is the component of magnetic field that is relevant to magnetic resonance imaging and to nuclear magnetic resonance applications. In an interior region, i.e., a region that is closer to the origin than any source of the magnetic field in spherical polar coordinates, this solution is $$Bz(r, \theta, \phi) = \sum_{m=0}^{\infty} \sum_{n=m}^{\infty} (A_{n+1}^m r^n (n + m + 1) P_n^m(u) \cos(m\phi) + B_{n+1}^m r^n (n + m + 1) P_n^m(u) \sin(m\phi))$$

where Bz is the magnetic flux density (loosely referred to as the magnetic field strength) at a field point r, $\theta$, $\phi$; and where r is the polar radius, $\theta$ is the polar angle, and $\phi$ is the azimuthal angle. [See any advanced text on electricity and magnetism, e.g., Smythe, (Static and Dynamic Electricity, McGraw-Hill, 1968) or Stratton, (Electromagnetic Theory, McGraw-Hill, 1941)].

The solution for this interior field is valid inside a sphere whose surface does not intersect any coil corner. It constitutes a double infinite series of components each of which is the product of a source term, $A_{n+1}^m$ or $B_{n+1}^m$, in units of T/m$^n$, and respectively a field term $r^n P_n^m(u)\cos(m\phi)$ or $r^n P_n^m(u)\sin(m\phi)$ in units of m$^n$ which is a function of the coordinates of the field point. Each source term characterizes the strength of the component, i.e., the gradient strength; and each field term characterizes the way in which this strength is spatially distributed. The function $P_n^m(u)$ is an associated Legendre function with argument, u, equal to the cosine of the polar angle, $\theta$. The magnetic field components described above are known as spherical harmonics and constitute a set of orthogonal functions.

When describing certain characteristics of a particular spherical harmonic or a shim coil that is associated with a spherical harmonic, one needs to make use of the terms degree and order. Unfortunately, these terms are used inconsistently and interchangeably in the literature. Therefore, since there is evidently no universally accepted standard for these notations, this text explicitly adopts the notation of such widely used and accepted authorities as Gradsteyn and Ryzhik, (Tables of Integrals and Products, Academic Press, 1980); Abramowitz and Stegun, (Handbook of Mathematical Functions, Dover Publications, 1970); Hobson, (The Theory of Spherical and Ellipsoidal Harmonics, (Cambridge University Press, 1931); and The NIST Digital Library of Mathematical Functions, (http://dlmf.nist.gov/ Chapter 14), whereby the number n is called the degree and the number m is called the order of the function $P_n^m$.

Accordingly, the term degree, n, which is associated with the polar radius r, characterizes the rate at which the strength of the magnetic field changes with respect to distance from the origin along a polar radius; and the term order, m, which is associated with the azimuthal angle $\phi$, characterizes the periodicity of the strength of magnetic field in the azimuthal direction. This text refers to all harmonics which have a common order, m, as belonging to the same azimuthal symmetry family (or for brevity, just 'family'). Each individual azimuthal symmetry family comprises an infinite number of spherical harmonic members, each of which has a different degree, n. Within a given family, the lowest degree, n, is numerically equal to the order, m, of that family.

B. Any interior magnetic field can be decomposed into such a set of spherical harmonics, and it is this property that is exploited for purposes of field correction. A field mapping and field decomposition procedure results in determining the strengths of a selected number of spherical harmonic field components whose presence degrades the quality of the magnetic field; the field would be of better quality, i.e., more homogeneous, if these components were not present.

The method used to improve the quality of the field involves applying a correction individually to each one of these selected components. For each spherical harmonic field component that is to be corrected, a supplementary field which has the same spatial distribution is applied. The strength of this supplementary field is equal in magnitude, but is opposite in sign, to that of the field to be corrected. The superposition of these two fields then results in cancellation of the unwanted field error.

Because the supplementary field has the same spatial distribution as the spherical harmonic field to be eliminated, this cancellation occurs everywhere. This supplementary field is provided by shim coils. For each spherical harmonic error field component that is to be corrected, there must be a corresponding shim coil that can generate a field having a spatial distribution that is substantially the same as that of the field to be corrected. The strength of the field generated by each shim coil is adjusted by changing the current in that shim coil.

It should be noted that the distinction between the part of the expression for Bz shown above (which is regarded as the source term) and that which is regarded as the field term, is somewhat arbitrary. It is largely a matter of what a particular analyst regards as convenient, and there is no scientific or industry standard. As long as the product of the source term and the field term results in the correct value for the field, any convention is valid.

Consequently, while differences in usage will be encountered in the literature, the functional relation between the individual coordinates of corresponding field terms will always be the same, but the values of the field terms may differ by constant factors. A manufacturer of devices for generating and measuring magnetic field will have its own particular convention, which may or may not be consistent with that of other manufacturers; to understand the magnitude of gradient strength as defined by a particular manufacturer it is necessary to know how the associated field term is defined. The system described herein, and which will be used consistently throughout this document, is substantially that currently used by Resonance Research Inc.

C. In some respects, it is easier to visualize the spatial distribution associated with each one of the spherical harmonic field components if the coordinate system is converted from spherical polar coordinate form to the equivalent rectangular Cartesian coordinate form. For this reason, it is the Cartesian coordinate form that is commonly used in the literature associated with magnetic field correction.

The conversion of coordinates is accomplished in the following way. For brevity only the cos(mφ) component will be treated; the treatment of the sin(mφ) component is analogous. Starting with the spherical polar coordinate form, we have $$Bz_n^m(r,\theta,\phi) = A_{n+1}^m r^n (n+m+1) P_n^m(u) \cos(m\phi)$$

The field term $r^n P_n^m(u)\cos(m\phi)$ written thus in spherical polar coordinates can be converted to a polynomial expression in cylindrical coordinates using a relation given by Smythe, (op. cit.), $$r^n P_n^m(u) = (n+m)! \sum_{k=m}^{kmax} \frac{(-)^{(k-m)/2} z^{(n-k)} \rho^k}{(n-k)!(k+m)!!(k-m)!!},$$

where k max=n or n−1, k+m is even and k jumps by two in successive terms of the summation. This results in $$Bz_n^m(\rho,\phi,z) = A_{n+1}^m (n+m+1)! \sum_{k=m}^{kmax} \frac{(-)^{(k-m)/2} z^{(n-k)} \rho^k}{(n-k)!(k+m)!!(k-m)!!} \cos(m\phi)$$

Customarily, but not universally, an additional factor which makes the highest power of z in the polynomial expression equal to unity is included. To accomplish this, the expression above is modified in the following way.

$$Bz_n^m(\rho,\phi,z) =$$

$$\frac{A_{n+1}^m(n+m+1)!}{(n-m)!(2m)!!}(n-m)!(2m)!! \sum_{k=m}^{kmax} \frac{(-)^{(k-m)/2} z^{(n-k)} \rho^k}{(n-k)!(k+m)!!(k-m)!!} \cos(m\phi)$$

The source term in units of T/m$^n$ is now redefined as $$G_n^m = \frac{A_{n+1}^m(n+m+1)!}{(n-m)!(2m)!!}$$

leaving the field term in units of m$^n$ as $$F_n^m(\rho,\phi,z) = (n-m)!(2m)!! \sum_{k=m}^{kmax} \frac{(-)^{(k-m)/2} z^{(n-k)} \rho^k}{(n-k)!(k+m)!!(k-m)!!} \cos(m\phi)$$

and the field is then calculated from $$B_n^m(\rho,\phi,z) = G_n^m F_n^m(\rho,\phi,z)$$

It should be noted that some authorities define the associated Legendre function as $$P_n^m(u) = (-)^m (1-u^2)^{1/2} \frac{d^m P_n^0(u)}{du^m}$$

whereas other authorities omit the $(-)^m$ factor. For reasons concerning this definition an additional factor $(-)^m$ may appear in the field term as it is encountered in the literature.

Finally, to convert from cylindrical coordinate form to Cartesian coordinate form the cosine of the multiple angle is expressed in terms of a polynomial in powers of cosines of the angle using a relation given by Gradsteyn and Ryzhik, (op. cit.), $$\cos(m\phi) = \cos^m(\phi) - \binom{m}{2}\cos^{m-2}(\phi)\sin^2(\phi) + \binom{m}{4}\cos^{m-4}(\phi)\sin^4(\phi) - \ldots$$

where the binomial coefficient $$\binom{m}{j} = \frac{m!}{j!(m-j)!}.$$

Substitution of this expression into the field term above results in terms such as $$\rho^k \cos(m\phi) = \rho^{k-m}\left(x^m - \binom{m}{2}x^{m-2}y^2 + \binom{m}{4}x^{m-4}y^4 - \ldots\right)$$

Thus the Cartesian form of the spherical harmonic field terms can be tediously derived.

It will be noted that the terms in the polynomial representing $F_n^m(\rho,\phi,z)$ given above have alternating signs. Furthermore, as the degree, n, of the Legendre term increases, the magnitudes of the individual terms within the polynomial become larger than the sum of all terms and cancellation between successive terms causes all accuracy to be lost. Thus, although the variation of field may be more easily envisaged in Cartesian coordinates, the Cartesian coordinate form of the field terms should not be used for performing numerical calculations.

The spherical harmonic form of the field terms should be used for any calculation involving fields and simple and stable recursion formulae can be used to calculate the value of the associated Legendre function $P_n^m(u)$; see W.H.Press, et al., Chapter 6 Special Functions, Numerical Recipes—The Art of Scientific Computing, First Edition, 1986. The calculation of any field term is then reduced to the product of three simple terms, i.e., the power of a number, an associated Legendre function and a circular function.

D. As the degree of the field term increases, the number of terms in the polynomial constituting the Cartesian coordinate representation of a spherical harmonic also increases and it becomes cumbersome to write it out in full when the need to refer to it arises. Consequently, to avoid such inconvenience, abbreviations are used. There are many conventions in use, but typically all involve, in one form or another, a representation of the highest power of z in the polynomial and a representation of the azimuthal symmetry.

Table 1 shows one such system. This system is very similar to that used by Resonance Research Inc. and is the system that will be used consistently hereinafter throughout this text. Table 1 shows the field terms corresponding to the first seven degrees, n=0 to n=6, of the infinite set of spherical harmonics.

Within each degree are listed harmonics of order m=0 to m=n. Harmonics of order m=0 which have no azimuthal dependence are referred to as zonal or axial harmonics, and harmonics of order greater than zero are referred to as tesseral or radial harmonics. Harmonics for which m=n are sometimes referred to as sectoral harmonics.

For each harmonic, the spherical polar form, the Cartesian form, and the abbreviated form are shown. It will be seen that the Cartesian form of the harmonic becomes increasingly complex as the degree increases; and if the Cartesian form of the harmonics is to be used, it becomes clear that an abbreviated notation is necessary. It can be seen that in the abbreviated form the highest power of the z coordinate appears together with an indication of the family to which the harmonic belongs.

Thus, it is clear that the abbreviated form Z2C4 indicates a harmonic belonging to the family with fourfold azimuthal symmetry in which the highest power of the axial coordinate is 2. The degree of the harmonic is indicated by the sum of the power of z and the order, m. Thus the Z2C4 harmonic is of degree n=6, meaning that its strength increases as the sixth power of the polar radius.

The harmonics that are listed in Table 1 below extend beyond the range of those harmonics for which shim coils are routinely built. The highest order shims included on the high-degree high-order shim coil-form described later in this text are of the 5$^{th}$ order, (i.e., m equal to 5), C5 ($r^5 P_5^5(u)\cos(5\phi)$), S5 ($r^5 P_5^5(u)\sin(5\phi)$) and ZC5 ($r^6 P_6^5(u)\cos(5\phi)$), ZS5 ($r^6 P_6^5(u)\sin(5\phi)$). C5 and S5 are of 5$^{th}$ degree, (n equal to 5). ZC5 and ZS5 are of 6$^{th}$ degree, (n equal to 6).

TABLE 1

Field Terms in Spherical Polar Form, Cartesian Form and Abbreviated Form

| Degree n | Order m | Spherical | Cartesian $\rho^2 = x^2 + y^2$ | Abbreviation |
|---|---|---|---|---|
| 0 | 0 | $r^0 P_0^0(u)$ | 1 | Z0 |
| 1 | 0 | $r^1 P_1^0(u)$ | z | Z1 |
|   | 1 | $r^1 P_1^1(u)\cos(\phi)$ | x | X |
|   |   | $r^1 P_1^1(u)\sin(\phi)$ | y | Y |
| 2 | 0 | $r^2 P_2^0(u)$ | $z^2 - (1/2)\rho^2$ | Z2 |
|   | 1 | $r^2 P_2^1(u)\cos(\phi)$ | zx | ZX |
|   |   | $r^2 P_2^1(u)\sin(\phi)$ | zy | ZY |
|   | 2 | $r^2 P_2^2(u)\cos(2\phi)$ | $x^2 - y^2$ | C2 |
|   |   | $r^2 P_2^2(u)\sin(2\phi)$ | 2xy | S2 |
| 3 | 0 | $r^3 P_3^0(u)$ | $z(z^2 - (3/2)\rho^2)$ | Z3 |
|   | 1 | $r^3 P_3^1(u)\cos(\phi)$ | $x(z^2 - (1/4)\rho^2)$ | Z2X |
|   |   | $r^3 P_3^1(u)\sin(\phi)$ | $y(z^2 - (1/4)\rho^2)$ | Z2Y |
|   | 2 | $r^3 P_3^2(u)\cos(2\phi)$ | $z(x^2 - y^2)$ | ZC2 |
|   |   | $r^3 P_3^2(u)\sin(2\phi)$ | 2zxy | ZS2 |
|   | 3 | $r^3 P_3^3(u)\cos(3\phi)$ | $x(x^2 - 3y^2)$ | C3 |
|   |   | $r^3 P_3^3(u)\sin(3\phi)$ | $y(3x^2 - y^2)$ | S3 |
| 4 | 0 | $r^4 P_4^0(u)$ | $z^4 - 3z^2 \rho^2 + (3/8)\rho^4$ | Z4 |
|   | 1 | $r^4 P_4^1(u)\cos(\phi)$ | $zx(z^2 - (3/4)\rho^2)$ | Z3X |
|   |   | $r^4 P_4^1(u)\sin(\phi)$ | $zy(z^2 - (3/4)\rho^2)$ | Z3Y |
|   | 2 | $r^4 P_4^2(u)\cos(2\phi)$ | $(x^2 - y^2)(z^2 - (1/6)\rho^2)$ | Z2C2 |
|   |   | $r^4 P_4^2(u)\sin(2\phi)$ | $2xy(z^2 - (1/6)\rho^2)$ | Z2S2 |
|   | 3 | $r^4 P_4^3(u)\cos(3\phi)$ | $zx(x^2 - 3y^2)$ | ZC3 |
|   |   | $r^4 P_4^3(u)\sin(3\phi)$ | $zy(3x^2 - y^2)$ | ZS3 |
|   | 4 | $r^4 P_4^4(u)\cos(4\phi)$ | $x^4 - 6x^2 y^2 + y^4$ | C4 |
|   |   | $r^4 P_4^4(u)\sin(4\phi)$ | $4xy(x^2 - y^2)$ | S4 |
| 5 | 0 | $r^5 P_5^0(u)$ | $z(z^4 - 5z^2 \rho^2 + (15/8)\rho^4)$ | Z5 |
|   | 1 | $r^5 P_5^1(u)\cos(\phi)$ | $x(z^4 - (3/2)z^2 \rho^2 + (1/8)\rho^4)$ | Z4X |
|   |   | $r^5 P_5^1(u)\sin(\phi)$ | $y(z^4 - (3/2)z^2 \rho^2 + (1/8)\rho^4)$ | Z4Y |
|   | 2 | $r^5 P_5^2(u)\cos(2\phi)$ | $z(x^2 - y^2)(z^2 - (1/2)\rho^2)$ | Z3C2 |
|   |   | $r^5 P_5^2(u)\sin(2\phi)$ | $2zxy(z^2 - (1/2)\rho^2)$ | Z3S2 |
|   | 3 | $r^5 P_5^3(u)\cos(3\phi)$ | $x(x^2 - 3y^2)(z^2 - (1/8)\rho^2)$ | Z2C3 |
|   |   | $r^5 P_5^3(u)\sin(3\phi)$ | $y(3x^2 - y^2)(z^2 - (1/8)\rho^2)$ | Z2S3 |
|   | 4 | $r^5 P_5^4(u)\cos(4\phi)$ | $z(x^4 - 6x^2 y^2 + y^4)$ | ZC4 |
|   |   | $r^5 P_5^4(u)\sin(4\phi)$ | $4zxy(x^2 - y^2)$ | ZS4 |
|   | 5 | $r^5 P_5^5(u)\cos(5\phi)$ | $x(x^4 - 10x^2 y^2 + 5y^4)$ | C5 |
|   |   | $r^5 P_5^5(u)\sin(5\phi)$ | $y(y^4 - 10x^2 y^2 + 5x^4)$ | S5 |
| 6 | 0 | $r^6 P_6^0(u)$ | $z^6 - (15/2)z^4 \rho^2 + (45/8)z^2 \rho^4 - (5/16)\rho^6$ | Z6 |
|   | 1 | $r^6 P_6^1(u)\cos(\phi)$ | $zx(z^4 - (5/2)z^2 \rho^2 + (5/8)\rho^4)$ | Z5X |
|   |   | $r^6 P_6^1(u)\sin(\phi)$ | $zy(z^4 - (5/2)z^2 \rho^2 + (5/8)\rho^4)$ | Z5Y |
|   | 2 | $r^6 P_6^2(u)\cos(2\phi)$ | $(x^2 - y^2)(z^4 - z^2 \rho^2 - (1/16)\rho^4)$ | Z4C2 |
|   |   | $r^6 P_6^2(u)\sin(2\phi)$ | $2xy(z^4 - z^2 \rho^2 - (1/16)\rho^4)$ | Z4S2 |
|   | 3 | $r^6 P_6^3(u)\cos(3\phi)$ | $zx(x^2 - 3y^2)(z^2 - (3/8)\rho^2)$ | Z3C3 |
|   |   | $r^6 P_6^3(u)\sin(3\phi)$ | $zy(3x^2 - y^2)(z^2 - (3/8)\rho^2)$ | Z3S3 |
|   | 4 | $r^6 P_6^4(u)\cos(4\phi)$ | $(x^4 - 6x^2 y^2 + y^4)(z^2 - (1/10)\rho^2)$ | Z2C4 |
|   |   | $r^6 P_6^4(u)\sin(4\phi)$ | $4xy(x^2 - y^2)(z^2 - (1/10)\rho^2)$ | Z2S4 |
|   | 5 | $r^6 P_6^5(u)\cos(5\phi)$ | $zx(x^4 - 10x^2 y^2 + 5y^4)$ | ZC5 |
|   |   | $r^6 P_6^5(u)\sin(5\phi)$ | $zy(y^4 - 10x^2 y^2 + 5x^4)$ | ZS5 |
|   | 6 | $r^6 P_6^6(u)\cos(6\phi)$ | $(x^2 - y^2)(x^4 - 14x^2 y^2 + y^4)$ | C6 |
|   |   | $r^6 P_6^6(u)\sin(6\phi)$ | $2xy(x^2 - 3y^2)(3x^2 - y^2)$ | S6 |

II. Field Term Correction Practices

Based upon the magnetic field principles presented above, the field terms provided by Table 1 above identify and recite in theory the spatial configuration of inhomogeneities up to sixth degree which can potentially exist within the main magnetic field generated by a NMR magnet. The mathematically calculated range and variety of different field terms provide a broad theoretical model and mode of analysis by which to identify the many kinds of inhomogeneities existing within the magnetic field. These different field terms provide a comprehensive and complete mathematical formula basis for understanding what kinds and types of inhomogeneities are likely to be present in a generated magnetic field.

Nevertheless, effective use and practical application of this broad theoretical model today remains an unrelenting puzzle and torment for the designers and builders of magnetic resonance assemblies. The reasons for this are quite clear: by tacit acquiescence and common consent of many experienced professionals working in this technical area, it is deemed to be realistically impractical as a matter of manufacture—and is seen as technically impossible owing to the overwhelming numbers of necessary field term corrections—to neutralize and cancel all of the inhomogeneities existing within the main magnetic field generated by a magnetic resonance assembly.

Thus, even given the body of mathematically calculated field terms in the theoretical model, it is still necessary that each potential magnetic field correction be a purposeful introduction of a separate and differently directed supplemental magnetic field (or gradient); and that each potential magnetic field correction be spatially correct in its spatial contours; and that each potential magnetic field correction be accurately superimposed over and upon one particular inhomogeneity at a specified coordinate position within the main magnetic field. Consequently, an effective correction and substantial neutralization for each and every one of the field terms and inhomogeneities existing within the main magnetic field becomes an organizational nightmare and an operational impossibility.

As a result, shimming methods have been and remains today a poor compromise between the best possible and the worst possible situations. The designer/manufacturer or intended user of the magnetic resonance assembly typically chooses to correct only a very few individual field terms which represent the worst field inhomogeneities in the main magnetic field. The often stated reasons and rationale for this custom and practice vary from: the relatively high costs of shim coils, the difficulty of manufacturing and integrating technically correct shim coils, and the belief that the presence of higher degree field inhomogeneities are acceptable and operationally insignificant.

Thus, even in the most current and technologically advanced systems, very few magnetic resonance assemblies operationally attempt to correct inhomogeneities beyond the $1^{st}$ and $2^{nd}$ degree field terms; and even among the rare exceptions, only a small number of research-designed magnetic resonance assemblies are capable of correcting some, but certainly not all, $3^{rd}$ degree field terms. However, no attention at all is paid to, nor is any correction made for, the higher degree field terms (i.e., the $4^{th}$, $5^{th}$, or $6^{th}$ degree inhomogeneities). This kind of technical compromise and accommodation represents the current practice and true state of the art today.

III. The Present Invention as a Whole

The present invention is a portable and movable at will in-bore shim coil insert suitable and operative for correcting higher degree magnetic field inhomogeneities along and over the $B_z$ vector component of the main magnetic ($B_0$) field which is present within the limited examination zone appearing as the demarcated internal shimming space encompassed by the perimeter walls of the construct.

The insert is portable and can be positioned at any desired or required location within the available volume of the bore in a MRI magnet so long as the chosen position avoids coupling problems. In this regard, it is recognized that proper site positioning with respect to the gradient field is one of the major recurring problems; and that the ability to place the shim coil insert inside the bore of the gradient field imposes certain limitations on the operator's freedom of choosing a site for proper positioning of the insert.

However, once properly sited and secured at a chosen position, it is intended that the insert remain stationary; and that the targeted ROI be moved into and out of the demarcated internal shimming space delineated by the perimeter walls of the construct. Accordingly, the stationary insert will produce a substantially improved homogeneity for the circumscribed $B_z$ vector of the main magnetic ($B_0$) field within the limited examination zone of the insert for a magnetic resonance assembly operating at 3 T-12 T magnetic field strengths.

It will be recalled also that, in general, the MRI magnet has a pre-sized internal bore volume for the placement of a chosen subject for examination by spectroscopic analysis and/or imaging of one or more individual regions or slices of interest. Consequently, the exact positioning of the movable shim coil insert at a pre-selected location within the bore dimensions and cavity volume of the MRI magnet is frequently decided in advance by either the manufacturer or the operator of the magnetic resonance assembly in order to meet the particular requirements of the targeted ROI undergoing examination; and such in-bore placement is typically achieved at the desired site by physically attaching and securing the shim coil insert as a whole to any tangible surface or object then present at the selected location.

Once properly secured at the desired location within the cavity volume of the MRI magnet, the shim coil insert remains immobilized at that selected site within the bore volume; and will operate at that location to produce substantial improvement in homogeneity over the $B_z$ vector component of the main magnetic ($B_0$) field then present at all positions within the insert's demarcated internal shimming space—a limited examination zone which is sized and preferably contoured to accept and hold the targeted Region Of Interest in a chosen subject for magnetic resonance examination.

The Range and Variety of Intended Constructs

By definition, a minimal in-bore shim coil insert will comprise a movable at will cylinder-like chamber which
  (i) can be tangibly sited at any location within the bore volume of the MRI magnet in the magnetic resonance assembly,
  (ii) is a hollow housing having at least one open end and formed solely of non-magnetic materials, and
  (iii) has fixed length and girth dimensions, and an encompassing perimeter wall with discrete wall surfaces, and
  (iv) has a limited examination zone which exists as the demarcated internal shimming space which is circumscribed and sized to accept and hold a targeted ROI of a chosen subject for magnetic resonance examination.

In addition, at least one shim coil array is disposed upon an encompassing wall surface of the cylinder-like chamber, wherein the shim coil array comprises a plurality of current carrying surface coils which are disposed in azimuthal symmetry and axial distribution upon the wall surface; and which are able to provide multiple supplementary magnetic field gradients on-demand that are sufficient to cancel substantially at least some high order, high degree inhomogeneities throughout the ROI of the $B_z$ vector component of the main magnetic ($B_0$) field then present within the circumscribed examination zone of the demarcated internal shimming space in the cylinder-like chamber.

Finally, the minimal in-bore shim coil insert will also include a connection to an electrical power supply able to supply necessary levels of current to the shim coil array; and also provide means for securing said cylinder-like chamber and said disposed shim coil array at a selected location within the bore volume of the MRI magnet in the magnetic resonance assembly.

In some preferred embodiments, however, the in-bore shim coil insert will comprise at least one shim coil array which is disposed in azimuthal symmetry and axial distribution upon an encompassing wall surface of the cylinder-like chamber, wherein the shim coil array includes
  (i) surface coils which provide multiple supplementary magnetic gradients of predetermined dimensions and configuration which are sufficient to cancel $3^{rd}$ degree inhomogeneities at a plurality of specified spherical polar coordinate positions over the $B_z$ vector component of the main magnetic ($B_0$) field; and
  (ii) surface coils which provide multiple supplementary magnetic gradients of predetermined dimensions and configuration which are sufficient to cancel $4^{th}$ degree inhomogeneities at a plurality of specified spherical polar coordinate positions over the $B_z$ vector component of the main magnetic ($B_0$) field.

In the highly preferred embodiments of the invention, multiple sets of different shim coil arrays will be present, each individual shim coil array being individually disposed in azimuthal symmetry and axial distribution upon an encompassing wall surface of the cylinder-like chamber. In these highly preferred formats, the higher degrees of magnetic field inhomogeneities ranging from $3^{rd}$ degree spatial errors through $6^{th}$ degree spatial distortions will be separately corrected and individually cancelled.

IV. The Cylinder-Like Chamber

The mobility of the shim coil insert construct and the corresponding ability to site the insert at any desired location within the bore volume of the MRI magnetic stems from the portable cylinder-like chamber. The cylinder-like chamber is a movable at will, rigid casing or housing which can be tangibly sited and secured at any desired location within the entirety of the bore volume of an MRI magnet in a magnetic resonance assembly.

In each embodiment, however, the potable cylinder-like chamber will consistently display a recognized series of structural features. Accordingly, the chamber will always be a hollow housing formed solely of non-magnetic materials, and provide at least one open end for entry and egress of the subject to be examined; and always have fixed length and girth dimensions, and present at least one encompassing perimeter wall with corresponding discrete exterior and interior wall surfaces; and always have a demarcated internal shimming space serving as a limited examination zone, which is pre-sized and preferably contoured to accept and contain the targeted Region Of Interest in a chosen subject over that time interval needed for performing magnetic resonance examination.

Figure 13:
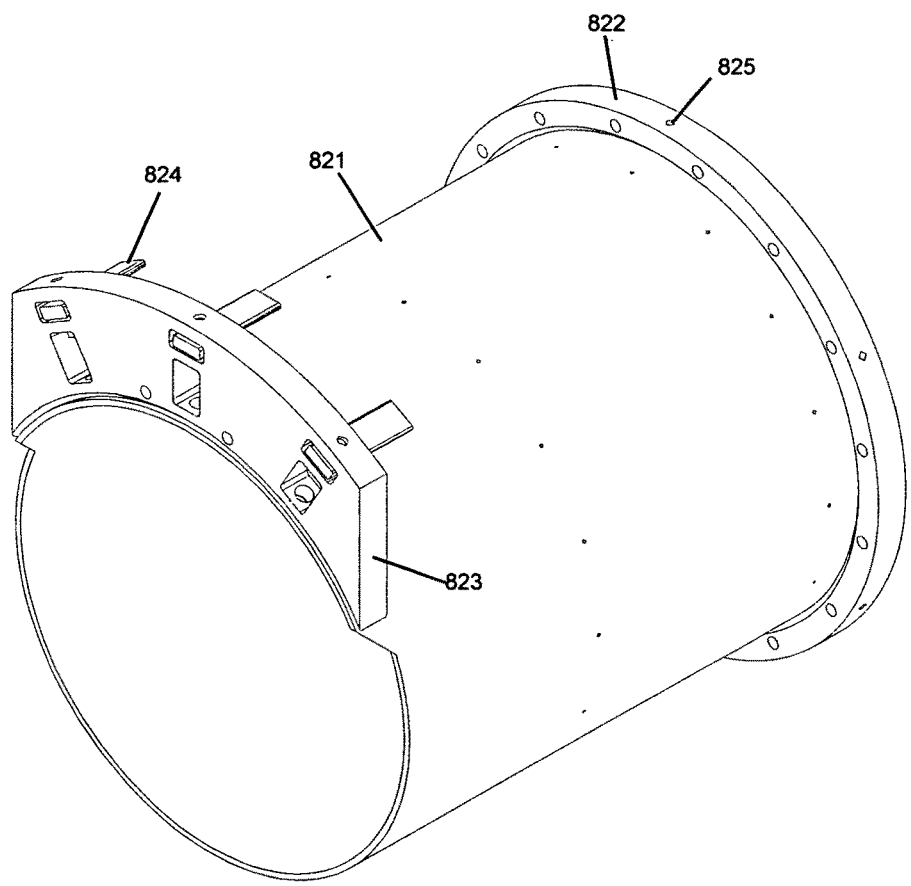
FIG. 13 shows a first perspective view of an open-ended bobbin structure and preferred embodiment of the cylinder-like chamber.
Figure 14:
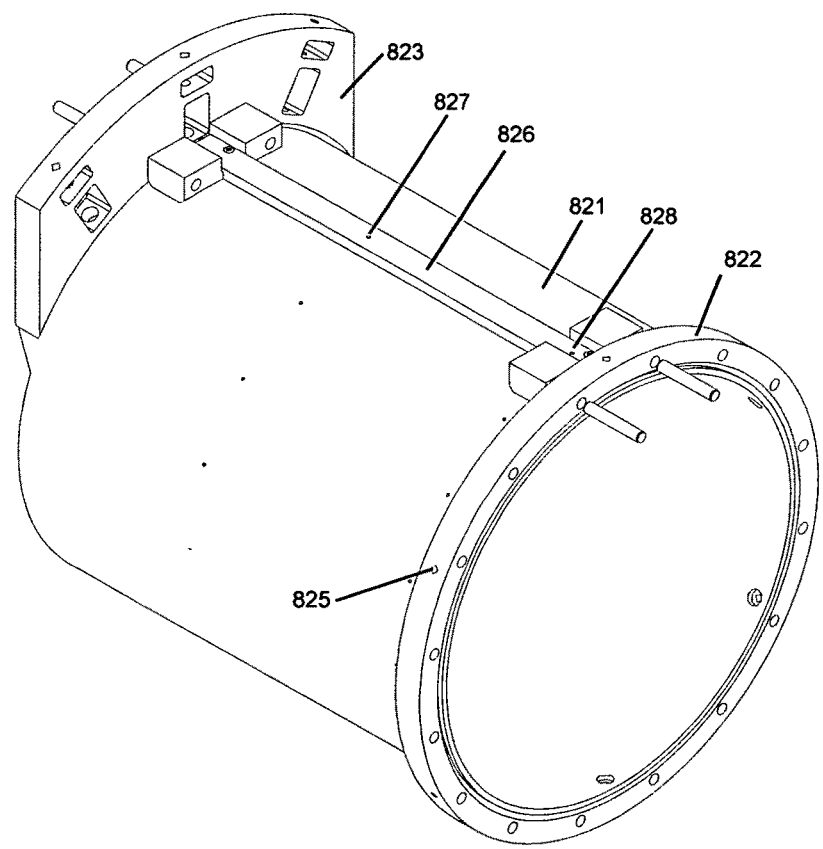
FIG. 14 shows a second alternative perspective view of the open-ended bobbin structure and preferred embodiment of the cylinder-like chamber shown in FIG. 13.
Figure 15:
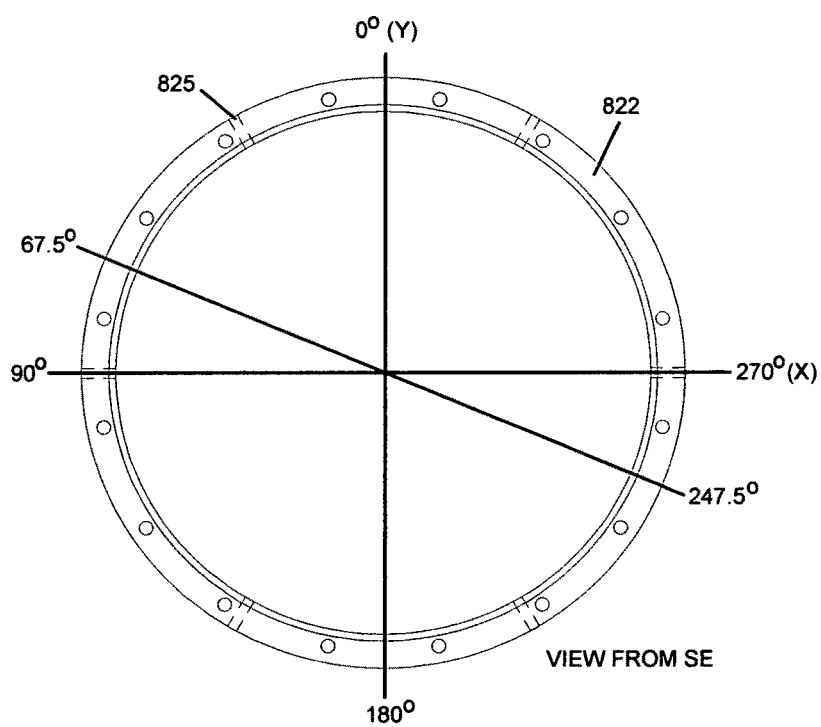
FIG. 15 shows a frontal view of the open-ended bobbin structure and preferred embodiment of the cylinder-like chamber shown in FIG. 13.

One preferred example of such a cylinder-like chamber is the open-ended bobbin structure illustrated by FIGS. 13-15 respectively. A bobbin, by definition, is a preformed spool structure formed in any desired range of inner and outer diameters; has two open ends; and is a ring-shaped support structure which can be fashioned of one or more non-magnetic material(s) and prepared in a variety of different breadths, girths, and cavity space volumes. The encompassing perimeter wall of the bobbin delineates and provides the demarcated internal shimming space; and the outer perimeter wall surface (i.e., the exterior surface) of the bobbin is used as a solid support upon which to dispose one or more individual arrays of surface pattern shim coils symmetrically and in an azimuth orientation (with respect to the origin or center of the cavity space in the bobbin). Typically, the overall dimensions of the bobbin will be chosen and fixed in advance to accept, hold, and contain the targeted Region Of Interest of a chosen subject for that period of time necessary to perform a magnetic resonance examination using conventionally known techniques.

It will be clearly understood, however, that the illustrated bobbin design is merely one kind of suitable cylinder-like chamber structure. Merely representing other possible and desirable alternatives are any pre-sized band, reel, tube, disc, cone, or cylinder structure fashioned of a non-magnetic material and having at least one open end for entry and egress. Each of these exemplary alternative structures has at least one discrete encompassing perimeter wall with corresponding discrete exterior and interior wall surfaces; and provides a limited examination zone of determinable dimensions and volume, i.e., a demarcated internal shimming space.

It will be recognized also that the cylinder-like chamber as a whole can, and often will, include distinct bends, twists, and curves over its length and girth. For example, 90-180 degree bends in the overall length dimension of the structure would accommodate entry and egress of hinged anatomical sites such as human elbows and knees; and conch shell designs with differently contoured internal spaces would fit and accommodate the recognized size and shape variations of the human female breast. All such structural variances are expected and intended, and thus are within the scope of the present invention.

It is noted also that the general outline and edge boundaries of the demarcated internal shimming space need not be necessarily round or circular as such. To the contrary, ovoid, elliptical, pancake-shaped, balloon-shaped, barrel-shaped, or bullet-shape cavities are expected and intended to be used. In addition, there is no requirement or necessity that the overall configuration of the demarcated internal shimming space be geometric, or regular, or symmetrical, or consistent, or uniform as such over its length and/or girth. Accordingly, when constructing any of the alternative embodiments of the present invention, any non-magnetic chamber having a demarcated internal shimming zone and at least one encompassing support surface upon which to dispose an array of surface pattern shim coils is deemed to be acceptable and suitable for use.

The Unique Value of the Cylinder-Like Chamber

A particular feature and substantial value of the present invention is the fact that the portable cylinder-like chamber is dimensioned and preferably contoured in advance to accommodate a specifically targeted Region of interest of a chosen subject within its demarcated internal shimming space, its limited examination zone. The true value and benefit of this attribute is clearly revealed and best demonstrated when the chosen subject is a living human being, and the targeted Region Of Interest is a particularly awkward anatomic site or portion of the human body.

A major advantage of the cylinder-like chamber and its demarcated internal shimming space is that it can be individually fabricated and sized to fit and accommodate any of the irregularly shaped or difficult to access anatomic sites existing in or on the human body; and thereby satisfy the recurring needs of many different in-vivo applications and alternative usages by being able to accept, house, and contain that awkward anatomic site. Given this highly desirable range and great variety of construction formats, the physician or clinician operationally can:

(i) Choose exactly what anatomic part(s) of the body is to be examined by magnetic resonance, e.g., the fingers or toes, the upper or lower limbs, the abdomen, the thoracic cavity, and the head; and/or (ii) Focus upon particular entities for magnetic resonance examination such as the dynamic systems (e.g., vascular, skeletal, nervous, lymphatic, endocrine, gastro-intestinal, and the like), or upon particular organs (e.g., brain, heart, stomach, intestine, pancreas, prostate, liver, etc.); and/or (iii) Identify specific tissues for magnetic resonance examination (e.g., certain muscles, bone, cartilage, skin, etc.).

Consequently, many desirable embodiments of the cylinder-like chamber will be markedly different in their overall bulk, in their length and girth dimensions, and in the size and volume of their demarcated internal shimming spaces. For these same reasons, the alternative constructs will vary greatly in their limited examination zones as to circumscribed internal space and contours. Nevertheless, each embodiment of the cylinder-like chamber will accommodate and be able to accept and retain the particular anatomical body parts for purposes of magnetic resonance examination.

Thus, one highly desirable embodiment of the cylinder-like chamber will be fashioned and sized to accept and hold the female breast, long recognized as being one of the most difficult anatomic sites for performing magnetic resonance examination. Another format and construction of the cylinder-like chamber will be alternatively sized to accommodate and contain the human hand, or wrist, or elbow—all of which are awkward and difficult to examination owing to their anatomic construction. Still other insert constructs will be dimensioned and configured to fit the human knee, or ankle, or toes; and still other formats will be configured to accommodate the human head, thorax, and abdomen. All of these human anatomic sites can now be examined by magnetic resonance after constructing the cylinder-like chamber appropriately to meet that use circumstance.

V. The Operative Arrays of Shim Coils

Clearly, in order that the in-bore shim coil insert be operative and functional to achieve its intended purposes, it is critical to have exact and precise knowledge of the spatial location for the non-homogeneous magnetic field errors and distortions (i.e., the inhomogeneities) existing within the main magnetic ($B_0$) field. These spatial locations are preferably identified by spherical polar coordinate positions rather than be expressed as linear Cartesian coordinate positions.

In order to correct those individual field inhomogeneities over the $B_z$ vector component of the main magnetic ($B_0$) field then present within the demarcated internal shimming space, the individual arrays of azimuth symmetrical surface shim coils must provide a series of carefully contoured and sized supplementary magnetic gradients, each of which is directed to one of these differing specified spherical polar coordinate positions.

The series of supplementary magnetic fields, which are individually generated and applied in accordance for correction of a mathematically calculated field term, will each have a magnetic field strength equal to, but opposite in charge to, that particular inhomogeneity then present over the $B_z$ vector component of the main magnetic ($B_0$) field in the limited examination zone. By super-positioning (i.e., overlying and superimposing) these two opposite magnetic fields at each specified spherical polar coordinate position, that applied supplementary magnetic field will effectively neutralize and cancel that particular magnetic distortion at that specified spherical polar coordinate position within the demarcated internal shimming space.

The appropriate azimuthal symmetry families and field terms which define the spatial outline and contours of each inhomogeneity (and thus its corresponding supplemental magnetic gradient) have been individually listed and identified by Table 1 above.

Accordingly, for purposes of constructing an in-bore shim coil insert in accordance with the present invention, each embodiment must include a plurality of discrete surface pattern shim coils which are collectively exist as a prepared array. Each surface pattern shim coil in the individual array will function:

(i) To create a controlled supplemental magnetic gradient that is which is mathematically defined by a correcting field term and is spatially shaped and sized for the correction of a specific magnetic field distortion; and (ii) To deliver the spatially shaped and sized supplemental magnetic gradient to a spherical polar coordinate position $(r,\theta,\Phi)$ over the $B_z$ vector component of the main magnetic ($B_0$) field; and (iii) To superimpose the spatially shaped and sized supplemental magnetic field upon and over that high degree distortion present within the $B_z$ vector component of the main magnetic ($B_0$) field; and (iv) To neutralize and cancel that high degree distortion then existing at a spherical polar coordinate position $(r,\theta,\Phi)$ for the $B_z$ vector component of the main magnetic ($B_0$) field.

The Surface Patterns of the Shim Coils

The surface pattern shim coils constituting the discrete array are not conventional electric wire windings on a support bar or rod as such, but instead are formed as relatively thin strips (or alternatively as solid bands, bars, ribbons, beads, threads, or slabs) of electrically conductive material which are arranged in pre-chosen patterns, outlines, and orientations. Each discrete surface pattern shim coil is individually able to produce on-demand a supplemental magnetic field gradient having a particular field strength, size, and spatial configuration in accordance with the parameters delineated by its correcting field function; and is effective to neutralize and cancel a magnetic inhomogeneity then present at a specified spherical polar coordinate position $(r,\theta,\Phi)$ over the $B_z$ vector component of the main magnetic ($B_0$) field.

Preferably, the discrete surface patterns of the shim coil are formed by etching an electrically conductive metal (such as copper) or a metallic alloy (such as silver and copper), using flexible printed circuit board ("flex circuit") technology. An exemplary and representative description of a rectangularly shaped surface pattern shim coil formed of copper strips is presented by the data of Table 2 below.

TABLE 2

| Description | Thickness [inch] | |
| --- | --- | --- |
| | Start | Final |
| Plating Layer | 0.0022 | 0.012 |
| 7 oz. Copper | 0.0098 | |
| Adhesive/Kapton/Adhesive Dupont Bond Ply LF0111 | 0.0030 | 0.003 |
| 7 oz. Copper | 0.0098 | 0.012 |
| Plating Layer | 0.0022 | |
| Adhesive/Kapton Dupont Coverlay LF0210 | 0.0030 | 0.003 |
| Final Sheet Thickness [inch] | | 0.030 |

The more preferred shim coil surface patterns are fabricated using a double layer flex circuit board. For merely illustrative purposes, one representative stack-up of a desirable flex circuit board is given by Table 3 below and are illustrated by FIGS. 2-12 respectively.

TABLE 3

| Shim | | | Thickness* | Diameter | |
| --- | --- | --- | --- | --- | --- |
| Layer | Channel | Material | [inch] | [inch] | [mm] |
| | Shim Bobbin ID | | | 14.000 | 355.600 |
| | Shim Bobbin Root | | 0.313 | 14.625 | 371.475 |
| 1 | C4, ZC4 | Flex Circuit | 0.033 | 14.691 | 373.151 |
| 2 | S4, ZS4 | Flex Circuit | 0.033 | 14.757 | 374.828 |
| 3 | Z2C2 | Flex Circuit | 0.033 | 14.823 | 376.504 |
| 4 | Z2S2 | Flex Circuit | 0.033 | 14.889 | 378.181 |
| 5 | Z3X | Flex Circuit | 0.033 | 14.955 | 379.857 |
| 6 | Z3Y | Flex Circuit | 0.033 | 15.021 | 381.533 |
| 7 | ZC3 | Flex Circuit | 0.033 | 15.087 | 383.210 |
| 8 | ZS3 | Flex Circuit | 0.033 | 15.153 | 384.886 |
| 9 | C5, ZC5 | Flex Circuit | 0.033 | 15.219 | 386.563 |
| 10 | S5, ZS5 | Flex Circuit | 0.033 | 15.285 | 388.239 |
| | Cooling | | 0.250 | 15.785 | 400.939 |

*Thickness of 0.033" flex circuit include 0.002" epoxy, 0.030" double layer flex circuit and 0.001" tolerance.

Figure 20:
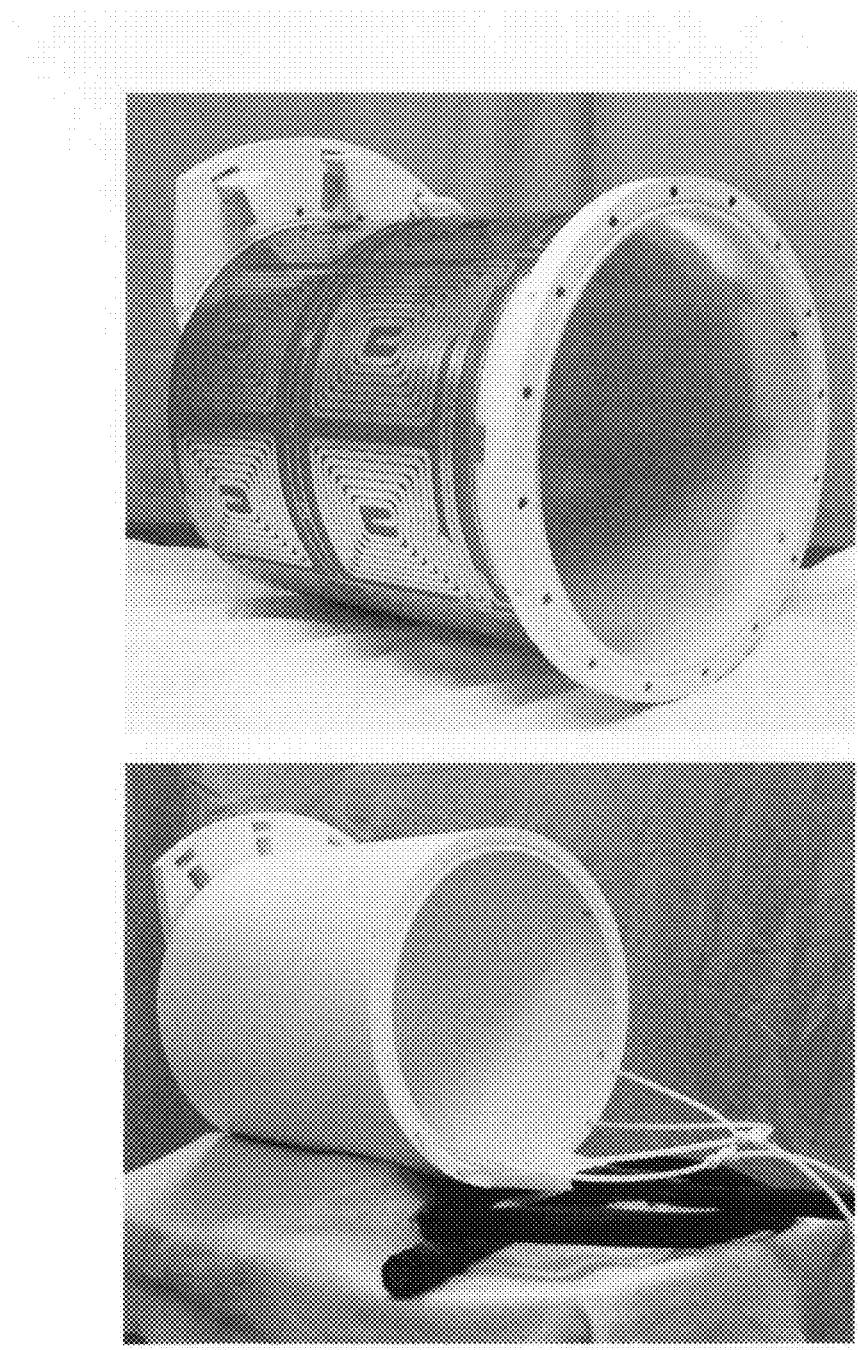
FIG. 20 illustrates a properly deployed array of rectangularly-shaped surface shim coils and their azimuthally symmetric positioning together a view of the fully assembled system.

In this representative example, 10 double layers of flex circuit are rolled onto and shaped into a cylinder-like form upon the external surface of a pre-formed plastic bobbin [see FIGS. 13, 14 and 15 respectively]. The bobbin is a preformed circularly-shaped support structure which has an annularly-shaped exterior surface upon which to dispose and arrange the double layers of flex circuit as rounded arrays of symmetrical and azimuth oriented, rectangularly-shaped surface shim coils, as shown by FIG. 20. More detail about the preformed annularly-shaped bobbin structure as well as other alternative ring-like support structures is given hereinafter.

Alternatives to Rectangularly-Shaped Shim Coils

It will be appreciated, however, that a rectangular pattern for a surface shim coil construct is merely one possible implementation of the surface organizational layout; and that there are many other available surface pattern configurations which will vary in symmetry, regularity, geometry, and cohesiveness; as well as some surface pattern progressions which are the pictorial result of sophisticated optimization algorithms.

Among the latter type are those oval and elliptical surface patterns collectively called "fingerprint designs", which are very desirable for use because they frequently provide surface patterns of optimized purity and power—in comparison to rectangular-shaped shim coils, in which the metallic conductors are of constant width and the applied conductor current density is therefore also constant.

Figure 17:
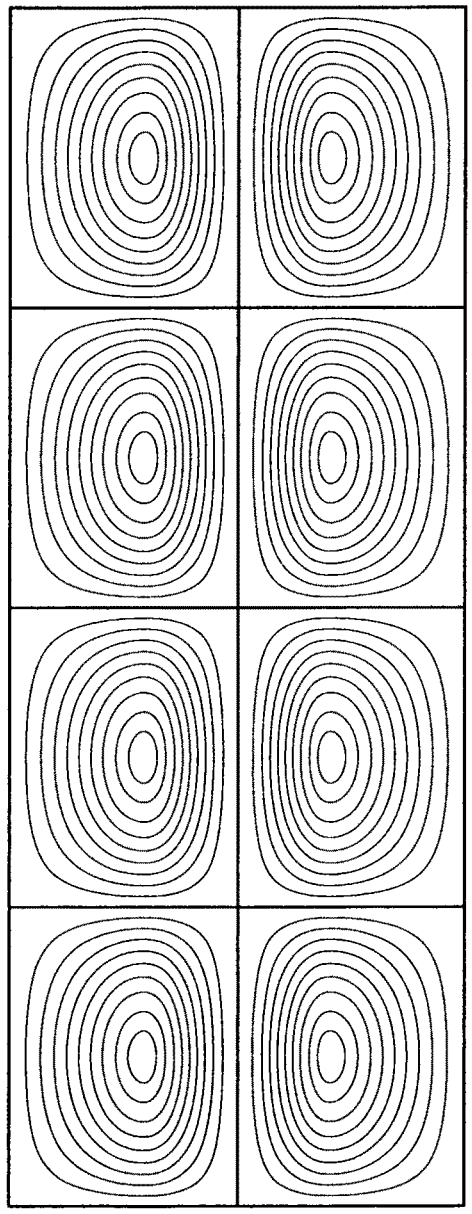
FIG. 17 illustrates a 'fingerprint' pattern for a surface shim coil.

For example, a more efficient surface pattern configuration that results in a smaller power consumption and a better purity of the desired spherical harmonic field contours can be obtained by using a so-called 'fingerprint' pattern for the surface shim coil, as illustrated by FIG. 17. In this example of the 'fingerprint' configured surface, the width of the current path varies in both the axial and azimuthal directions. By applying constrained optimization techniques in which power consumption is minimized while concurrently limiting the content of undesired harmonics, an appropriate distribution of current density to the 'fingerprint' shaped surface pattern can be made.

In addition, for the rectangular-shaped shim coils described previously, the transition from one turn to another occurs by means of a so-called joggle in what would otherwise be a straight section of the current path. Via FIG. 4, which illustrates the rectangular surface pattern for the coils, it can be seen that this joggle occurs in the conductor arcs that are farthest from the midplane.

Figure 18:
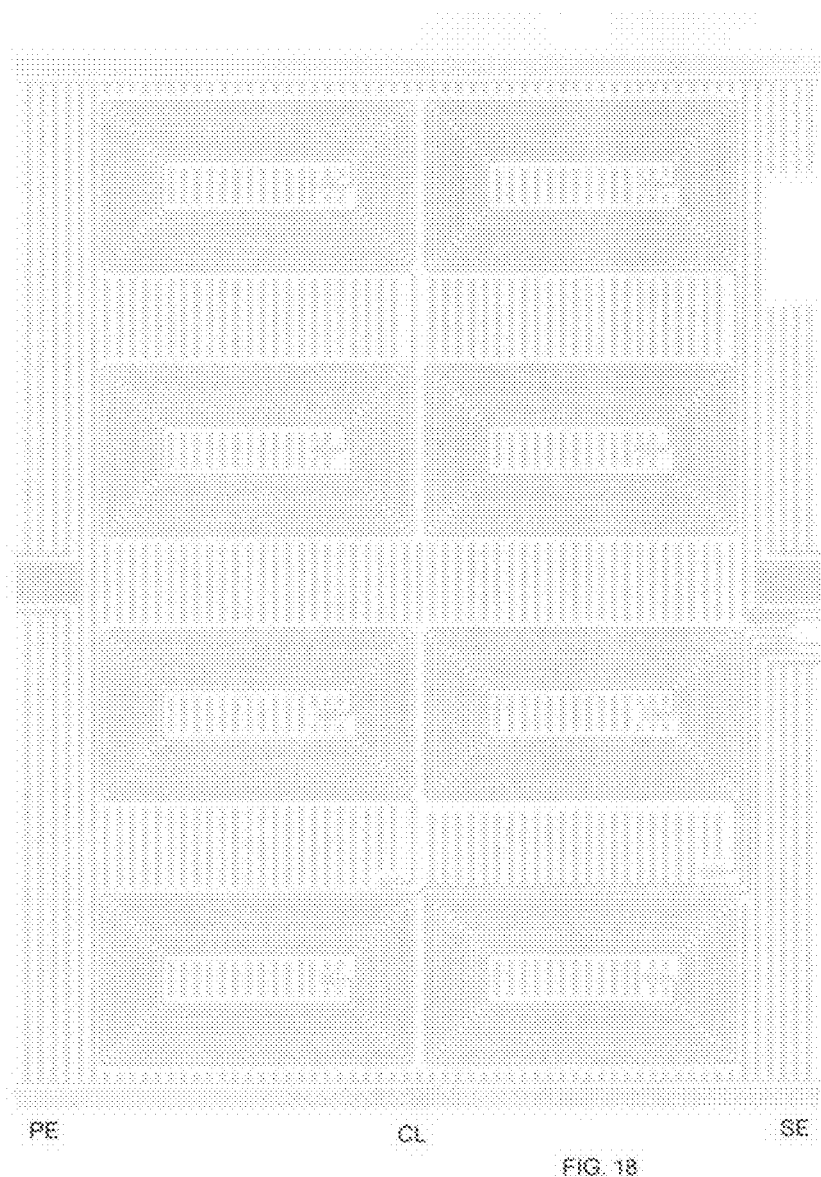
FIG. 18 illustrates an alternative spiral pattern for a surface shim coil.

In marked contradistinction, for the alternative spiral pattern shown by FIG. 18, this undesirable joggle is eliminated. Note that in such an alternative spiral pattern, all the current paths are straight and there are no joggles.

Azimuth Symmetrical Disposition

Note that a properly prepared shim coil insert requires a symmetrical disposition and an azimuth orientation for each individual array of surface pattern shim coils within the construct. One effective means for providing the requisite symmetrical deployment and azimuth orientation for the surface pattern shim coils is via the use of a preformed cylinder-like chamber, such as the bobbin structure illustrated by FIGS. 13-15 respectively.

As noted previously, a bobbin is a preformed open-ended spool having any desired range of differing inner and outer diameters; and is a ring-shaped and open ended support structure fashioned solely of one or more non-magnetic materials; and can be prepared in a variety of different breadth, girth, and cavity space dimensions. The outer wall (i.e., the external surface) of the bobbin is intentionally used as a solid support upon which to dispose one or more layers of flex circuit symmetrically and in an azimuth orientation (with respect to the origin or center of the cavity space in the bobbin); and the overall dimensions of the bobbin are chosen and fixed in advance to provide a limited examination zone suitable for accepting and holding the targeted Region Of Interest in a chosen subject over a determinable time interval.

An illustrative instance of the symmetrical deployment and azimuthal orientation of the flex circuit boards (identified by Table 4 below) is made upon the exterior surface of a pre-formed plastic bobbin having an inner diameter of 14.0 inches and an outer diameter of 14.625 inches. The individual layers of flex circuit board recited by Table 4 below are disposed symmetrically around and deployed in an azimuthal orientation upon the outer diameter surface of the bobbin structure.

The properly deployed array of rectangularly-shaped surface shim coils and their azimuthally symmetrical positioning is shown by FIG. 20. Thus, the deployed array of rectangularly-shaped surface shim coils are disposed in azimuthal symmetry and axial distribution upon a perimeter wall surface; and are able to provide multiple supplementary magnetic field gradients on-demand sufficient to cancel substantially at least some high order, high degree inhomogeneities of the $B_z$ vector component of the main magnetic ($B_0$) field then present within said demarcated internal shimming space of said cylinder-like chamber.

VI. The Complete Article of Manufacture

The complete shim coil insert is a single unified and integrated entity which can be manufactured in advance of use; can be stored in quantity and warehoused indefinitely; and after delivery to the prospective user, is immediately suitable for introduction into and sitting within the bore volume of an existing MRI magnet. A highly preferred example of a complete article of manufacture is shown in FIG. 20.

In every instance, the proper positioning for the complete shim coil insert is a purposeful disposition within the cavity volume of the MRI bore. Consequently, the prepared shim coil insert as a whole will be placed within the bore volume of the MRI magnet; and preferably be joined and secured to a material or article existing and present within the bore volume. Such placement can alternatively be either concentric or non-centric with respect to the bore configuration and dimensions; and any conventional mode of in-bore attachment and juncture may be employed so long as the securing materials do not influence or affect the magnetic field characteristics of the surrounding magnetic resonance assembly.

VII. An Exemplary Test Shim Coil Insert

A. In order to demonstrate the capabilities of high degree shim coils inserts, as well as to reveal the advantages and benefits of moderately high degree shimming ($3^{rd}$ degree corrections), higher degree shimming ($4^{th}$ and $5^{th}$ degree corrections), and of ultra-high degree shimming ($6^{th}$ degree and greater corrections) at a very high (~7 T-12 T) magnetic field strengths, an exemplary test model shim coil insert of 36/42 cm id/od was constructed (Resonance Research Inc.).

This exemplary test model shim coil insert initially contained surface pattern shim coils arrays capable of producing multiple supplemental magnetic fields contoured for positioning in accordance with the correcting field functions for the MATRIX designed C4, S4, ZC4, and ZS4. Subsequently, an additional array of 10 higher degree surface shim coils were added to the insert which were able to correct other inhomogeneities defined by the correcting field functions specifying the range from the Z3X, Z3Y serial to C5/ZC5, S5/ZS5 matrices. The resulting combination of individual shim coil arrays in the construct thus is sufficient to correct and cancel most of the $4^{th}$ degree and some $5^{th}$ and $6^{th}$ degree distortions (inhomogeneities) effectively.

Table 3 above provides a listing of all the high degree shim coils arrays ultimately used as a complete set for the test model construct. The fully constituted test model shim coil insert used a 5 ampere range adjustable current source or power supply (Resonance Research Inc.).

B. Please note that the stated choice of correcting field functions (delineating supplemental magnetic fields produced by the discrete arrays of shim coils in the test model coil insert construction) is based on the symmetry of the $B_0$ inhomogeneity remaining after $3^{rd}$ degree shimming corrections have been performed. Thus, at a minimum, most (if not all) of the $4^{th}$ degree distortions are precisely identified and recited by their correcting field functions, and these degrees of inhomogeneity can be effectively cancelled via the creation and superimposition of an opposite and appropriately shaped and sized supplemental magnetic field.

In addition, in certain alternative formats, a complete shim coil insert construction will comprise not only individual arrays of surface pattern shim coils functionally able to correct $4^{th}$ degree field impurities, but also will include an individual array able to cancel at least some $5^{th}$ and $6^{th}$ degree inhomogeneities then present within the three-dimensional magnetic field generated by the primary MRI magnet. Furthermore, because so many conventional magnetic resonance imaging assemblies are presently operative to correct only $1^{st}$ and $2^{nd}$ degree magnetic field inhomogeneities, it is frequently desirable as well to include within the insert construction at least one additional discrete array of surface pattern shim coils able to correct $3^{rd}$ degree distortions of magnetic field.

C. In the test model shim coil insert construction described herein, an interconnection scheme was developed for the C4, ZC4 matrix shims. A schematic of the top and bottom layers of the double-layer C4, ZC4 shims is shown respectively by FIGS. 2A and 2B. Because the large circumferential size of the shim pattern exceeds the maximum size that can be fabricated, two identical sheets each spanning 180 degrees, with interconnections between sheets, are used to cover the whole circumference.

Figure 2B:
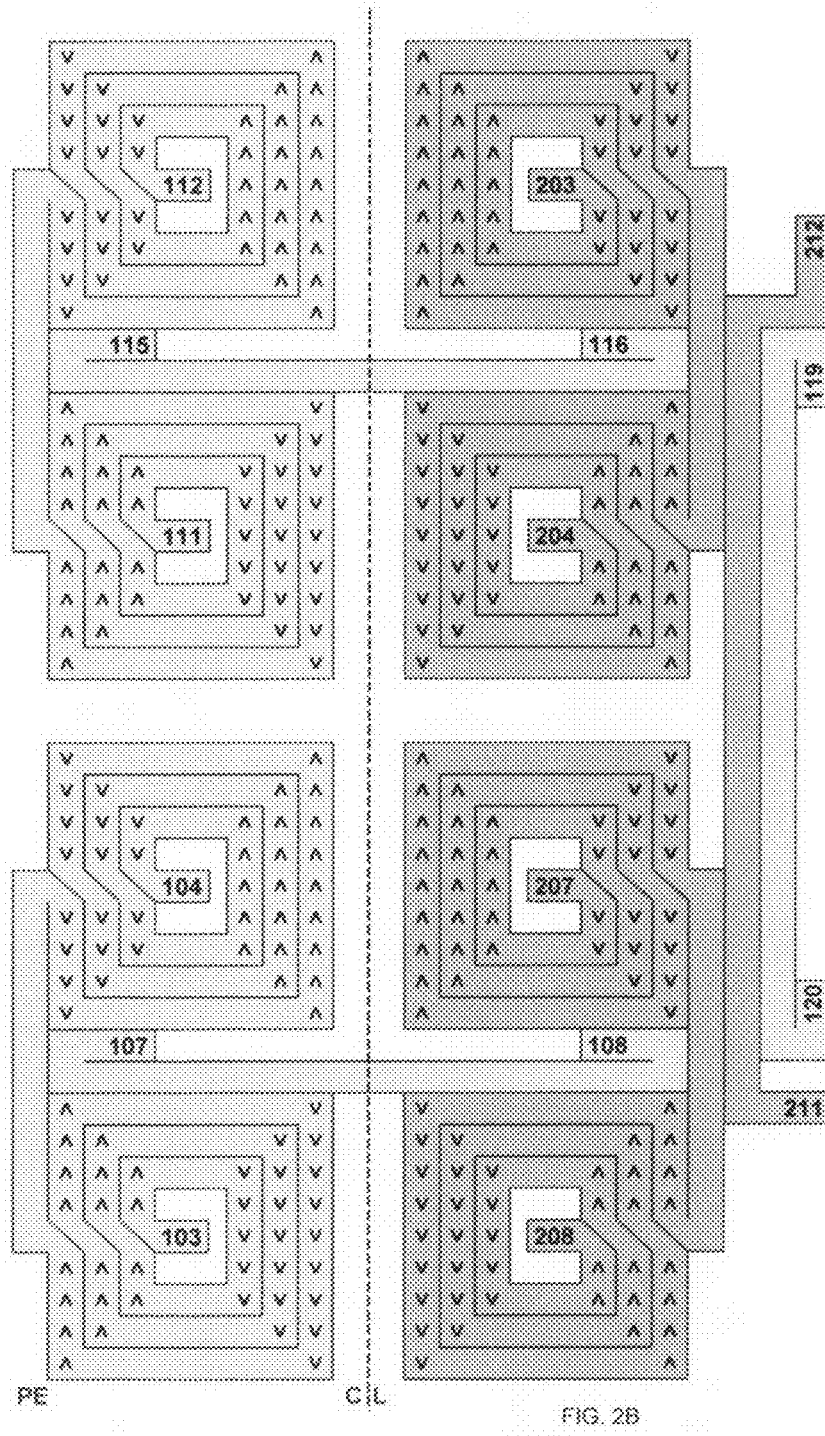

The matrix shim shown by FIGS. 2A and 2B is achieved using two modules. Module 1 covers the patient end ("PE") to center line ("CL") or isocenter. Module 2 covers the CL to service end ("SE"). Two power supplies are used to independently control the current flowing in each of the two modules. Thus two identical double-layered shim sheets are used to complete the C4, ZC4 matrix shim. This double layer constitutes the first double layer of the high degree shim set. The S4, ZS4 matrix shim is identical in every respect to the C4, ZC4 matrix shim but is rotated by 22.5 degrees with respect to the C4, ZC4 matrix shim. The S4, ZS4 matrix shim is mounted immediately outside of the C4, ZC4 matrix shim and thus constitutes the second double layer of the high degree shim set.

The conductor path of module 1 starts at terminal 101, goes through the rectangular coils, and ends at terminal 122. Tabs 102 to 121 are provided for vias to interconnect the top and bottom layers. Arrow heads show the current direction in the arcs. Zigzag paths are used for turn-to-turn transitions at the patient end and service end to maintain the rectangular shape of the coil near the isocenter. This rectangular shape cannot be maintained in a design in which the turns have a spiral pattern. All interconnection paths except those near the terminals have current cancellation between top and bottom layers leaving only the rectangular coils to have a net contribution.

Similarly, the conductor path of module 2 starts at terminal 201 and ends at terminal 214 with vias tabs 202 to 213.

One extra conductor width is needed at the patient end for interconnecting coils; and two conductor widths are needed for the returns. With this in mind, and with the maximum half length from isocenter to patient end being 180 mm, the matrix shim was designed using the parameters listed in Table 4 below.

TABLE 4

| | Module | | |
|---|---|---|---|
| Description | 1 [inch] | 1 [mm] | 2 [mm] |
| Conductor Width | 0.276 | 7.000 | 7.000 |
| Conductor Spacing | 0.023 | 0.584 | 0.584 |
| Conductor Thickness | 0.012 | 0.305 | 0.305 |
| Substrate Thickness | 0.003 | 0.076 | 0.076 |
| Design Radius | | 186.626 | 186.626 |
| Pattern Gap | | 15.753 | 15.753 |
| Turns per Arc per Side | | 7 | 7 |
| Upper Arc Z Position | | 136.163 | −47.500 |
| Lower Arc Z Position | | 47.500 | −136.163 |

Figure 3:
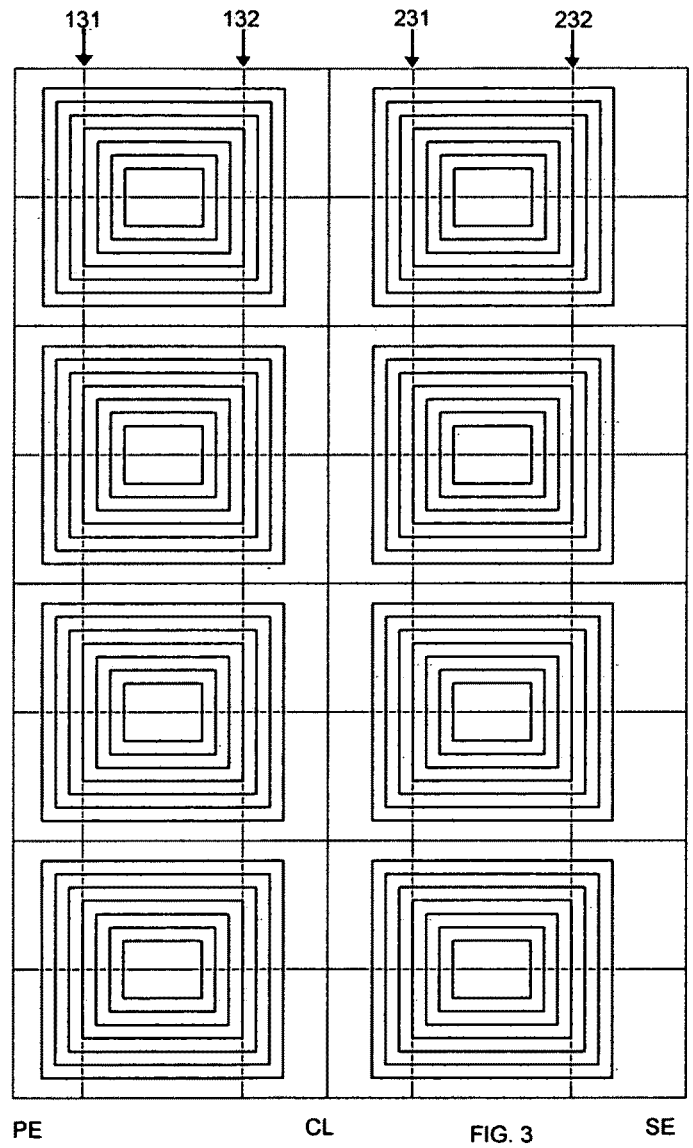
FIG. 3 shows a line drawing of conductor centers for the rectangular shaped surface coils of the matrix shim in a CAD data file format generated by the input parameters.

A line drawing of conductor centers of the rectangular coils for the matrix shim in a CAD data file format is generated by means of the input parameters and is shown in FIG. 3. Upper arc z position 131 and lower arc z position 132 are for module 1. Upper arc z position 231 and lower arc z position arc z position 232 are for module 2.

Figure 4B:
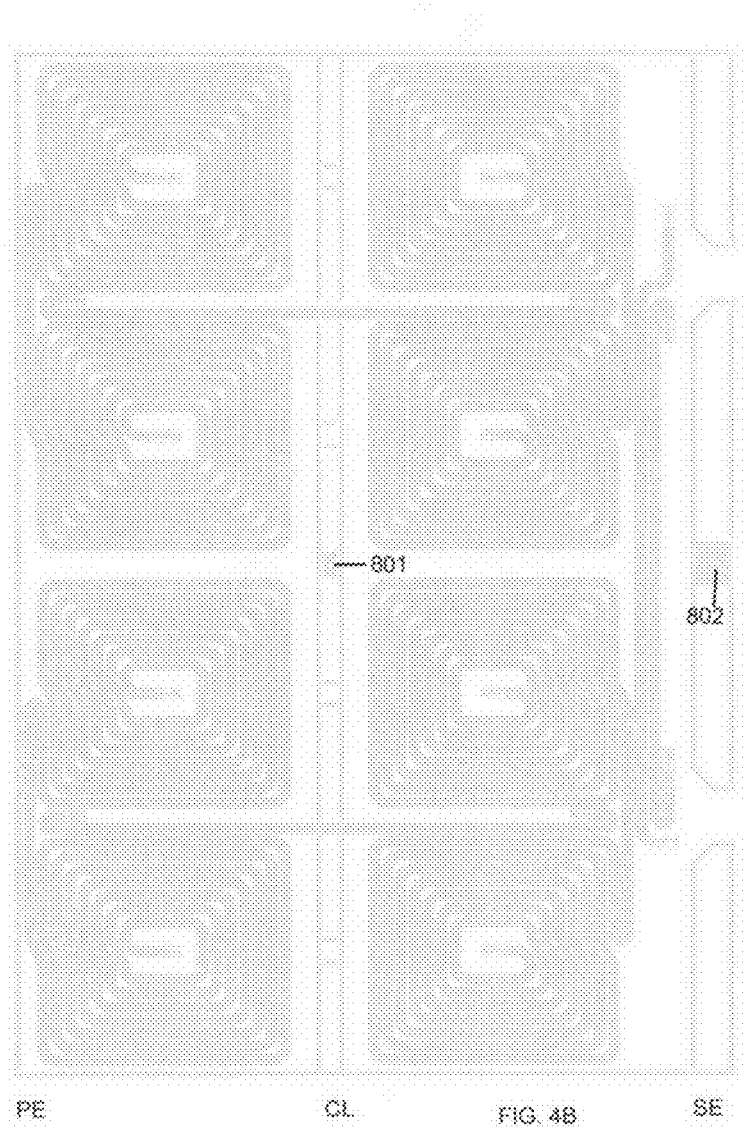

Following the interconnection scheme (see FIGS. 2A and 2B), the line drawing is post-processed to produce a final shim sheet pattern by adding returns, vias and pin holes 801 and 802 for mounting. The final shim pattern is shown by FIGS. 4A and 4B, and appears in a CAD data file format which is then submitted to the flex circuit manufacturer for fabrication. Terminals 101A and 122A are for module 1 (CL to PE). Terminals 201A and 214A are for module 2 (CL to SE).

Serial shims corresponding to correcting field functions Z2C2/Z2S2, Z3X/Z3Y and ZC3/ZS3, and matrix shims corresponding to correcting field functions C5, ZC5 and S5, ZS5, are fabricated in the same manner. Table 5 below lists the numbers used for interconnection schemes and final shim patterns.

TABLE 5

Figure 6A:
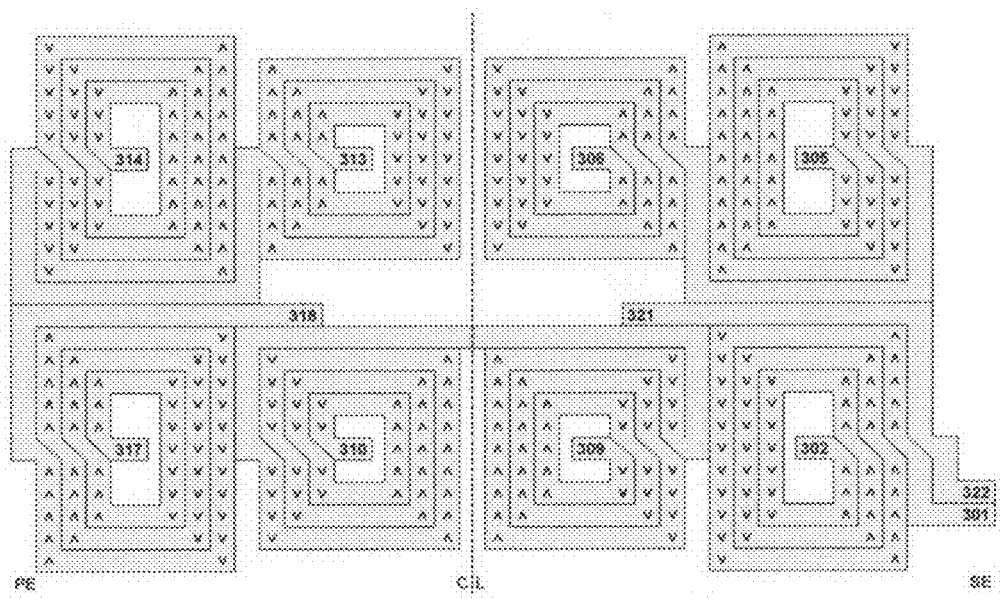
Figure 5B:
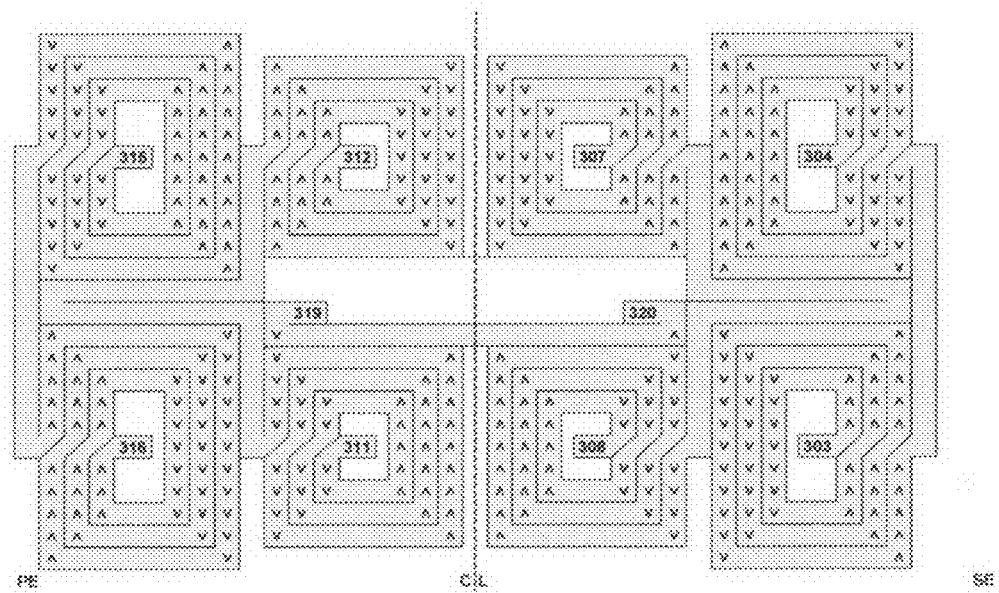
Figure 9A:
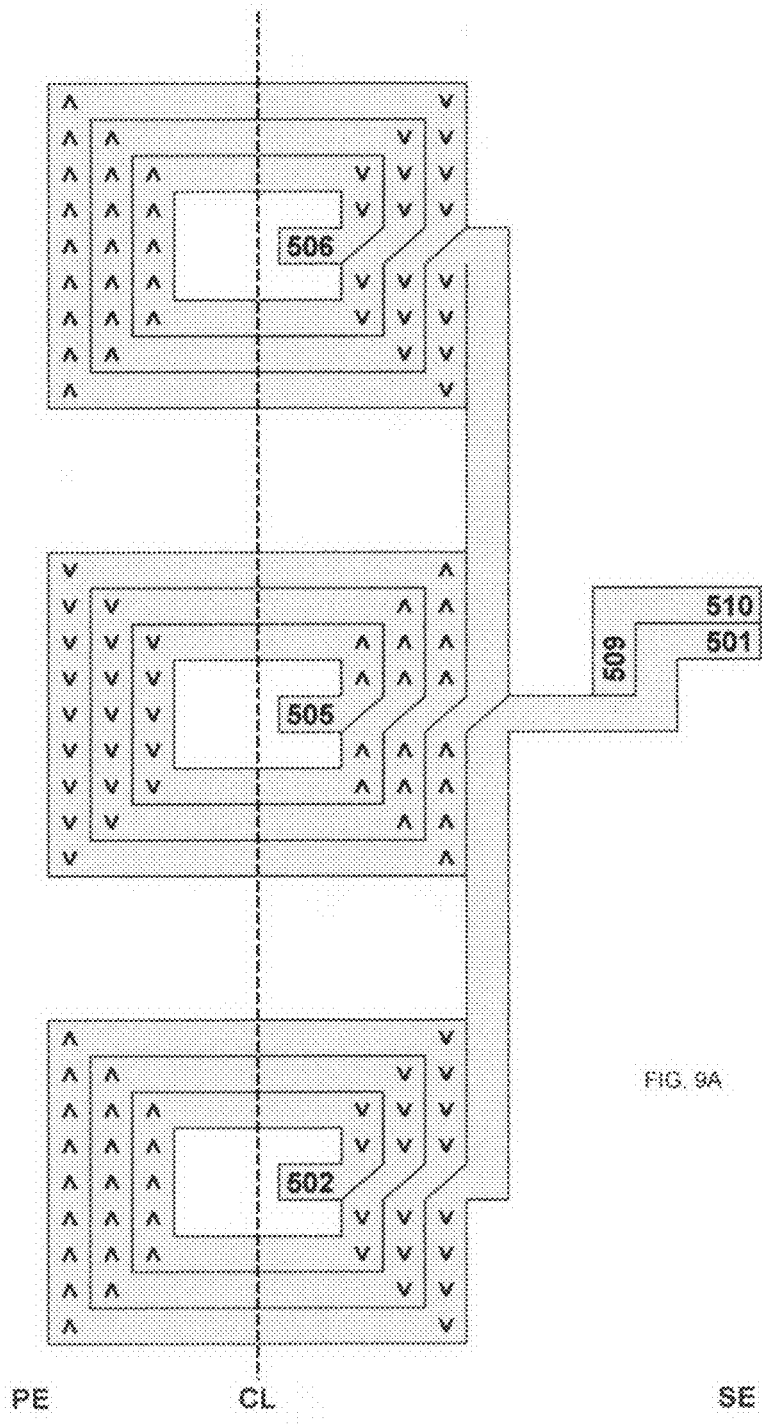
FIGS. 9A and 9B schematically illustrate the interconnection scheme for the matrix shims ZC3 and ZS3.
Figure 9B:
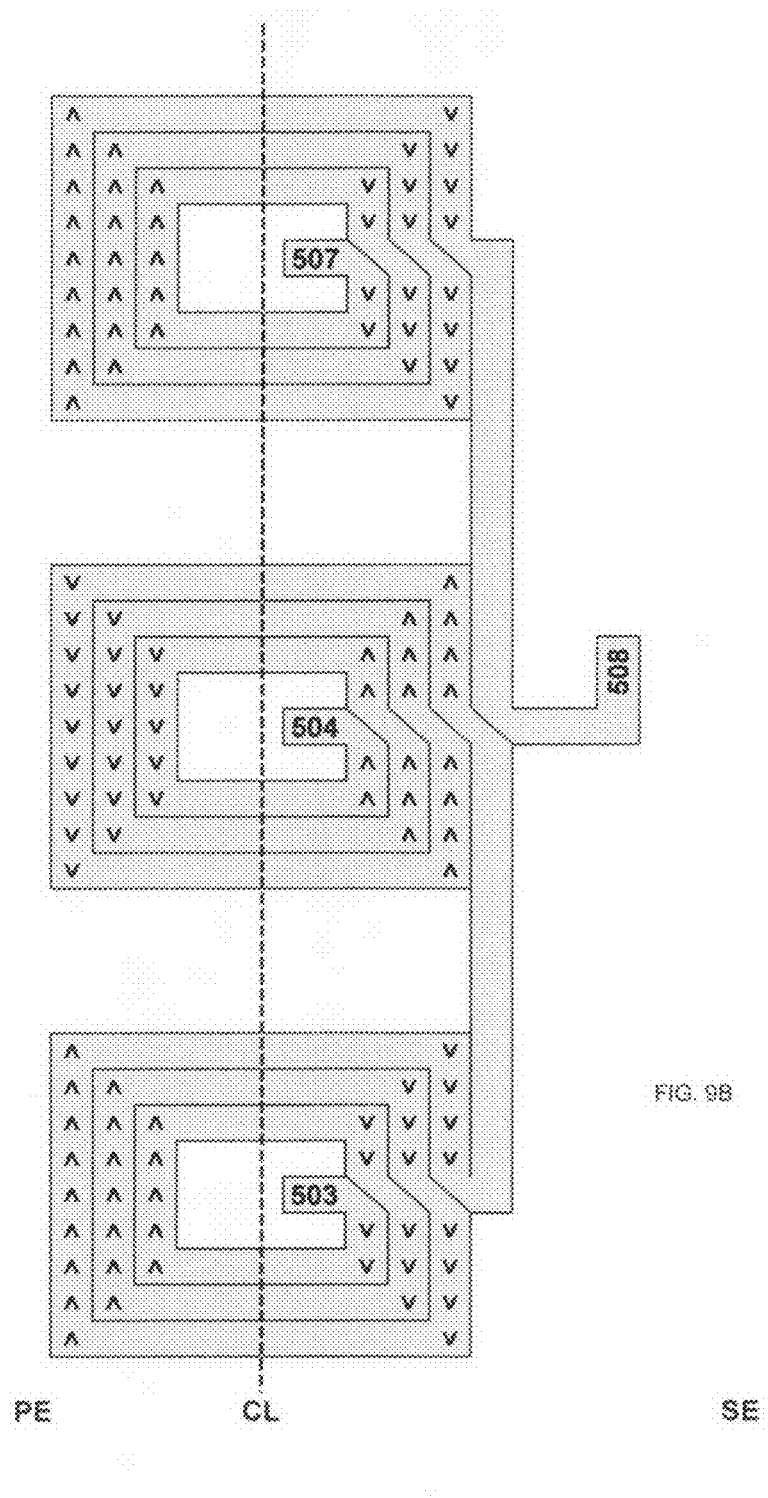
Figure 11A:
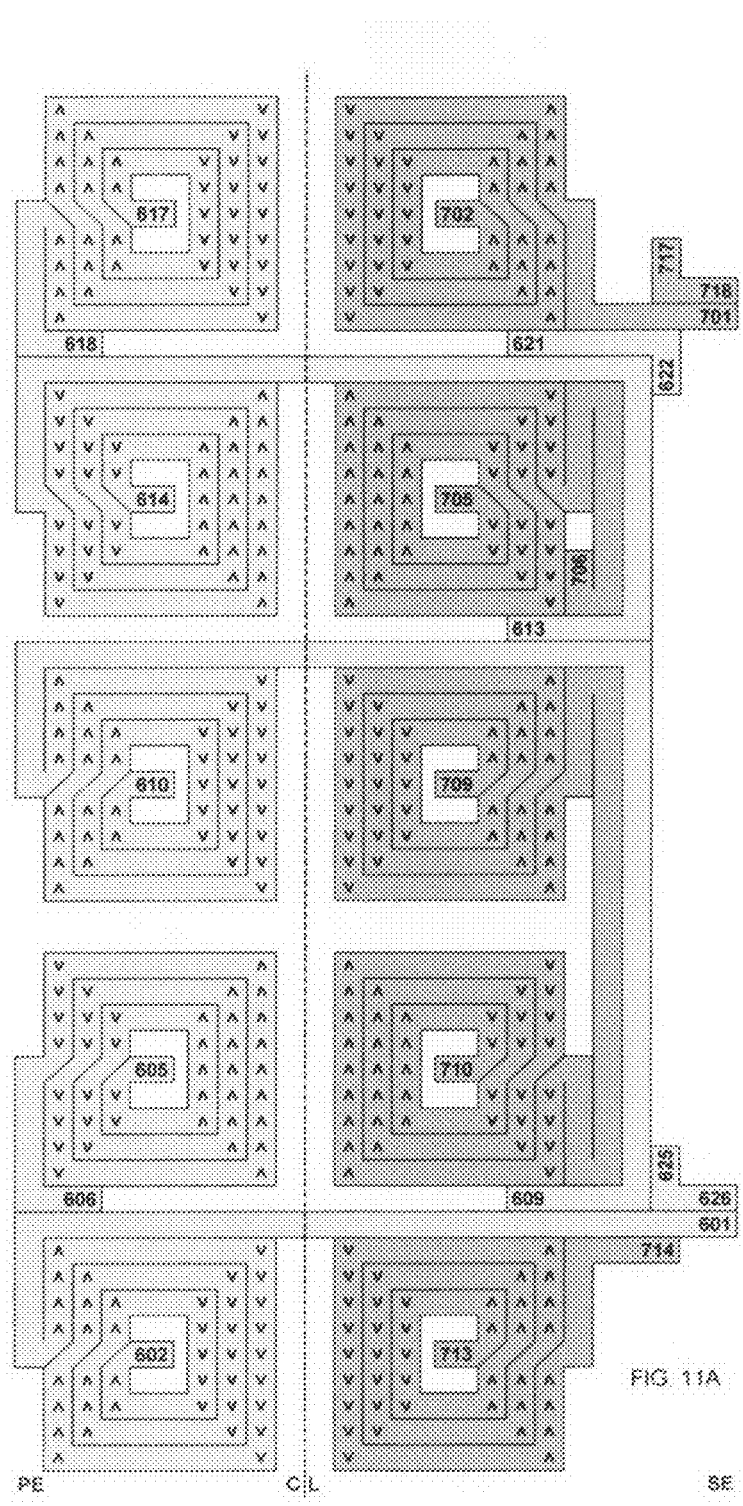
FIGS. 11A and 11B schematically illustrate the interconnection scheme for the matrix shims C5, ZC5, S5, and ZS5.
Figure 11B:
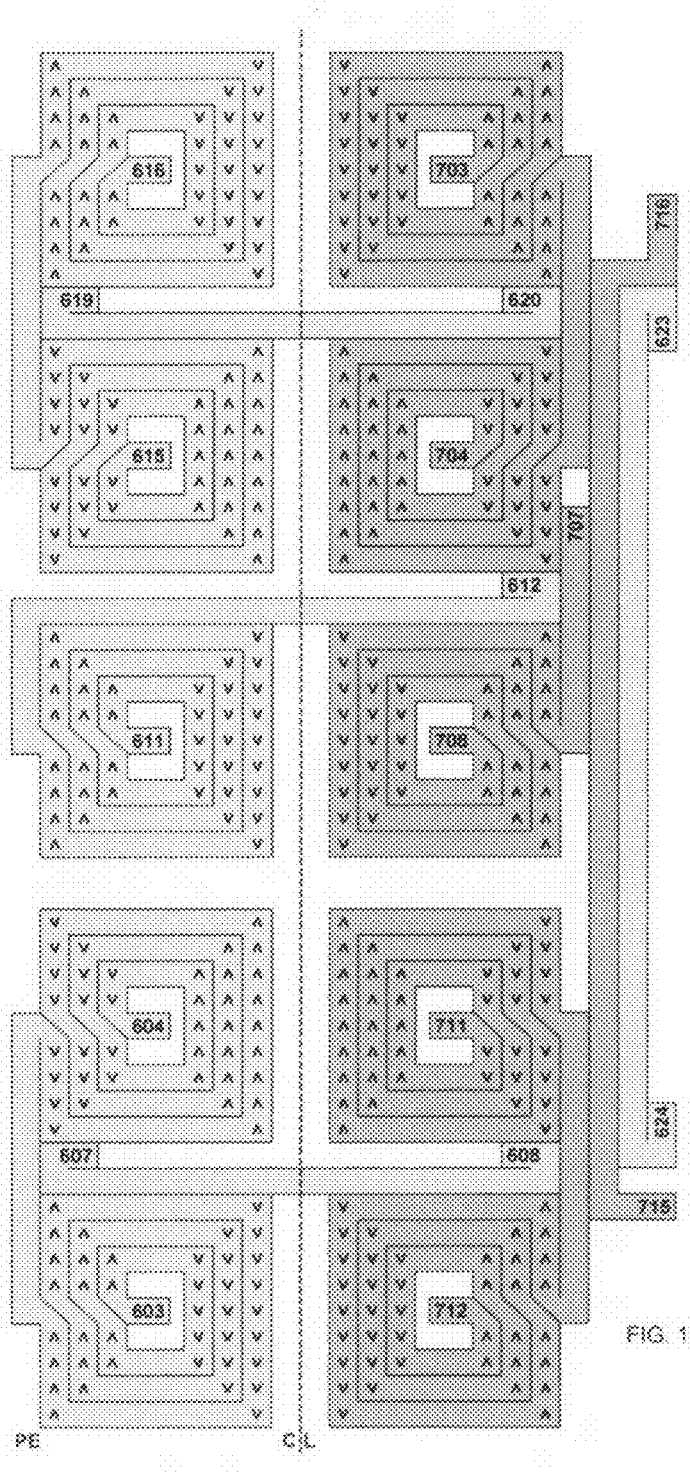
Figure 12B:
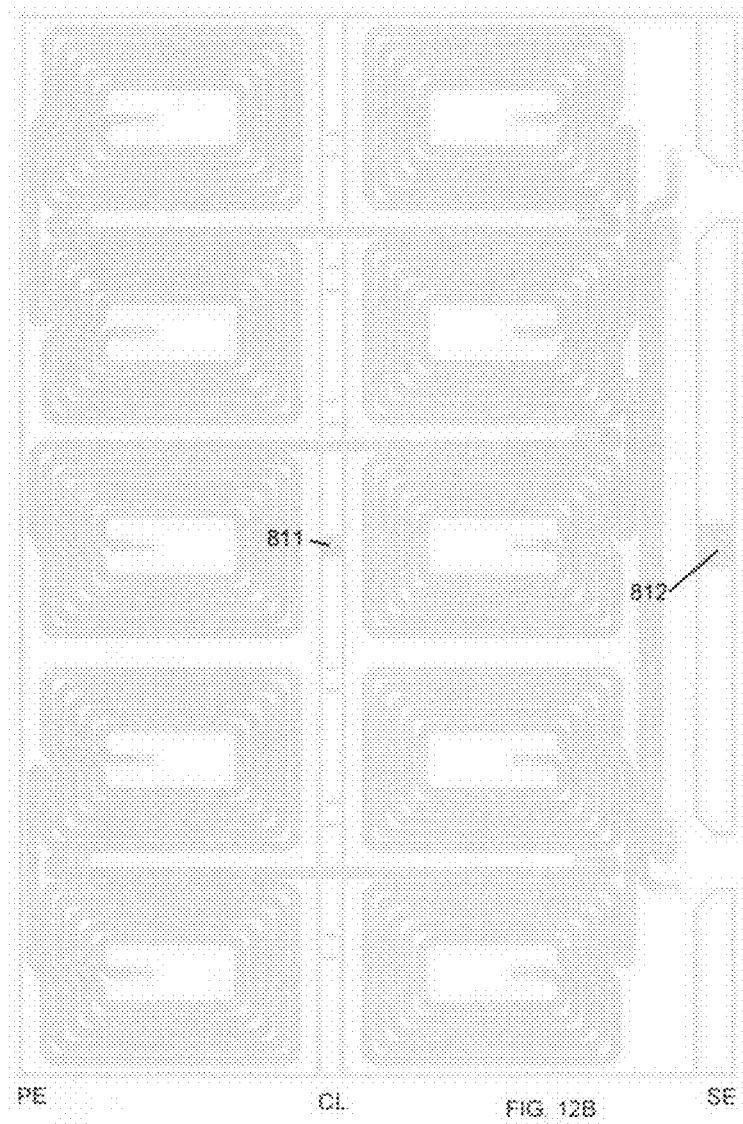

| Layer | Shim Channel | Interconnection Scheme | Final Shim Pattern |
|---|---|---|---|
| 1 | C4, ZC4 | FIGS. 2A & 2B | FIGS. 4A & 4B |
| 2 | S4, ZS4 | | |
| 3 | Z2C2 | FIGS. 5A & 5B | FIGS. 6A & 6B |
| 4 | Z2S2 | | |
| 5 | Z3X | FIGS. 7A & 7B | FIGS. 8A & 8B |
| 6 | Z3Y | | |
| 7 | ZC3 | FIGS. 9A & 9B | FIGS. 10A & 10B |
| 8 | ZS3 | | |
| 9 | C5, ZC5 | FIGS. 11A & 11B | FIGS. 12A & 12B |
| 10 | S5, ZS5 | | |

D. A properly prepared shim coil insert requires a symmetrical azimuthal disposition and arrangement for each individual array of surface pattern shim coils in the construct. One preferred means for creating the requisite symmetrical azimuthal disposition and orientation for each individual array of surface pattern shim coils is via the use of a bobbin.

Accordingly, as shown by FIG. 13, the fabricated shim coil sheets are rolled onto the external surface of a polypropylene bobbin 821 (in accordance with the stack-up of Table 3 above). Pin holes 801 to 812 are provided on the shim sheets.

Each shim sheet has a pair of pin holes except for those specifying the Z2C2/Z2S2 coordinate positions (see FIGS. 6A and 6B), which has two pairs of pin holes. The first pair of pin holes 803 and 804 is for correcting errors at the Z2S2 coordinates. The second pair of pin holes 805 and 806 is for correcting errors at the Z2C2 coordinates. The pin holes of individual sheets are aligned using a jig 826 with two pin holes 827 and 828 (see FIG. 14).

The mounting angles of the individual shim coil sheets upon the bobbin external surface are listed in Table 6 below, together with terminal numbers.

TABLE 6

| Shim Layer | Shim Channel | Mounting Angle [Degree] | Terminal Number | | | |
|---|---|---|---|---|---|---|
| 1 | C4, ZC4 | 67.5 | 101A | 122A | 201A | 214A |
| 1 | C4, ZC4 | 247.5 | 101B | 122B | 201B | 214B |
| 2 | S4, ZS4 | 90 | 101C | 122C | 201C | 214C |
| 2 | S4, ZS4 | 270 | 101D | 122D | 201D | 214D |
| 3 | Z2C2 | 0 | 301A | 322A | | |
| 3 | Z2C2 | 180 | 301B | 322B | | |
| 4 | Z2S2 | 90 | 301C | 322C | | |
| 4 | Z2S2 | 270 | 301D | 322D | | |
| 5 | Z3X | 90 | 401A | 406A | | |
| 5 | Z3X | 270 | 401B | 406B | | |
| 6 | Z3Y | 0 | 401C | 406C | | |
| 6 | Z3Y | 180 | 401D | 406D | | |
| 7 | ZC3 | 90 | 501A | 510A | | |
| 7 | ZC3 | 270 | 501B | 510B | | |
| 8 | ZS3 | 0 | 501C | 510C | | |
| 8 | ZS3 | 180 | 501D | 510D | | |
| 9 | C5, ZC5 | 90 | 601A | 626A | 701A | 718A |
| 9 | C5, ZC5 | 270 | 601B | 626B | 701B | 718B |
| 10 | S5, ZS5 | 0 | 601C | 626C | 701C | 718C |
| 10 | S5, ZS5 | 180 | 601D | 626D | 701D | 718D |

The terminal numbers are assigned by replacing index A by B, C or D as a new sheet is rolled on. Angles are defined as shown in FIG. 15. The mounting angles are assigned in such a way that the center of the arc of the cosine series aligns with the x-axis and that of the sine series is offset by i*90°/m where m is the shim order and i is an odd integer.

Figure 16:
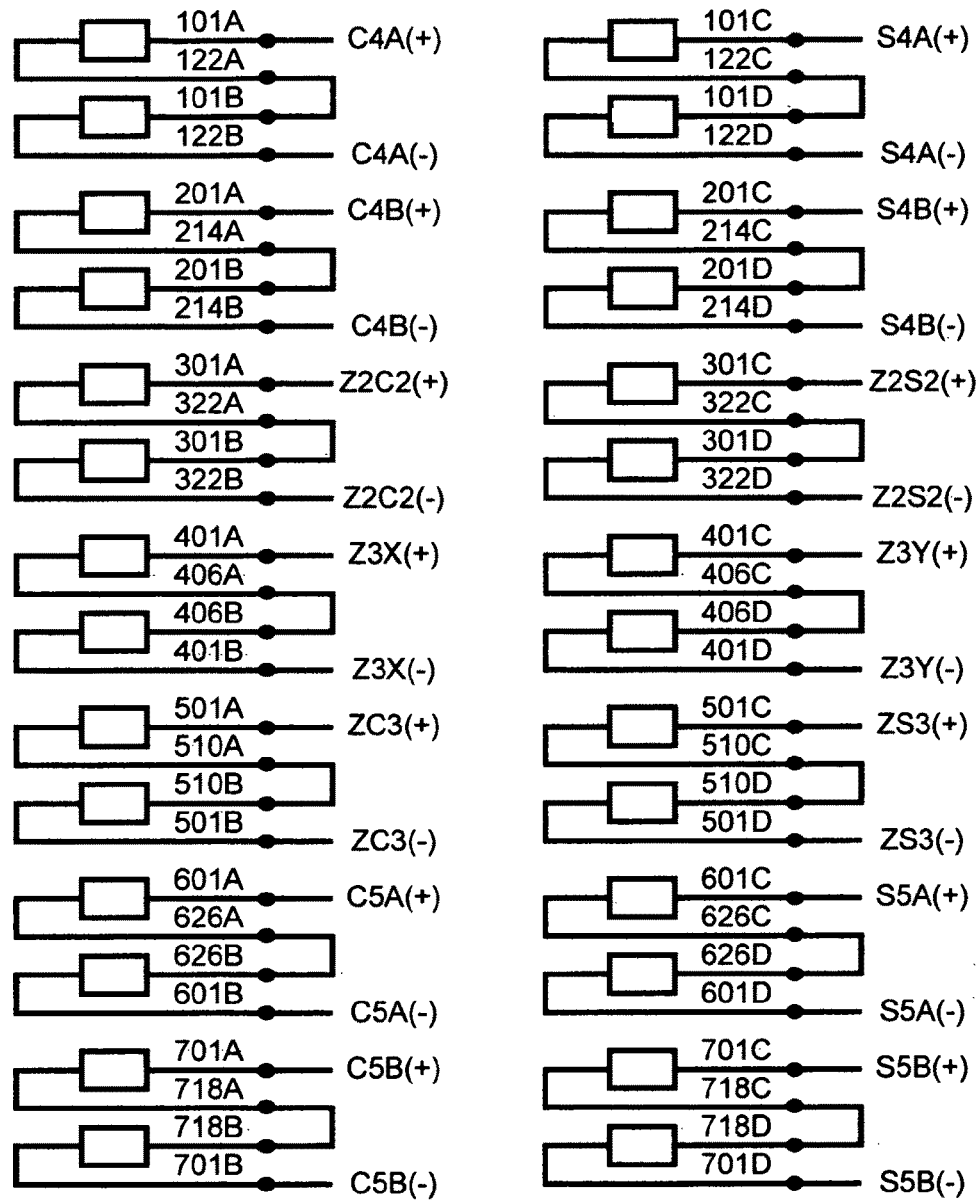
FIG. 16 illustrates a wiring scheme which interconnects two shim sheets, each of which covers half of the surface wall circumference.

Each layer consists of two shim sheets, each of which covers half of the circumference. As shown in FIG. 16, a wiring scheme is provided to interconnect the two halves with each rectangle represented as a shim sheet. Two plastic cooling tubes (0.25" OD) are then coiled on top of the shim sheets and temperature sensors are placed on various spots for temperature monitoring.

E. The completely prepared shim coil insert is illustrated as the single unified entity shown by FIG. 20; and appears as a fully integrated construct and discrete article of manufacture which is to be mounted in-bore and concentrically attached to the existing internal wall surface which delineates and encompasses the limited bore volume of the transceiver apparatus. [We should add at least one more pictorial view of the entire construct for improved clarity of understanding.]

For example, when using the test model shim coil insert illustrated by FIG. 20, three ferroshim slots are to be removed by hand at the time of attachment; and the empty slots are used by clamp 824 (see FIG. 13) to mount the bobbin via a flange support 823 to the patient end of the head transceiver bore. Six set screws are used to mount and align the bobbin in-bore via screw holes 825 of ring support 822 to the service end of the head transceiver bore. All mounting and aligning hardware is made out of plastic or any other available material that does not affect the magnetic field.

The test model shim coil insert is controlled by a 14 channel 5 A shim power supply (Resonance Research Inc.). The matrix C4 shim is generated by driving C4A and C4B in the same polarity. By driving in the opposing polarity, the matrix ZC4 shim is generated. The same mechanism of using similar and opposing polarity applies to the S4, ZS4, C5, ZC5, and S5, ZS5 shims. All other shims are serial shims and are driven by their own channels.

VII. Experiments and Empirical Data

To demonstrate the merits and value of the present invention, a series of planned experiments and empirical data are presented below. It will be expressly understood, however, that the experiments described and the results provided are merely the best evidence of the subject matter as a whole which is the invention; and that the empirical data, while limited in content, is only illustrative of the scope of the invention envisioned and claimed.

The Test Equipment

The shim coil insert used in the experiments described below is the representative test model shim coil insert of 36/42 cm id/od described in detail above and shown by FIG. 20. This test model shim coil insert initially contained a set of surface pattern shim coils arrays capable of producing multiple supplemental magnetic fields contoured for positioning in accordance with the correcting field functions for the MATRIX designed C4, S4, ZC4, and ZS4 coordinate locations. Subsequently, an additional array of 10 higher degree surface shim coils were added to the insert which able to correct other inhomogeneities defined by the correcting field functions in the range from the Z3X, Z3Y serial shims to the C5/ZC5, S5/ZS5 matrix shims.

The resulting combination of individual shim coil arrays in the construct thus is sufficient to correct and cancel most, if not all, of the $4^{th}$ and $5^{th}$ degree distortions (inhomogeneities) effectively. See Table 3 above for a listing of all the high degree shim coils arrays ultimately mounted as a set within the insert. The fully constituted test model shim coil insert used a 5 A power supply.

All empirical data were acquired using a Varian Direct Drive system and a head only (68 cm ID) actively shielded 7 T magnet. The gradient system (Varian Inc.) included all $2^{nd}$ and $3^{rd}$ degree shims, with each shim driven by two 10 A shim power supplies (Resonance Research Inc.).

Whole slice data signals were acquired from 60 living human subjects (20 subjects per region) from three different anatomic brain regions, the supplementary motor area (SMA), the thalamus and basal ganglia (SCN), and the hippocampus/medial temporal lobe (MTL).

Experimental Procedure

A non-iterative multi-slice $B_0$ mapping method was used to set all shim terms. The method uses an incremented evolution delay following a slice selective excitation pulse to encode the $B_0$ inhomogeneity present as phase in phase sensitive images. Five delays (0, 1, 2, 4 and 8 ms) were used to encode the inhomogeneity. Following reconstruction of the phase sensitive images and calculation of a $B_0$ map for each slice, optimal values for the desired shims were calculated by minimizing the sum of the squares of the predicted residual $B_0$ field after application of the shims. The shims were represented mathematically by Cartesian representations of their spatial dependencies (i.e. spherical harmonics). The predicted and measured global inhomogeneity (after shimming) over the target ROIs varied by less than 1 Hz for a single pass.

Global homogeneity, ($\sigma B_0$), was determined by calculating the standard deviation of the $B_0$ field over the selected ROI (see FIG. 23) for each subject and averaging the standard deviation of the $B_0$ fields across subjects.

Local homogeneity was evaluated by subdividing the ROI into ~1 cc "SI voxels" encompassing an array of 3×3×3 $B_0$ imaging pixels and then calculating the standard deviation ($\sigma B_0$ local) across each "SI voxel". The data across the ROIs of subjects was pooled and plotted as a function of the fraction of pixels achieving a given $\sigma B_0$.

Whole plane spectroscopic imaging data was acquired using a transceiver apparatus having one deployed array comprising 8 individual RF coils on a 7 T magnetic resonance system. An echo time of 15 ms was used with 24×24 encodes across a field of view of 192 mm×192 mm and a 10 mm slice thickness.

Empirical Observations and Results

Figure 23:
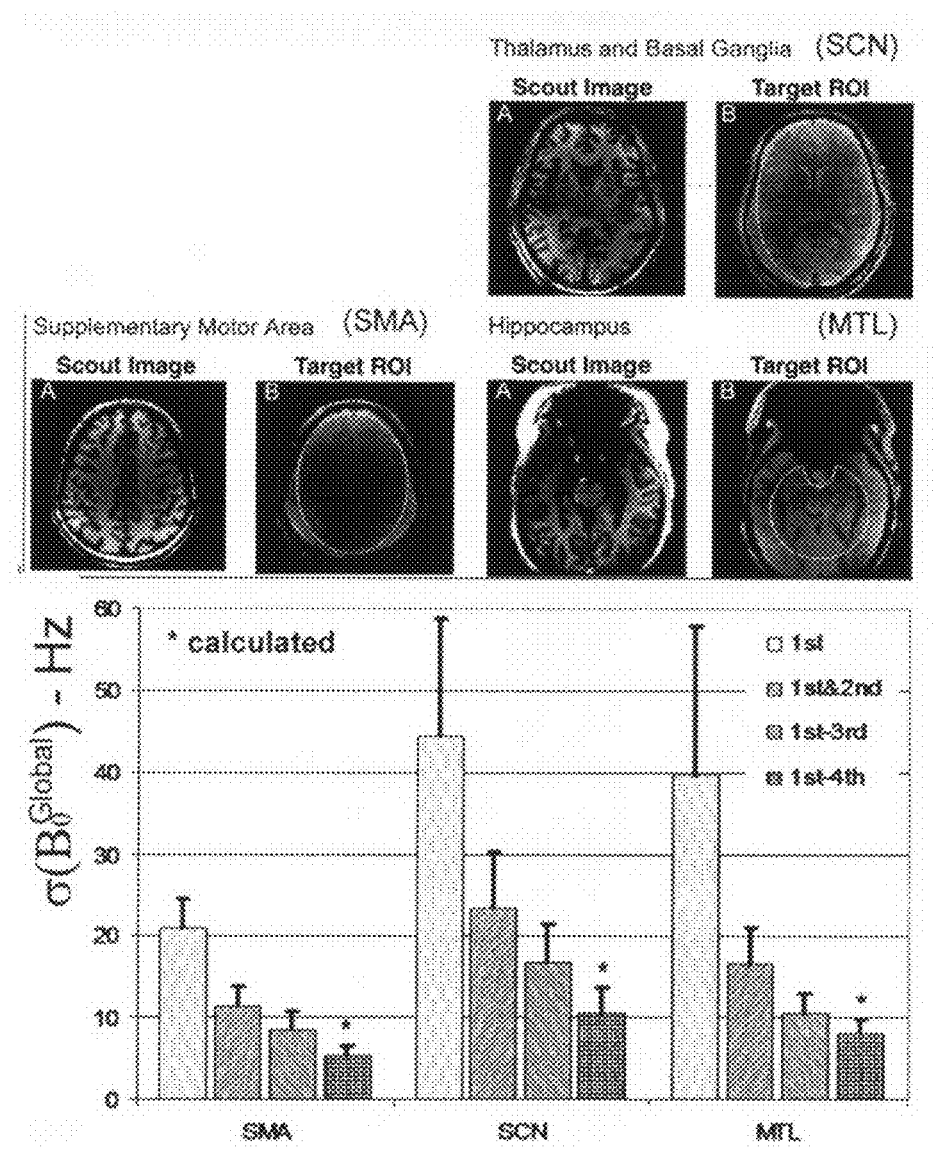
FIG. 23 shows representative ROIs for the three different anatomic brain regions, along with $\sigma B_0$ global achieved ($1^{st}$ to $3^{rd}$ degree shimming) and as calculated (all $1^{st}$ to $4^{th}$ degrees) for all 60 test subjects.

Displayed by FIG. 23 are representative ROIs for the three different anatomic brain regions, along with $\sigma B_0$ global achieved ($1^{st}$ to $3^{rd}$ degree shimming) and as calculated (all $1^{st}$ to $4^{th}$ degree) for the 60 subjects.

Figure 19:
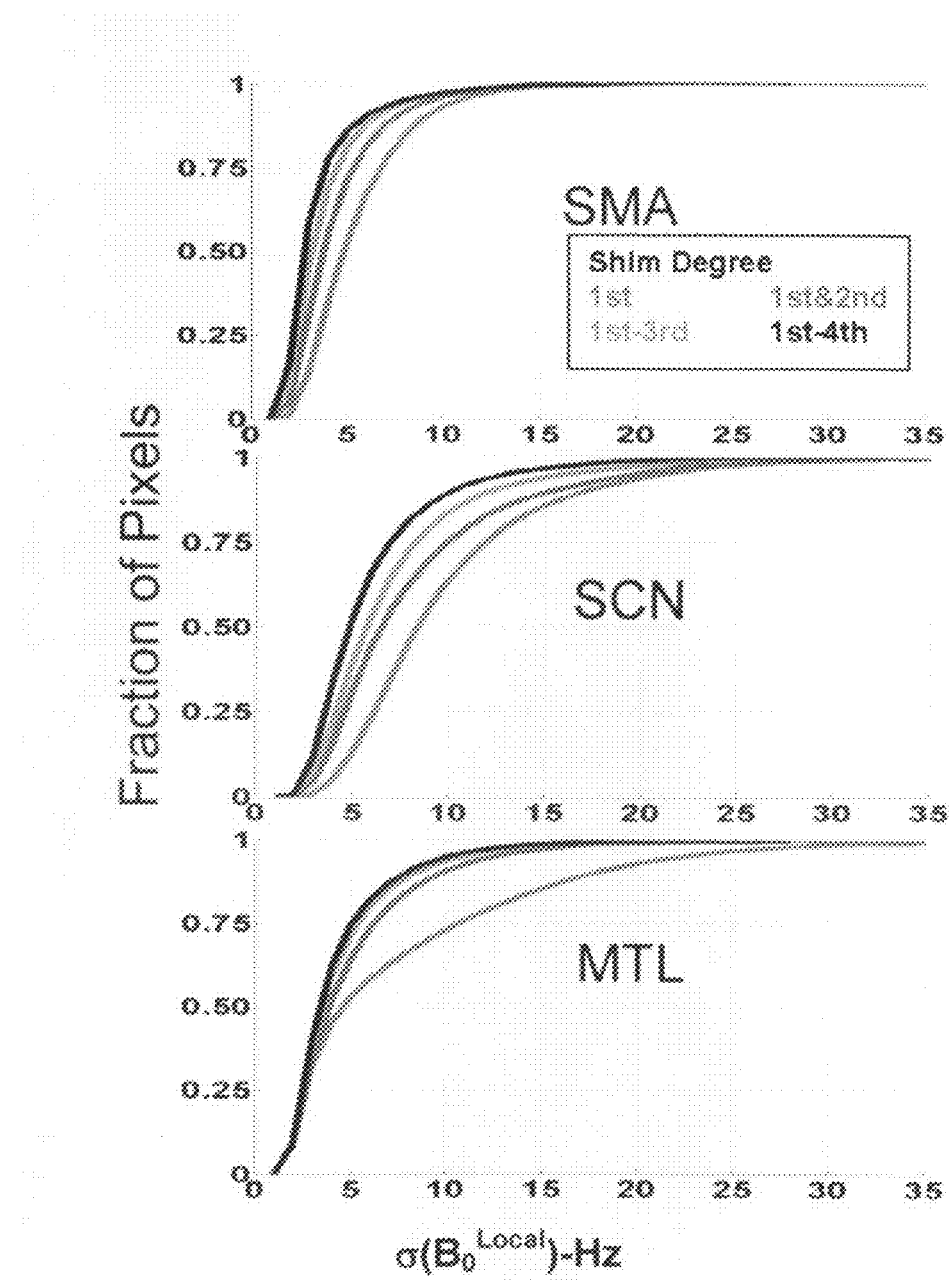
FIG. 19 shows plots of the local $\sigma B_0$, acquired from the supplementary motor area (SMA), the thalamus and basal ganglia (SCN), and the hippocampus/medial temporal lobe (MTL) using an MRI assembly operating at a magnetic field strength of 7 T with different degrees of shimming.

Also shown in FIG. 23, significant reductions of 38%, 37% and 24% in the global $\sigma B_0$ are achieved globally when $4^{th}$ degree shims are added to $3^{rd}$ degree shims in the SMA, SCN and MTL regions respectively. Similarly, plots of the local $\sigma B_0$, (seen in FIG. 19) show substantial improvements in $\sigma B_0^{local}$ for all three brain regions with higher degree shimming (red is $1^{st}$ degree only; blue is $1^{st}$ and $2^{nd}$ degrees; green is $1^{st}$ to $3^{rd}$ degrees; and black is $1^{st}$ to $4^{th}$ degrees). As shown therein, despite the small size of the voxel ~1 cc, significant residual $B_0$ inhomogeneity remains after $2^{nd}$ and even $3^{rd}$ degree shimming.

Figure 21:
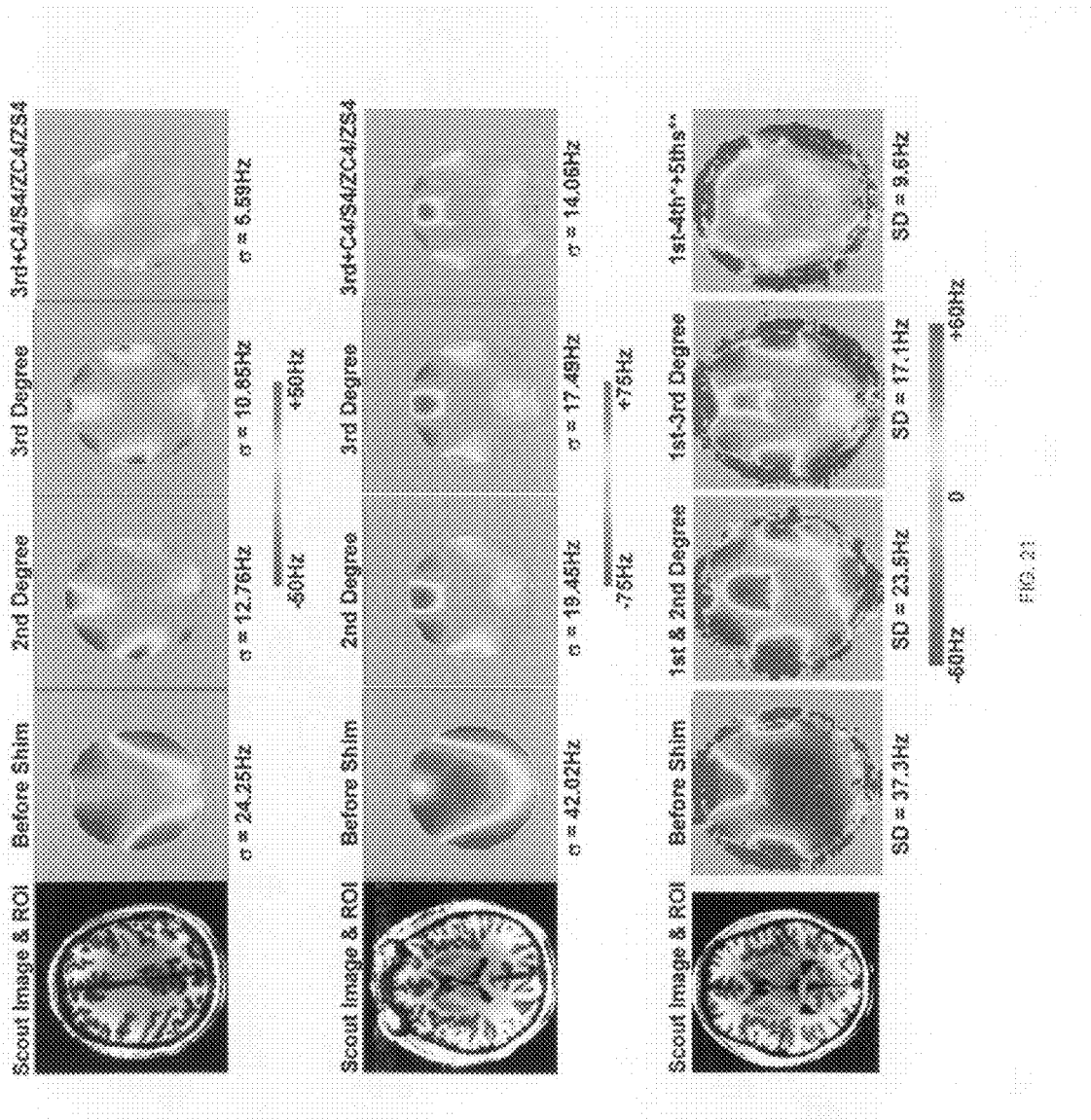
FIG. 21 shows a scout image and $B_0$ maps acquired before shimming, and after shimming using $1^{st}$ and $2^{nd}$ degree shims, using $1^{st}$ to $3^{rd}$ degree shims, and using $1^{st}$ to $3^{rd}$ degree shims plus C4/S4 and ZC4/ZS4 shims using the test model shim coil insert.

Displayed in FIG. 21 are scout images of the brain of a volunteer at 7 T and the associated $B_0$ maps acquired before shimming, and after shimming using $1^{st}$ and $2^{nd}$ degree shims, using $1^{st}$ to $3^{rd}$ degree shims, and using $1^{st}$ to $3^{rd}$ degree shims plus C4/S4 and ZC4/ZS4 shims. The images were acquired using the test model shim coil insert. The standard deviation of the $B_0$ field over the slice is listed each $B_0$ map.

Figure 22:
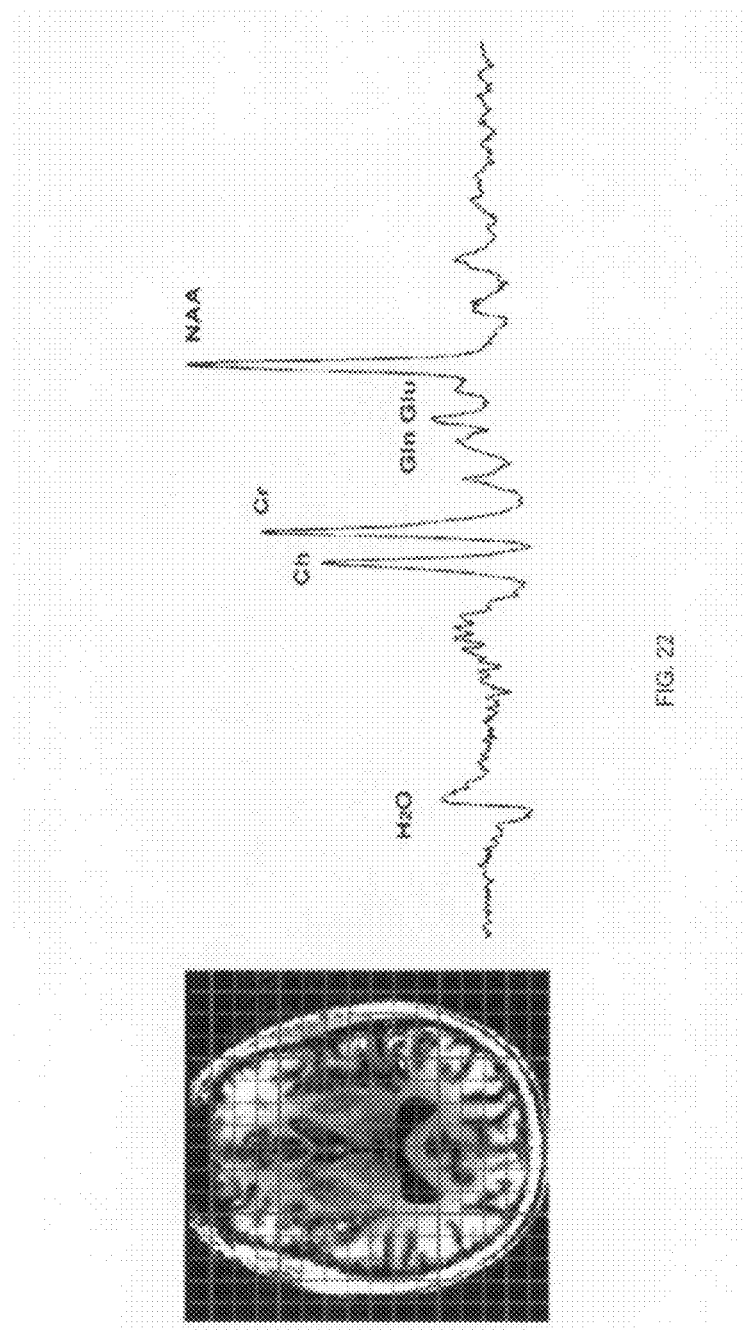
FIG. 22 shows a scout image and a short TE spectrum acquired from the thalamus using the test model shim coil insert.

FIG. 22 shows a scout image and a short TE spectrum acquired from the thalamus with the insert.

CONCLUSIONS

The obtained empirical data demonstrates that substantial improvements in both global and local $B_0$ homogeneity can be achieved using $1^{st}$ to $3^{rd}$ and higher degree shims. The strengths required to achieve higher degree terms ($4^{th}$ to $6^{th}$ degrees) can be achieved using a shim insert and modest strength power supplies.

What we claim is:

1. A portable in-bore shim coil insert suitable for correcting high-degree and high-order magnetic field inhomogeneities over a limited examination zone in a magnetic resonance assembly operating at about 3 T-12 T magnetic field strengths and for producing a more homogenous main magnetic ($B_0$) field within the limited examination zone for examination of a targeted Region Of Interest in a chosen subject, wherein the magnetic resonance assembly includes at least a MRI magnet having an internal bore of known configuration and volume, at least one set of gradient coils, and an arrangement of radio frequency coils, said portable in-bore shim coil insert comprising:
    a movable at will cylinder-like chamber which
        (i) can be tangibly sited at any location within the bore volume of the MRI magnet in the magnetic resonance assembly,
        (ii) is a hollow housing having at least one open end and formed solely of non-magnetic materials, and
        (iii) has fixed length and girth dimensions, and an encompassing perimeter wall with discrete perimeter wall surfaces, and
        (iv) has a limited examination zone present as a demarcated internal shimming space sized to accept and hold a targeted Region Of Interest of a chosen subject for magnetic resonance examination;
    at least one shim coil array disposed upon an encompassing wall surface of said cylinder-like chamber, wherein said shim coil array comprises a plurality of surface coils which
        ($\alpha$) are disposed in azimuthal symmetry and axial distribution upon a perimeter wall surface and
        ($\beta$) are able to provide multiple supplementary magnetic field gradients on-demand sufficient to cancel substantially at least some high order, high degree inhomogeneities of the $B_z$ vector component of the main magnetic ($B_0$) field then present within said demarcated internal shimming space of said cylinder-like chamber;
    an electrical power supply in communication with said shim coil array; and
    means for securing said cylinder-like chamber at a selected location within the bore volume of a MRI magnet in the magnetic resonance assembly.

2. The in-bore shim coil insert as recited in claim 1 wherein said array of surface coils provides multiple supplementary field gradients on-demand sufficient to cancel at least some $3^{rd}$ degree inhomogeneities over the $B_z$ vector component of the main magnetic ($B_0$) field within the limited examination zone.

3. The in-bore shim coil insert as recited in claim 1 wherein said shim coil array comprises surface coils which provide multiple supplementary field gradients on-demand sufficient to cancel at least some $4^{th}$ degree inhomogeneities over the $B_z$ vector component of the main magnetic ($B_0$) field within the limited examination zone.

4. The in-bore shim coil insert as recited in claim 1 wherein said shim coil array comprises surface coils which provide multiple supplementary field gradients on-demand sufficient to cancel at least some $5^{th}$ degree inhomogeneities over the $B_z$ vector component of the main magnetic ($B_0$) field within the limited examination zone.

5. The in-bore shim coil insert as recited in claim 1 wherein said shim coil array comprises surface coils which provide multiple supplementary field gradients on-demand sufficient to cancel at least some $6^{th}$ degree inhomogeneities over the $B_z$ vector component of the main magnetic ($B_0$) field within the limited examination zone.

6. The in-bore shim coil insert as recited by claim 1 wherein the magnetic resonance assembly is used for in-vivo examinations.

7. The in-bore shim coil insert as recited by claim 1 wherein the magnetic resonance assembly is used for in-vivo examination of a particular part of the human anatomy.

8. The in-bore shim coil insert as recited by claim 1 wherein said surface coils are selected from the group consisting of rectangularly-shaped coils, fingerprint-shaped coils, and spiral-shaped coils.

9. The in-bore shim coil insert as recited by claim 1 wherein said surface coils are double-layered sheets.

10. The in-bore shim coil insert as recited by claim 1 wherein said surface coils are individual layers of flex circuit board.

11. The in-bore shim coil insert as recited by claim 1 wherein said cylinder-like chamber is a structure selected from the group consisting of open ended bobbins, spools, bands, reels, tubes, discs, cones, and sleeves.

12. The in-bore shim coil insert as recited by claim 1 wherein said cylinder-like chamber includes at least one structural feature selected from the group consisting of bends, twists, and curves.

13. The in-bore shim coil insert as recited by claim 1 wherein said array of surface coils is disposed upon an exterior surface of an encompassing perimeter wall.

14. The in-bore shim coil insert as recited by claim 1 wherein multiple arrays of surface coils are individually disposed upon an exterior surface of an encompassing perimeter wall.

15. The in-bore shim coil insert as recited by claim 1 wherein the outline and edge boundaries of the demarcated internal shimming space are substantially round.

16. The in-bore shim coil insert as recited by claim 1 wherein the outline and edge boundaries of the demarcated internal shimming space are selected from the group consisting of cylindrical, ovoid, elliptical, conch shell-shaped, pancake-shaped, balloon-shaped, barrel-shaped, or bullet-shaped cavities.

17. The in-bore shim coil insert as recited by claim 1 wherein the outline and edge boundaries of the demarcated internal shimming space show an absence of geometric, regular, symmetrical, consistent, and uniform features.

18. The in-bore shim coil insert as recited by claim 1 wherein said limited examination zone is used for examination of an anatomic part of a human body as the targeted Region Of Interest of a chosen subject.

19. The in-bore shim coil insert as recited by claim 1 wherein said limited examination zone is used for examination of a system in a human body as the targeted Region Of Interest of a chosen subject.

20. The in-bore shim coil insert as recited by claim 1 wherein said limited examination zone is used for examination of an internal organ in a human body as the targeted Region Of Interest of a chosen subject.

21. The in-bore shim coil insert as recited by claim 1 wherein said limited examination zone is used for examination of a specific tissue in a human body as the targeted Region Of Interest of a chosen subject.

22. The in-bore shim coil insert as recited by claim 1 wherein said array of surface coils produces a combination of field term corrections that can be adjusted to an arbitrary degree of harmonic purity within a given order by manipulation of the current level in each of said coils.

* * * * *